(12) United States Patent
In et al.

(10) Patent No.: US 10,727,376 B2
(45) Date of Patent: Jul. 28, 2020

(54) LIGHT EMITTING DIODE PACKAGE AND METHOD OF MANUFACTURING THE SAME

(71) Applicant: SEOUL VIOSYS CO., LTD, Ansan-si (KR)

(72) Inventors: Chi Hyun In, Ansan-si (KR); Jun Yong Park, Ansan-si (KR); Kyu Ho Lee, Ansan-si (KR); Dae Woong Suh, Ansan-si (KR); Jong Hyeon Chae, Ansan-si (KR); Chang Hoon Kim, Ansan-si (KR); Sung Hyun Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 22 days.

(21) Appl. No.: 16/125,769

(22) Filed: Sep. 10, 2018

(65) Prior Publication Data
US 2019/0019923 A1 Jan. 17, 2019

Related U.S. Application Data

(63) Continuation of application No. 13/425,156, filed on Mar. 20, 2012, now Pat. No. 10,074,778.
(Continued)

(51) Int. Cl.
*H01L 33/48* (2010.01)
*H01L 33/20* (2010.01)
(Continued)

(52) U.S. Cl.
CPC ............ *H01L 33/486* (2013.01); *H01L 33/20* (2013.01); *H01L 33/44* (2013.01); *H01L 33/505* (2013.01);
(Continued)

(58) Field of Classification Search
None
See application file for complete search history.

(56) References Cited

U.S. PATENT DOCUMENTS

| 6,350,998 | B1 | 2/2002 | Tsuji |
| 7,179,670 | B2 | 2/2007 | Shelton et al. |
| | | (Continued) | |

FOREIGN PATENT DOCUMENTS

| CN | 101241963 | 8/2008 |
| EP | 2194586 | 6/2010 |
| | (Continued) | |

OTHER PUBLICATIONS

Non-Final Office Action dated Mar. 20, 2014, issued in U.S. Appl. No. 13/425,156.
(Continued)

*Primary Examiner* — Robert K Carpenter
(74) *Attorney, Agent, or Firm* — H.C. Park & Associates, PLC

(57) ABSTRACT

Disclosed herein are a light emitting diode package and a method of manufacturing the same. The light emitting diode package includes: a substrate, a light-emitting layer disposed on a surface of the substrate and including a first type semiconductor layer, an active layer, and a second type semiconductor layer, a first bump disposed on the first type semiconductor layer and a second bump disposed the second type semiconductor layer, a protective layer covering at least the light-emitting layer, and a first bump pad and a second bump pad disposed on the protective layer and connected to the first bump and the second bump, respectively.

19 Claims, 37 Drawing Sheets

Related U.S. Application Data

(60) Provisional application No. 61/552,618, filed on Oct. 28, 2011, provisional application No. 61/505,107, filed on Jul. 6, 2011, provisional application No. 61/466,229, filed on Mar. 22, 2011.

(51) Int. Cl.
  *H01L 33/44* (2010.01)
  *H01L 33/50* (2010.01)
  *H01L 33/62* (2010.01)

(52) U.S. Cl.
  CPC .......... *H01L 33/62* (2013.01); *H01L 2224/16* (2013.01); *H01L 2933/0033* (2013.01)

(56) References Cited

U.S. PATENT DOCUMENTS

| | | | |
|---|---|---|---|
| 8,338,849 B2 * | 12/2012 | Tischler | H01L 27/156 257/98 |
| 8,390,009 B2 | 3/2013 | Wang | |
| 2006/0001035 A1 | 1/2006 | Suehiro et al. | |
| 2009/0283787 A1 | 11/2009 | Donofrio et al. | |
| 2009/0315045 A1 | 12/2009 | Horie | |
| 2010/0140640 A1 | 6/2010 | Shimokawa et al. | |
| 2011/0198641 A1 | 8/2011 | Yahata et al. | |

FOREIGN PATENT DOCUMENTS

| | | |
|---|---|---|
| JP | 2007123613 | 5/2007 |
| WO | 2010132139 | 11/2010 |

OTHER PUBLICATIONS

Final Office Action dated Nov. 10, 2014, issued in U.S. Appl. No. 13/425,156.
Patent Board Decision on Appeal dated May 26, 2017, issued in U.S. Appl. No. 13/425,156.
Non-Final Office Action dated Sep. 13, 2017, issued in U.S. Appl. No. 13/425,156.
Final Office Action dated Feb. 9, 2018, issued in U.S. Appl. No, 13/425,156.
Notice of Allowance dated May 14, 2018, issued in U.S. Appl. No, 13/425,156.
Fourth Office Action dated Nov. 28, 2017, issued in Chinese Patent Application No. 2012/0078574.1.
Songhao Liu, et al., "Photonics Technique and Application", Sep. 30, 2006, p. 1183-1185, vol. 2, Guangdong Science and Technology Press, Anhui Science & Technology publishing House in China.
First Office Action dated Oct. 9, 2015, issued in Chinese Patent Application No. 2012/10078574.1.

* cited by examiner

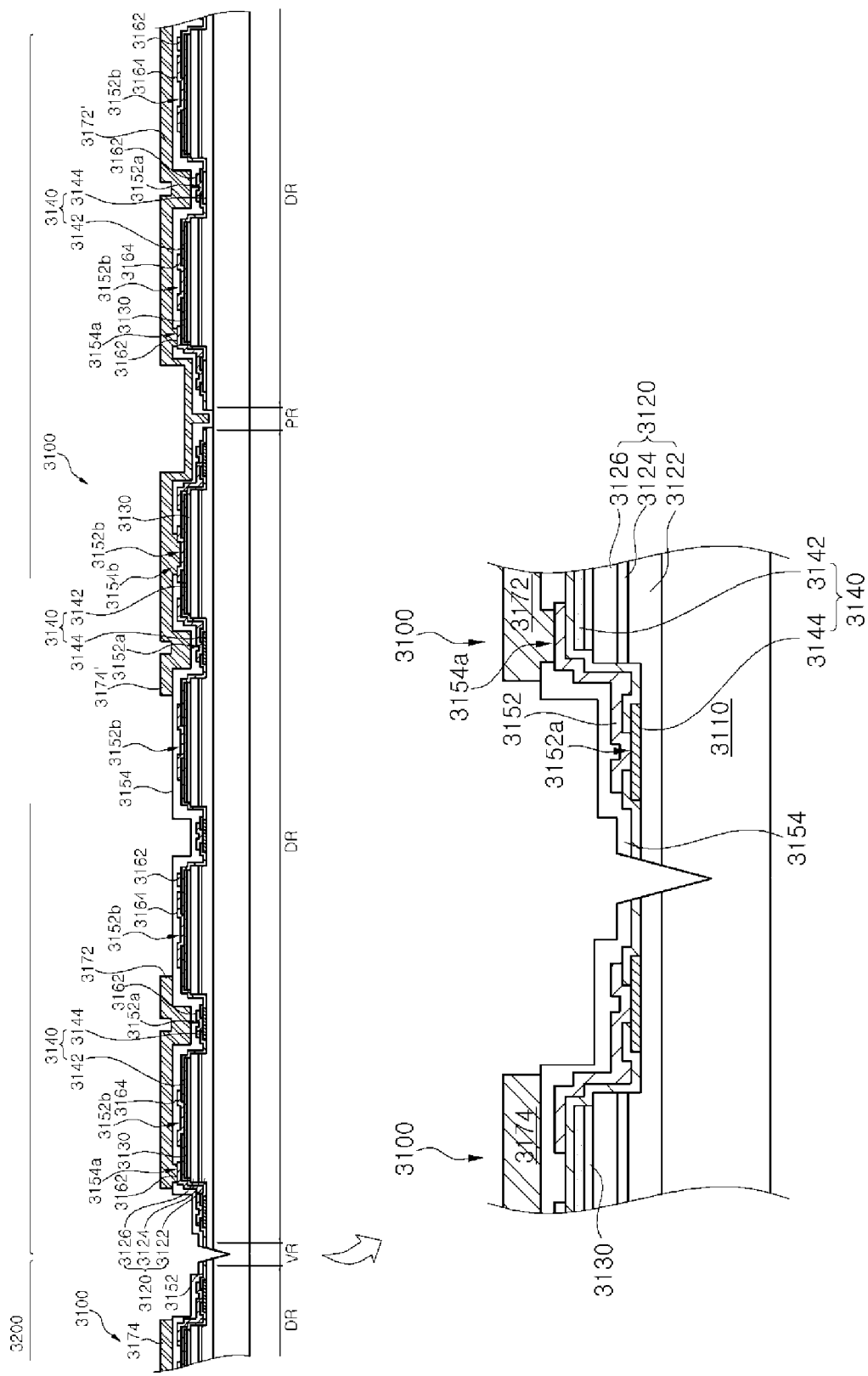

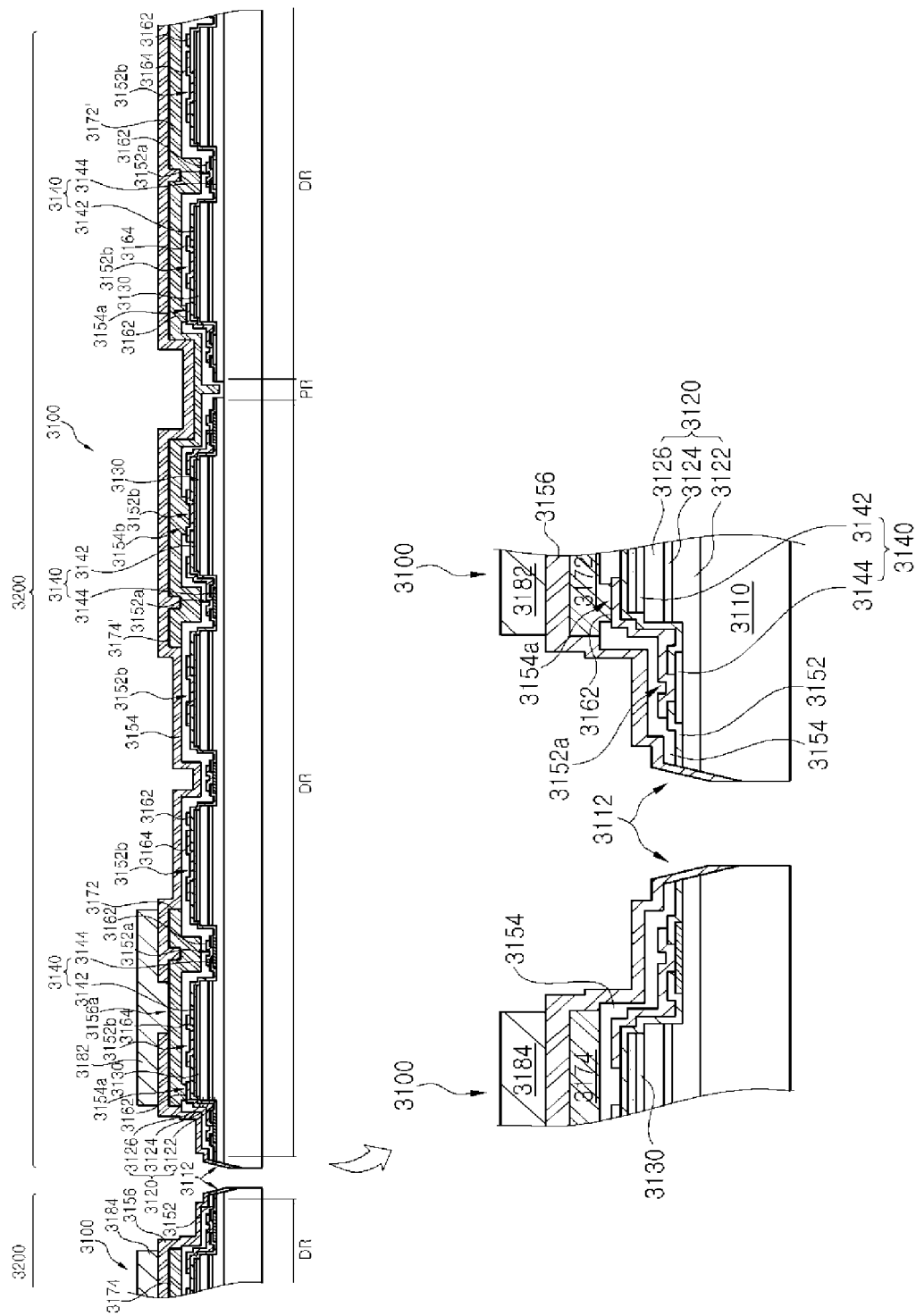

LIGHT EMITTING DIODE PACKAGE AND METHOD OF MANUFACTURING THE SAME

CROSS-REFERENCE TO RELATED APPLICATIONS

This application is a Continuation of U.S. patent application Ser. No. 13/425,156, filed on Mar. 20, 2012, which claims priority from and the benefit of U.S. Provisional Patent Application No. 61/466,229, filed on Mar. 22, 2011, U.S. Provisional Patent Application No. 61/505,107, filed on Jul. 6, 2011, and U.S. Provisional Patent Application No. 61/552,618, filed on Oct. 28, 2011, which are all hereby incorporated by reference for all purposes as if fully set forth herein.

BACKGROUND OF THE INVENTION

Field of the Invention

Exemplary embodiments of the present invention relate to a light emitting diode package and a method of manufacturing the same.

Discussion of the Background

A light emitting diode is basically a PN junction diode having a junction of a p-type semiconductor and an N-type semiconductor.

In the light emitting diode, when the P-type semiconductor junctions with the N-type semiconductor, and then, is applied with voltage so as to be supplied with current, holes of the P-type semiconductor move toward the N-type semiconductor while electrons of the N-type semiconductor move toward the P-type semiconductor, thereby moving the electrons and the holes toward the PN junction part.

The electrons moving toward the PN junction part are coupled with the holes. The electrons move from a conduction band to a valence band. In this case, energy corresponding to a height difference between the conduction band and the valence band, that is, the energy difference is emitted. The energy is emitted in a form of light.

Generally, the light emitting diode package is manufactured by using a growth substrate, which forms light emitting chips in which light emitting diodes are formed on a surface of the growth substrate, and packaging the light emitting diode chips. For example, when manufacturing a flip chip-type light emitting diode package, a light emitting flip chip-type light emitting diode package is manufactured by a process of forming the light emitting chips in which the light emitting diodes are formed on the growth substrate, mounting the light emitting diode chips on a submount, or the like, and packaging the flip chips mounted on the submount.

Therefore, since the light emitting diode package according to the related art involves a process of manufacturing the light emitting diode chips and a process of packaging the light emitting diode chips, the process is complicated, and thus, may have a potential risk of defects and raise the manufacturing costs.

Further, since the light emitting diode package according to the related art is manufactured by manufacturing the light emitting chips on the growth substrate and mounting and packaging the chips on the submount, or the like, the size of the light emitting diode package is increased, such that there is a limit in applying the light emitting diode package to mobile products, or the like.

In addition, the light emitting diode package according to the related art may emit light scattered without being converted by a phosphor layer from a side thereof, which may deteriorate optical properties of light converted by the phosphor layer.

Further, in the light emitting diode package according to the related art, it may be difficult to implement a large-area chip.

Moreover, in the light emitting diode package according to the related art, it may be difficult to implement heat generation and current spreading when the area of the light emitting diode chip is increased.

Also, since the light emitting diode package according to the related art is manufactured by a process of manufacturing the light emitting diode chips and a process of packaging the light emitting diode chips, the process is complicated and thus, a defective rate may be increased and the manufacturing costs may be increased.

SUMMARY OF THE INVENTION

The present invention has been made to provide a light emitting diode package of a wafer level and a method of manufacturing the same by providing a process of packaging light emitting diode chips while manufacturing the light emitting diode chips.

Further, the present invention has been made to provide a light emitting diode package and a method of manufacturing the same capable of reducing emission of light scattered without being converted by a phosphor layer from a side of the light emitting diode package.

In addition, the present invention has been made to provide a large-area light emitting diode package having a large emission area and a method of manufacturing the same.

Moreover, the present invention has been made to provide a large-area light emitting diode package and a method of manufacturing the same capable of facilitating heat generation and current spreading.

Also, the present invention has been made to provide a light emitting diode package and a method of manufacturing the same capable of simplifying a process and reducing a defective rate and manufacturing costs.

According to an exemplary embodiment of the present invention, there is provided a light emitting diode package, including: a first substrate, a light-emitting layer disposed on a surface of the first substrate and including a first type semiconductor layer, an active layer, and a second type semiconductor layer, a first bump disposed on the first type semiconductor layer and a second bump disposed the second type semiconductor layer, a protective layer covering at least the light-emitting layer, and a first bump pad and a second bump pad disposed on the protective layer and connected to the first bump and the second bump, respectively.

According to another exemplary embodiment of the present invention, there is provided a method of manufacturing a light emitting diode package, which includes: forming a pattern on a first substrate, sequentially forming a first type semiconductor layer, an active layer, and a second type semiconductor layer on a surface of the first substrate to form a light-emitting layer, etching the first type semiconductor layer, the active layer, and the second type semiconductor layer to expose a portion of the first type semiconductor layer, forming a first bump and a second bump on the first type semiconductor layer and the second type semiconductor layer, respectively, covering at least a part of the light-emitting layer with a protective layer, and forming a first bump pad and a second bump pad on the first bump and the second bump, respectively.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 39 to FIG. 41 are cross-sectional views showing a method of manufacturing a light emitting diode package according to an exemplary embodiment of the present invention.

DETAILED DESCRIPTION OF THE ILLUSTRATED EMBODIMENTS

Figure 1:
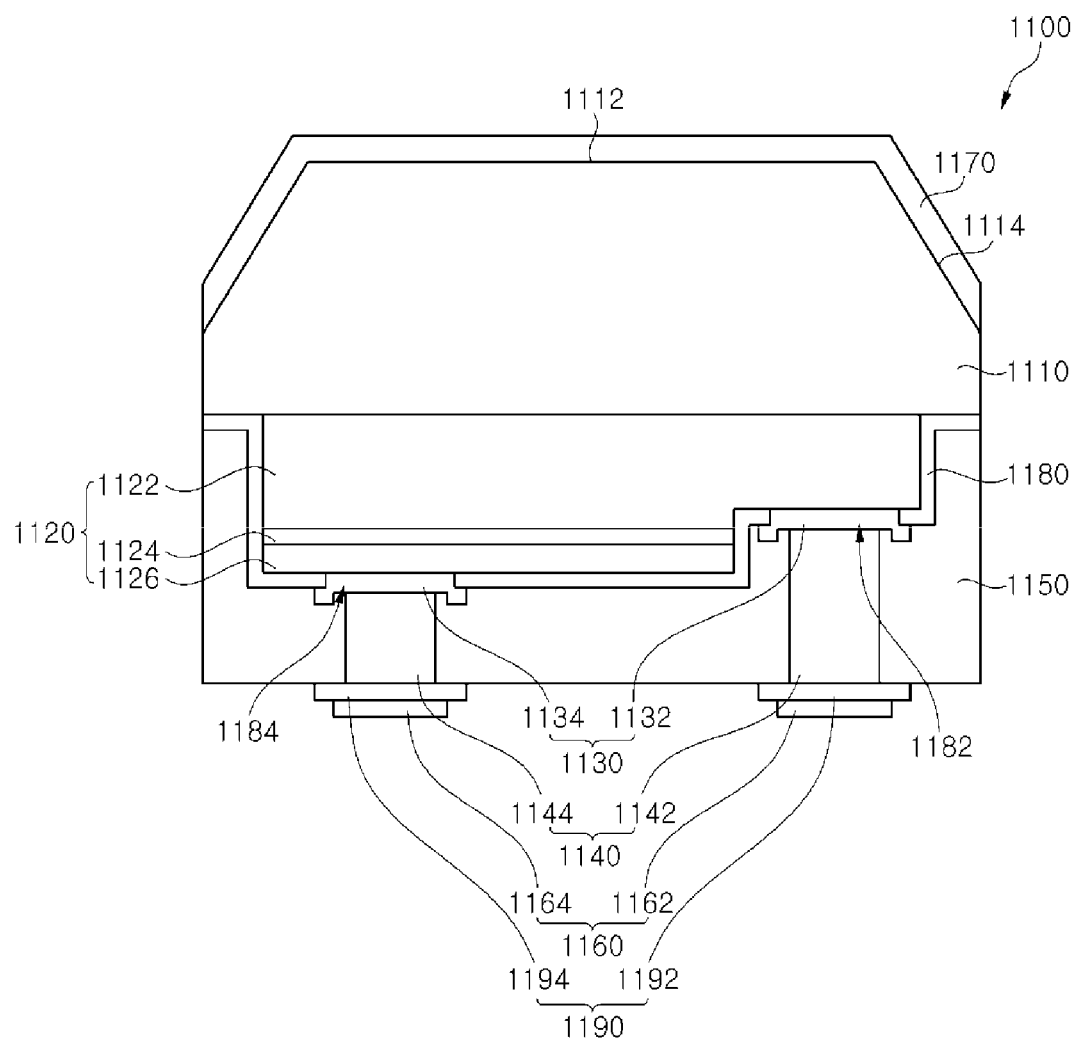
FIG. 1 is a cross-sectional view showing a light emitting diode package according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, exemplary embodiments of the present invention will be described in detail with reference to the accompanying drawings.

FIG. 1 is a cross-sectional view showing a light emitting diode package according to an exemplary embodiment of the present invention.

Referring to FIG. 1, a light emitting diode package 1100 according to an exemplary embodiment of the present invention may include a substrate 1110, a semiconductor structure layer 1120, contact pads 1130, bumps 1140, a protective layer 1150, and bump pads 1160.

In addition, the light emitting diode package 1100 may further include a phosphor layer 1170, a passivation layer 1180, and current spreading layers 1190. In this configuration, the phosphor layer 1170, the passivation layer 1180, and the current spreading layers 1190 may be omitted if necessary.

The substrate 1110 may be a growth substrate. The growth substrate may be a sapphire substrate, a silicon carbide substrate, a silicon substrate, or the like. One example of the growth substrate is a sapphire substrate.

The semiconductor structure layer 1120, the contact pads 1130, the bumps 1140, the protective layer 1150, and the bump pads 1160 are sequentially formed on a surface of the substrate 1110.

The other surface 1112 of the substrate 1110 may include patterns or ruggedness such as a moth eye pattern (not shown), blast marks (not shown), or the like, so as to increase light emission efficiency. Further, the substrate 1110 may have lateral inclinations 1114 formed at the corners thereof. The lateral inclinations 1114 may serve to increase the light emission efficiency of light propagated to the sides of the substrate 1110.

In the exemplary light emitting diode package 1100, light may be emitted from the semiconductor structure layer 1120 disposed on the surface of the substrate 1110 and emitted from the other surface of the substrate 1110.

The patterns or the ruggedness such as the moth eye pattern (not shown) or the blast marks (not shown) serves to increase the light emission efficiency of light emitted from the other surface of the substrate 1110. When the light emitted from the semiconductor structure layer 1120, in particular, an active layer 1124, is emitted toward the other surface of the substrate 1110, the light may be totally reflected from the other surface of the substrate 1110 along a propagation path of light, such that the light may not be emitted. The patterns or ruggedness such as the moth eye pattern (not shown), the blast marks (not shown), or the like, reduce the total reflection generated from the other surface of the substrate 1110 and thus increase the likelihood that the light is emitted from the other surface of the substrate 1110, thereby serving to increase the light emission efficiency of the light emitting diode package 1100.

Meanwhile, the phosphor layer 1170 may be disposed on the other surface of the substrate 1110, for example, on the surface of the substrate 1110 which emits light from the semiconductor structure layer 1120. The phosphor layer 1170 serves to convert a wavelength of light emitted from the semiconductor structure layer 1120. The phosphor layer 1170 may be made of the phosphor material converting the wavelength of light.

The semiconductor structure layer 1120 may include a first type semiconductor layer 1122, an active layer 1124, a second type semiconductor layer 1126, and a buffer layer (not shown) between the substrate 1110 and the first type semiconductor layer 1122. The semiconductor structure layer 1120 may function to emit light.

The buffer layer (not shown) may be provided so as to relieve a lattice mismatch between the substrate 1110 and the first type semiconductor layer 1122. In addition, the buffer layer (not shown) may be formed of a single layer or a multi-layer. If the buffer layer is formed of the multi-layer, the buffer layer may be formed of a low-temperature buffer layer and a high-temperature buffer layer.

The first type semiconductor layer 1122 may be disposed on the substrate 1110. A portion of the first type semiconductor layer 1122 may be exposed as shown in FIG. 1. The first type semiconductor layer 1122 may be exposed by performing mesa etching on a portion of the active layer 1124 and the second type semiconductor layer 1126. When the mesa etching is performed, a portion of the first type semiconductor layer 1122 may be etched.

The first type semiconductor layer 1122 may be made of a first type impurity, for example, an (Al, In, Ga) N-series III group nitride semiconductor that is doped with an N-type impurity. The first type semiconductor layer 1122 may be made of a single layer or a multi-layer. For example, the first-type semiconductor layer 1122 may include a super lattice layer.

The active layer 1124 may be disposed on the first type semiconductor layer 1122, and the active layer 1124 may be formed of the single layer or the multi-layer. In addition, the active layer 1124 may be a single quantum well structure including a single well layer (not shown), or may be provided in a multi-quantum well structure in which a well layer (not shown) and a barrier layer (not shown) are alternately stacked. In this configuration, one or both of the well layer (not shown) and the barrier layer (not shown) may be formed in a super lattice structure.

The second type semiconductor layer 1126 may be disposed on the active layer 1124. The second type semiconductor layer 1126 may be made of (Al, In, Ga) N-series III group nitride semiconductor that is doped with the second type impurity, for example, the P-type impurity. The second type semiconductor layer 1126 may be formed of the single layer or the multi-layer. For example, the second type semiconductor layer 1126 may include a super lattice layer.

In addition, the semiconductor structure layer 1120 may include a blocking layer (not shown) between the active layer 1124 and the second type semiconductor layer 1126. The blocking layer (not shown) may be provided so as to increase the recoupling efficiency of electrons and holes, and may be made of a material having a relatively wide band gap. The blocking layer (not shown) may be made of (Al, In, Ga) N-series III group nitride semiconductor, for example, may be made of AlGaN.

The passivation layer 1180 may be disposed on the substrate 1110 and the semiconductor structure layer 1120. The passivation layer 1180 serves to protect the semiconductor structure layer 1120 provided thereunder from outside environments and may be formed of an insulating layer such as a silicon oxide layer.

The passivation layer 1180 may include a first opening 1182 that exposes a portion of the surface of the first type semiconductor layer 1122 through mesa etching, and a second opening 1184 that exposes a portion of the surface of the second type semiconductor layer 1126.

The contact pads 1130 may include a first contact pad 1132 and a second contact pad 1134. The first contact pad 1132 may provide contact to the first type semiconductor layer 1122 exposed by the first opening 1182. The second contact pad 1134 may provide contact to the second type semiconductor layer 1126 exposed by the second opening 1184. In this configuration, if the passivation layer 1180 is not provided, the first contact pad 1132 and the second contact pad 1134 may provide contact to the semiconductor layers at certain positions of the first type semiconductor layer 1122 and the second type semiconductor layer 1126, respectively.

In this case, although not shown in the drawings, the second type semiconductor layer 1126 may include the high-concentration doped second type semiconductor layer (not shown) whose top portion is doped with the second type impurity at high concentration and may further include a contact layer (not shown) for ohmic contact between the second type semiconductor layer 1126 and the second contact pad 1134.

The contact pads 1130 may be made of Ni, Cr, Ti, Al, Ag, Au, or the like. The contact layer (not shown) may be made of a transparent conductive oxide (TCO) such as ITO, ZnO, IZO, or the like, and a contact material such as Ni/Au, or the like.

The bumps 1140 may include a first bump 1142 and a second bump 1144. The first bump 1142 may be disposed on the first contact pad 1132 and the second bump 1144 may be disposed on the second contact pad 1134. The bumps 1140 may be made of Au, or the like. Meanwhile, the bumps 1140 may be formed of a stud bump, and may be formed by depositing or coating and then etching the material forming the bumps 1140.

The protective layer 1150 is disposed on the substrate 1110 and serves to protect the semiconductor structure layer 1120 by covering the semiconductor structure layer 1120. For example, as shown in FIG. 1, the protective layer 1150 serves to protect the top surface and side surfaces of the semiconductor structure layer 1120 disposed on a certain region of the substrate 1110. The protective layer 1150 may be made of an inorganic material such as a silicon-based oxide, silicon-based nitride, or the like. The protective layer 1150 may be made of an organic material such as resin, or the like.

The current spreading layers 1190 are disposed on the protective layer 1150, and may serve to provide electrical connection to the bumps 1140. When the bump pads 1160 are disposed on the substrate 1110 and the protective layer 1150, the current spreading layers 1190 may be omitted by serving to facilitate the formation thereof. The current spreading layers 1190 may include a first current spreading layer 1192 and a second current spreading layer 1194. The first current spreading layer 1192 may serve to provide electrical connection to the first bump 1142, and the second current spreading layer 1194 may serve to provide electrical connection to the second bump 1144.

The current spreading layers 1190 may be made of Ni, Cr, Ti, Al, Ag, Au, or the like.

The bump pads 1160 may be disposed on the current spreading layer 1190. In particular, the bump pads 1160 may include a first bump pad 1162 and a second bump pad 1164, and may serve to provide electrical connection to the bumps 1140.

The bump pads 1160 may be made of Au, similar to the bumps 1140.

In this case, each of the first bump pad 1162 and the second bump pad 1164 may have an area smaller than that of the first current spreading layer 1192 and the second current spreading layer 1194, and may have an area smaller than that of the first contact pad 1132 and the second contact pad 1134, but is not limited thereto. That is, each of the first bump pad 1162 and the second bump pad 1164 may have an area equal to or slightly larger than that of the first current spreading layer 1192 and the second current spreading layer 1194, and have an area equal to or slightly larger than that of the first contact pad 1132 and the second contact pad 1134.

Therefore, the light emitting diode package 1100 according to the exemplary embodiment of the present invention may include the semiconductor structure layer 1120, the contact pads 1130, and the bumps 1140 on the substrate 1110, the protective layer 1150 that protects at least the semiconductor structure layer 1120 as well as the semiconductor structure layer 1120, the contact pads 1130, the bumps 1140, and the bump pads 1160 on the protective layer 1150 that are electrically connected to the bumps 1140 such that the substrate forming the semiconductor structure layer 1120 is packaged, that is, packaged at the wafer level to make the separate package process unnecessary, thereby providing the light emitting diode package having a smaller size.

Figure 2:
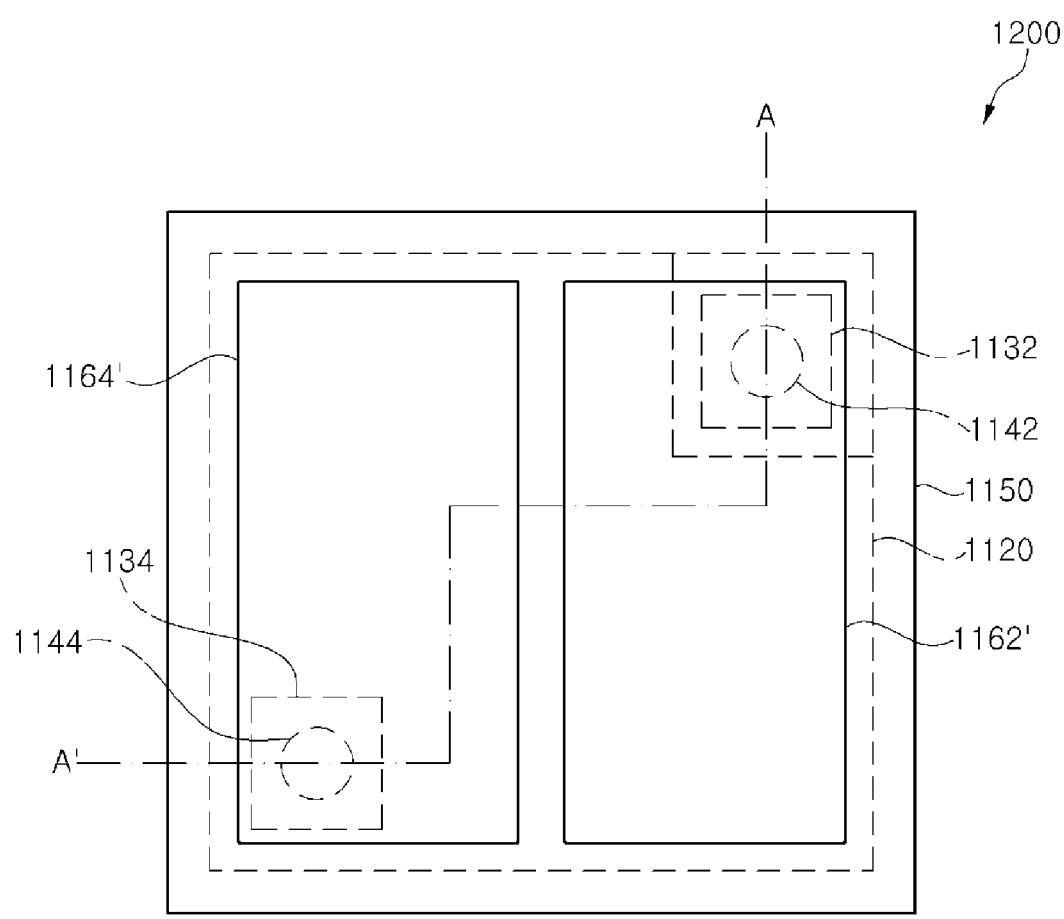
FIG. 2 and FIG. 3 are a plan view and a cross-sectional view showing a light emitting diode package according to another exemplary embodiment of the present invention.
Figure 3:
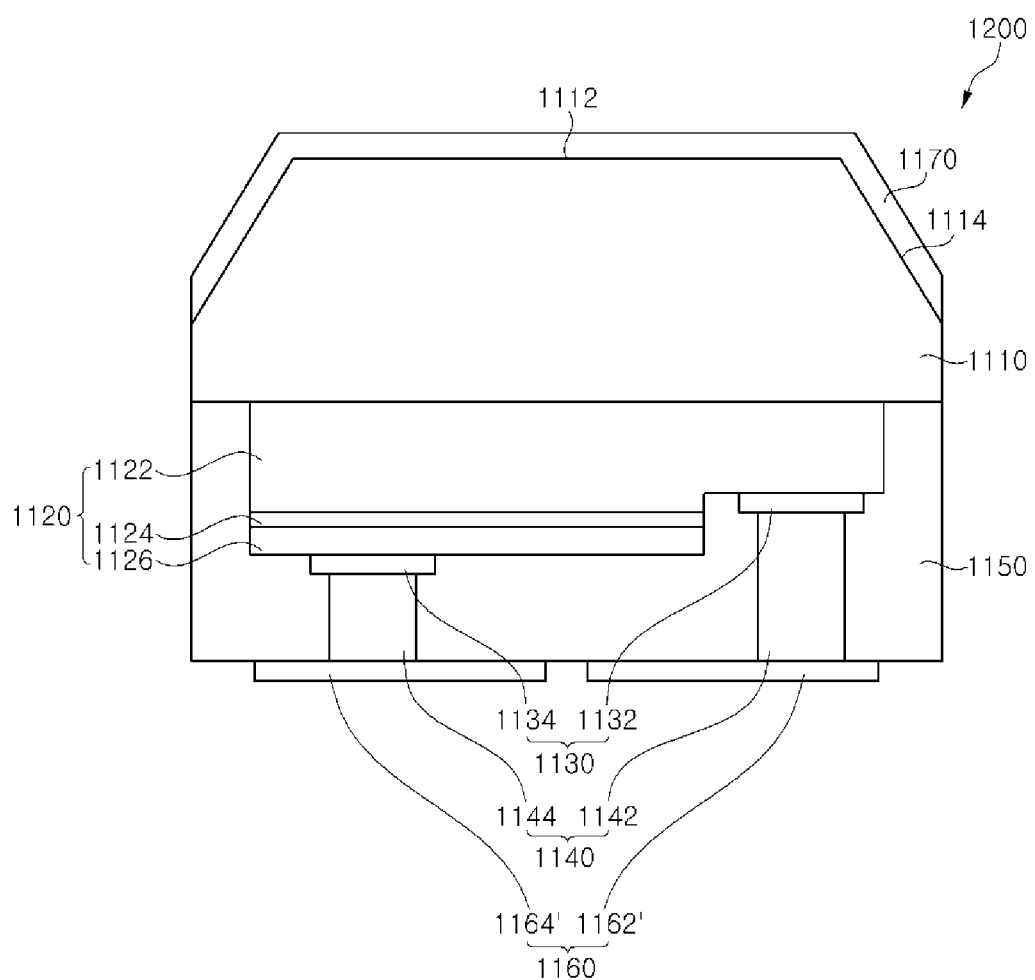

FIG. 2 and FIG. 3 are a plan view and a cross-sectional view showing a light emitting diode package according to another exemplary embodiment of the present invention. FIG. 3 shows a cross-sectional view taken along line A-A' of FIG. 2, and FIG. 2 shows a plan view of the substrate 1110 seen from a surface thereof.

Referring to FIG. 2 and FIG. 3, only the bump pads 1160 of the light emitting diode package 1200 according to another exemplary embodiment of the present invention is different from the bump pads 1160 of the light emitting diode package 1100 in FIG. 1, and other components thereof are the same as in FIG. 1. Therefore, the description of the same components will be omitted and only the bump pads 1160 will be described.

The light emitting diode package 1200 according to another exemplary embodiment of the present invention may include the substrate 1110, the semiconductor structure layer 1120, the contact pads 1130, the bumps 1140, the protective layer 1150, and the bump pads 1160.

In addition, although not shown in the drawings, the light emitting diode package 1200 may further include the passivation layer 1180 and the current spreading layer 1190 as described above for the light emitting diode package 1100 with reference to FIG. 1. In this configuration, the passivation layer 1180 and the current spreading layers 1190 are omitted from the drawings. In addition, the light emitting diode package 1200 may include the patterns or the ruggedness such as the moth eye pattern (not shown) or the blast marks (not shown) on the other surface 1112 of the substrate 1110 so as to increase the light emission efficiency. The light emitting diode package 1200 may also include the buffer layer (not shown) between the substrate 1110 and the first type semiconductor layer 1122, the blocking layer (not shown) between the active layer 1124 and the second type semiconductor layer 1126, and the high-concentration doped second type semiconductor layer (not shown) and the contact layer (not shown) between the second type semiconductor layer 1126 and the second contact pad 1134.

The bump pads 1160 may be disposed on a surface of the light emitting diode package 1200. Specifically, the bump pads 1160 are disposed on the surface of the protective layer 1150 on a surface of the substrate 1110, as shown in FIG. 2 and FIG. 3.

In this configuration, the bump pads 1160 may include a first bump pad 1162' and a second bump pad 1164', and the first bump pad 1162' and the second bump pad 1164' may be disposed on the protective layer 1150. The first bump pad 1162' and the second bump pad 1164' may have the same size. In particular, as shown in FIG. 2, the first bump pad 1162' and the second bump pad 1164' may be provided within the region corresponding to the semiconductor structure layer 1120. Alternatively, although not shown in FIG. 2, the first bump pad 1162' and the second bump pad 1164' may cover the entire surface of the protective layer 1150. That is, the first bump pad 1162' and the second bump pad 1164' of the light emitting diode package 1200 shown in FIG. 2 and FIG. 3 have an area larger than the first bump pad 1162 and the second bump pad 1164 of the light emitting diode package 1100 shown in FIG. 1, such that they may be easily mounted in other devices such as the light emitting diode package 1200.

Figure 4:
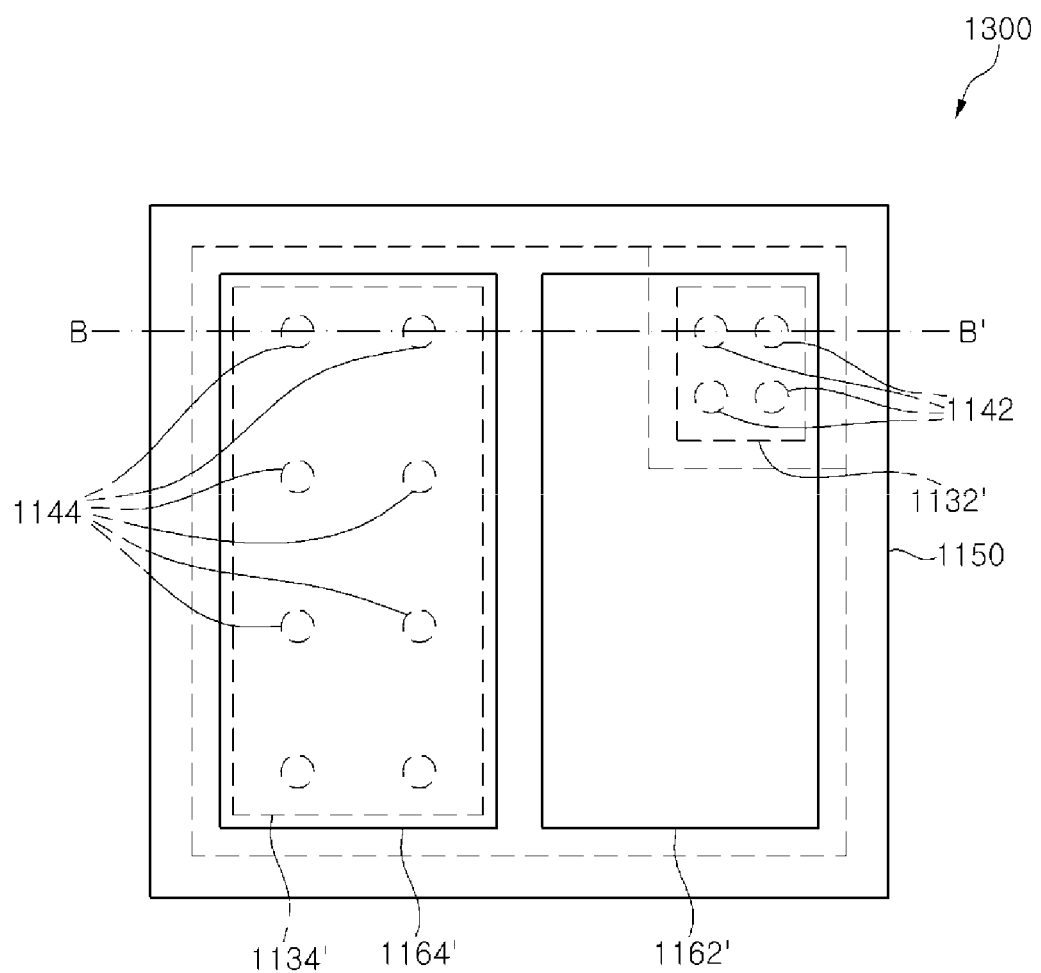
FIG. 4 and FIG. 5 are a plan view and a cross-sectional view showing a light emitting diode package according to another exemplary embodiment of the present invention.
Figure 5:
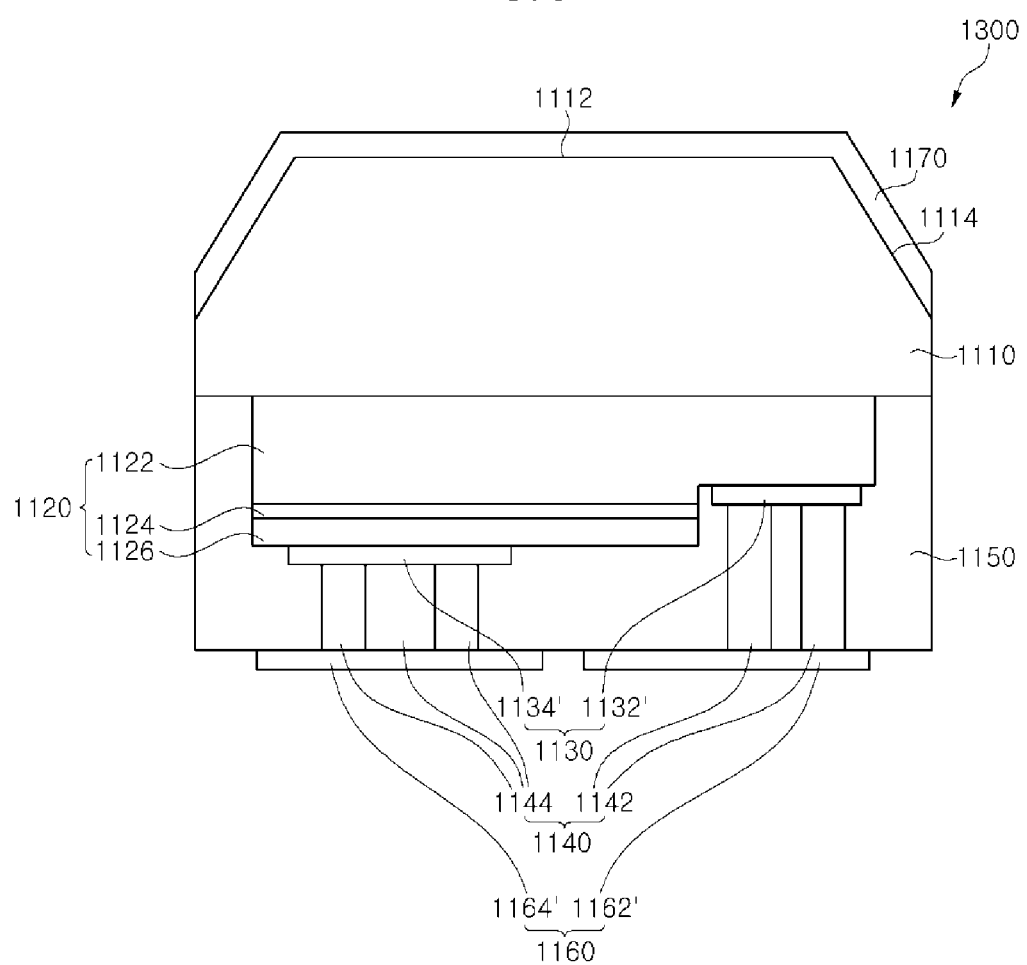

FIG. 4 and FIG. 5 are a plan view and a cross-sectional view showing a light emitting diode package according to another exemplary embodiment of the present invention. In this case, FIG. 5 shows a cross-sectional view taken along line B-B' of FIG. 4, and FIG. 4 shows a plan view of the substrate 1110 seen from a surface thereof.

Referring to FIG. 4 and FIG. 5, only the contact pads 1130 of the light emitting diode package 1300 according to another exemplary embodiment of the present invention is different from the contact pads 1130 of the light emitting diode package 1200 shown in FIG. 2 and FIG. 3, and other components thereof are the same as in FIG. 2 and FIG. 3. Therefore, the description of the same components will be omitted and only the contact pads 1130 will be described.

In other words, the light emitting diode package 1300 according to another exemplary embodiment of the present invention may include the substrate 1110, the semiconductor structure layer 1120, the contact pads 1130, the bumps 1140, the protective layer 1150, and the bump pads 1160.

In addition, although not shown in the drawings, the light emitting diode package 1300 may further include the passivation layer 1180 and the current spreading layer 1190 as described above for the light emitting diode package 1100 with reference to FIG. 1. In this configuration, the passivation layer 1180 and the current spreading layers 1190 are omitted from the drawings. In addition, the light emitting diode package 1200 may include the patterns or the ruggedness such as the moth eye pattern (not shown) or the blast marks (not shown) on the other surface 1112 of the substrate 1110 so as to increase the light emission efficiency. The light emitting diode package 1300 may also include the buffer layer (not shown) between the substrate 1110 and the first type semiconductor layer 1122, the blocking layer (not shown) between the active layer 1124 and the second type semiconductor layer 1126, and the high-concentration doped second type semiconductor layer (not shown) and the contact layer (not shown) between the second type semiconductor layer 1126 and the second contact pad 1134.

The contact pads 1130, in particular, the second contact pad 1134' may be disposed to cover a wide area of the surface of the second type semiconductor layer 1126, as shown in FIG. 4 and FIG. 5. Therefore, the light emitting diode package 1300 includes the wide second contact pad 1134', such that the plurality of second bumps 1144 may be disposed on the second contact pad 1134'. In addition, the first contact pad 1132' is also formed to have a wide area and thus, may also include the plurality of first bumps 1142.

Figure 6:
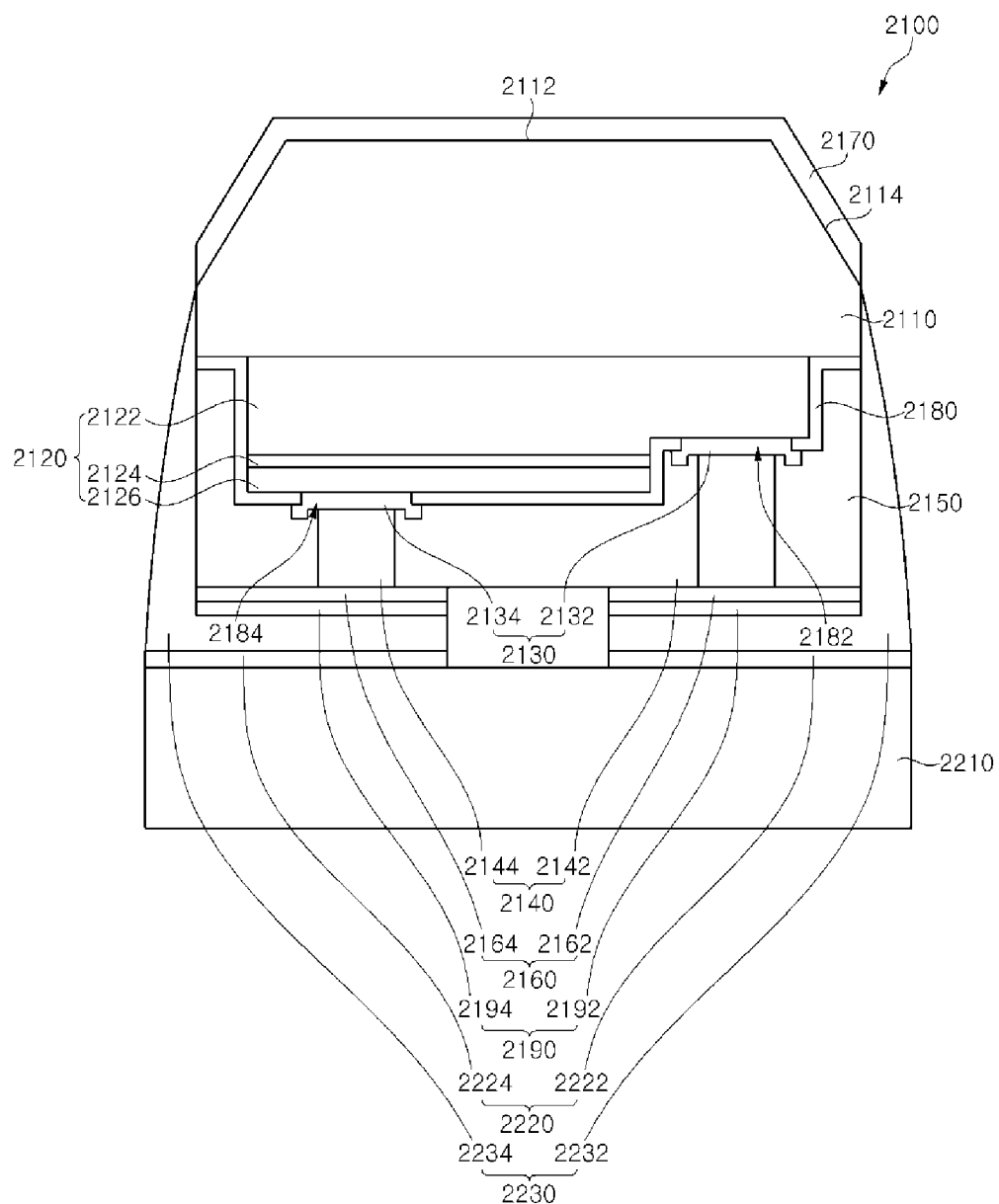
FIG. 6 is a cross-sectional view showing a light emitting diode package according to another exemplary embodiment of the present invention.

FIG. 6 is a cross-sectional view showing a light emitting diode package according to another exemplary embodiment of the present invention.

Referring to FIG. 6, a light emitting diode package 2100 according to an exemplary embodiment of the present invention may include a growth substrate 2110, a semiconductor structure layer 2120, contact pads 2130, bumps 2140, a protective layer 2150, bump pads 2160, a substrate 2210, electrodes 2220, and a conductive adhesive material 2230.

In addition, the light emitting diode package 2100 may further include a phosphor layer 2170, a passivation layer 2180, and pad protective layers 2190. In this configuration, the phosphor layer 2170, the passivation layer 2180, and the pad protective layers 2190 may be omitted if necessary.

The growth substrate 2110 may be a sapphire substrate, a silicon carbide substrate, a silicon substrate, or the like. In the exemplary embodiment, the growth substrate is a sapphire substrate.

The semiconductor structure layer 2120, the contact pads 2130, the bumps 2140, the protective layer 2150, and the bump pads 2160 are sequentially formed on a surface of the growth substrate 2110.

The other surface 2112 of the growth substrate 2110 may include patterns or ruggedness such as a moth eye pattern (not shown), blast marks (not shown), or the like, so as to increase light emission efficiency. Further, the growth substrate 2110 may have lateral inclinations 2114 formed at the corners thereof. The lateral inclination 2114 may serve to increase the light emission efficiency of light propagated to the sides of the growth substrate 2110.

In the exemplary light emitting diode package 2100, light may be emitted from the semiconductor structure layer 2120 disposed on a surface of the growth substrate 2110 and emitted from the other surface of the growth substrate 2110.

The patterns or the ruggedness such as the moth eye pattern (not shown) or the blast marks (not shown) may serve to increase the light emission efficiency of light directed from the other surface of the growth substrate 2110. When the light emitted from the semiconductor structure layer 2120, in particular, the active layer 2124 is emitted from the other surface of the growth substrate 2110, the light may be totally reflected from the other surface of the growth substrate 2110 along a propagation path of light, such that the light may not be emitted. The patterns or ruggedness such as the moth eye pattern (not shown), the blast marks (not shown), or the like, reduce the total reflection generated from the other surface of the growth substrate 2110 to increase the likelihood that the light is emitted from the other surface of the growth substrate 2110, thereby serving to increase the light emission efficiency of the light emitting diode package 2100.

Meanwhile, the phosphor layer 2170 may be disposed on the other surface of the growth substrate 2110, for example, on the surface of the substrate 2110 which emits light from the semiconductor structure layer 2120. The phosphor layer 2170 serves to convert a wavelength of light emitted from the semiconductor structure layer 2120. The phosphor layer 2170 may be made of the phosphor material converting the wavelength of light.

The semiconductor structure layer 2120 may include a first type semiconductor layer 2122, an active layer 2124, a second type semiconductor layer 2126, and a buffer layer (not shown) between the growth substrate 2110 and the first type semiconductor layer 2122.

The buffer layer (not shown) may be provided so as to relieve a lattice mismatch between the growth substrate 2110 and the first type semiconductor layer 2122. In addition, the buffer layer (not shown) may be formed of a single layer or a multi-layer. If the buffer layer is formed of the multi-layer, the buffer layer may be formed of a low-temperature buffer layer and a high-temperature buffer layer.

The first type semiconductor layer 2122 may be disposed on the growth substrate 2110. A portion of the first type semiconductor layer 2122 may be exposed as shown in FIG. 6. Here, the first type semiconductor layer 2122 may be exposed by performing mesa etching on a portion of the active layer 2124 and the second type semiconductor layer 2126. When the mesa etching is performed, a portion of the first type semiconductor layer 2122 may be etched.

The first type semiconductor layer 2122 may be made of a first type impurity, for example, an (Al, In, Ga) N-series III group nitride semiconductor material that is doped with an N-type impurity, and the first type semiconductor layer 2122 may be made of a single layer or a multi-layer. For example, the first type semiconductor layer 2122 may include a super lattice layer.

The active layer 2124 may be disposed on the first type semiconductor layer 2122, and the active layer 2124 may be formed of the single layer or the multi-layer. In addition, the active layer 2124 may be a single quantum well structure including a single well layer (not shown), or may be provided in a multi-quantum well structure in which a well layer (not shown) and a barrier layer (not shown) are alternately stacked. In this configuration, one or both of the well layer (not shown) and the barrier layer (not shown) may be formed in a super lattice structure.

The second type semiconductor layer 2126 may be disposed on the active layer 2124. The second type semiconductor layer 2126 may be made of (Al, In, Ga) N-series III group nitride semiconductor that is doped with the second type impurity, for example, the P-type impurity. The second type semiconductor layer 2126 may be formed of the single layer or the multi-layer. For example, the second type semiconductor layer 2126 may include a super lattice layer.

In addition, the semiconductor structure layer 2120 may include a blocking layer (not shown) between the active layer 2124 and the second type semiconductor layer 2126. The blocking layer (not shown) may be provided so as to increase the recoupling efficiency of electrons and holes and may be made of a material having a relatively wide band gap. The blocking layer (not shown) may be made of (Al, In, Ga) N-series III group nitride semiconductor, for example, may be made of AlGaN, or the like.

The passivation layer 2180 may be disposed on the growth substrate 2110 and the semiconductor structure layer 2120. The passivation layer 2180 serves to protect the semiconductor structure layer 2120 provided thereunder from outside environments and may be formed of an insulating layer such as a silicon oxide layer.

The passivation layer 2180 may include a first opening 2182 that exposes a portion of the surface of the first type semiconductor layer 2122 through mesa etching, and a second opening 2184 that exposes a portion of the surface of the second type semiconductor layer 2126.

The contact pads 2130 may include a first contact pad 2132 and a second contact pad 2134. The first contact pad 2132 may provide contact to the first type semiconductor layer 2122 exposed by the first opening 2182. The second contact pad 2134 may provide contact to the second type semiconductor layer 2126 exposed by the second opening 2184. In this configuration, if the passivation layer 2180 is not provided, each of the first contact pad 2132 and the second contact pad 2134 may provide contact to the semiconductor layers at certain positions of the first type semiconductor layer 2122 and the second type semiconductor layer 2126.

In this case, although not shown in the drawings, the second type semiconductor layer 2126 may include the second type semiconductor layer (not shown) doped with the second type impurity at high concentration, and may further include a contact layer (not shown) for ohmic contact between the second type semiconductor layer 2126 and the second contact pad 2134.

The contact pads 2130 may be made of Ni, Cr, Ti, Al, Ag, Au, or the like. The contact layer (not shown) may be made of TCO such as ITO, ZnO, IZO, or the like, and a contact material such as Ni/Au, or the like.

The bumps 2140 may include a first bump 2142 and a second bump 2144. The first bump 2142 may be disposed on the first contact pad 2132, and the second bump 2144 may be disposed on the second contact pad 2134. The bumps 2140 may be made of Au, or the like. Meanwhile, the bumps 2140 may be formed of a stud bump and may be formed by depositing or coating and etching the material forming the bumps 2140.

The protective layer 2150 is disposed on the growth substrate 2110, and serves to protect the semiconductor structure layer 2120 by covering at least the semiconductor structure layer 2120. For example, as shown in FIG. 1, the protective layer 2150 also serves to protect the top surface and side surfaces of the semiconductor structure layer 2120 disposed on a certain region of the growth substrate 2110. The protective layer 2150 may be made of an inorganic material such as a silicon-based oxide, silicon-based nitride, or the like, or may be made of an organic material such as resin, or the like.

The bump pads 2160 may be disposed on the protective layer 2150. That is, the bump pads 2160 may include a first bump pad 2162 and a second bump pad 2164. The first bump pad 2162 may be electrically connected to the first bump 2142, and the second bump pad 2194 may be electrically connected to the second bump 2144.

The bump pads 2160 may be made of Au, similar to the bumps 2140.

The pad protective layers 2190 are disposed on the bump pads 2160 and may be electrically connected to the bump pads 2160 to protect the bump pads 2160. The pad protective layers 2190 reduce the likelihood of diffusion or oxidation of the bump pads 2160 at the time of the bonding or storage of the growth substrate 2110. The pad protective layers 2190 may include the first pad protective layer 2192 and the second pad protective layer 2194. The first pad protective layer 2192 may be disposed on the first bump pad 2162 and the second pad protective layer 2194 may be disposed on the second bump pad 2164.

The pad protective layer 2190 may be made of Ni, Au, W, Pd, an organic material, or the like.

In this case, each of the first bump pad 2162 and the second bump pad 2164 may have an area equal to or smaller than that of the first current spreading layer 2192 and the second current spreading layer 2194, but the area of the first bump pad 2162 and the second bump pad 2164 is not limited thereto. In addition, the size of the first bump pad 2162 and the second bump pad 2164 may vary depending on the design, performance, and characteristics of the semiconductor structure layer 2120 and the bump 2140.

The substrate 2210 may be an a printed circuit board (PCB) or an insulating substrate such as ceramic, or the like, and the growth substrate 2110, in particular, a thermoconductive substrate having more excellent thermoconductivity than that of the sapphire substrate. The inside of the substrate 2210 may be made of metals having excellent thermoconductivity and the outside thereof may be insulated by covering an insulating material layer on the substrate 2210. The substrate 2210 may have the same size as the growth substrate 2110, and, may have a larger size than the growth substrate 2110.

The electrodes 2220 may be disposed on the surface of the substrate 2210. The electrodes 2220 may correspond to the bump pads 2160 or the pad protective layers 2190 that are disposed on the growth substrate 2110. That is, the first electrode 2222 of the electrodes 2220 corresponds to the first bump pad 2162 or the first pad protective layer 2192 and the second electrode 2224 thereof may correspond to the second bump pad 2164 or the second pad protective layer 2194. The electrodes 2220 may serve as a contact terminal that connects the light emitting diode package 2100 with external devices or external power supplies, and may serve as a connection wiring that electrically connects to the light emitting diode package 2100.

The conductive adhesive material 2230 may serve to mount the growth substrate 2110 on the substrate 2210. That is, the conductive adhesive material 2230 may serve to physically couple the growth substrate 2110 with the substrate 2210. In addition, the conductive adhesive material 2230 may serve to electrically connect the bump pads 2160 disposed on the growth substrate 2110 to the electrodes 2220 disposed on the substrate 2210. In this case, the conductive adhesive material 2230 may include a first conductive adhesive material 2232 and a second conductive adhesive material 2234, wherein the first conductive material 2232 and the second conductive adhesive material 2234 are physically and electrically separated from each other. The first conductive adhesive material 2232 electrically connects the first bump pad 2162 or the first pad protective layer 2192 to the first electrode 2222, and the second conductive adhesive material 2234 electrically connects the second bump pad 2164 or the second pad protective layer 2194 to the second electrode 2224, wherein the first conductive adhesive material 2232 and the second conductive adhesive material 2234 are electrically and physically separated from each other. In this case, the conductive adhesive material 2230 may be made of at least one of tin, gold, silver, bismuth, antimony, copper, and the like.

The conductive adhesive material 2230 may cover at least a portion of the top of the growth substrate 2110 and the semiconductor structure layer 2120, in particular, the top portion of the passivation layer 2180 or the protective layer 2150 covering the semiconductor structure layer 2120.

If the light emitting diode package 2100 includes the phosphor layer 2170 to convert the light emitted from the light emitting layer 2124 into different wavelengths, the conductive adhesive material 2230 may serve to reduce the light scattered without being converted by the phosphor layer 2170 being emitted to the outside by propagating the light emitted from the light emitting layer 2124 to the side thereof. That is, the conductive adhesive material 2230 may reduce the light not converted by the phosphor layer 2170 being emitted to the outside, thereby making the optical characteristics having the converted wavelength in the phosphor layer 2170 excellent.

In this case, as shown in FIG. 1, covering the top portion of the growth substrate 2110 and the semiconductor structure layer 2120 with the conductive adhesive material 2230 may mean covering the entire side of the semiconductor structure layer 2120 and the entire side of the growth substrate 2110 (in this case, the side of the growth substrate 2110 means the side other than the surface of the lateral inclination 2114 of the growth substrate on which the phosphor layer 2170 is provided). In addition, although not shown in the drawings, covering the bottom portion of the growth substrate 2110 and the semiconductor structure layer 2120 with the conductive adhesive material 2230 may mean the form in which the side of the semiconductor structure layer 2120 is partially covered without covering the side of the growth substrate 2110, the entire side of the semiconductor structure layer 2120, or the side of the semiconductor structure layer 2120 and the side of the growth substrate 2110 is partially covered. That is, covering the top portion and the bottom portion of the growth substrate 2110 and the semiconductor structure layer 2120 with the conductive adhesive material 2230 means a form in which the conductive adhesive material 2230 is disposed on the propagation path of light so as to reduce the light not absorbed by the phosphor layer 2170 and emitted among the light emitted from the light emitting layer 2124 of the semiconductor structure layer 2120.

Figure 7:
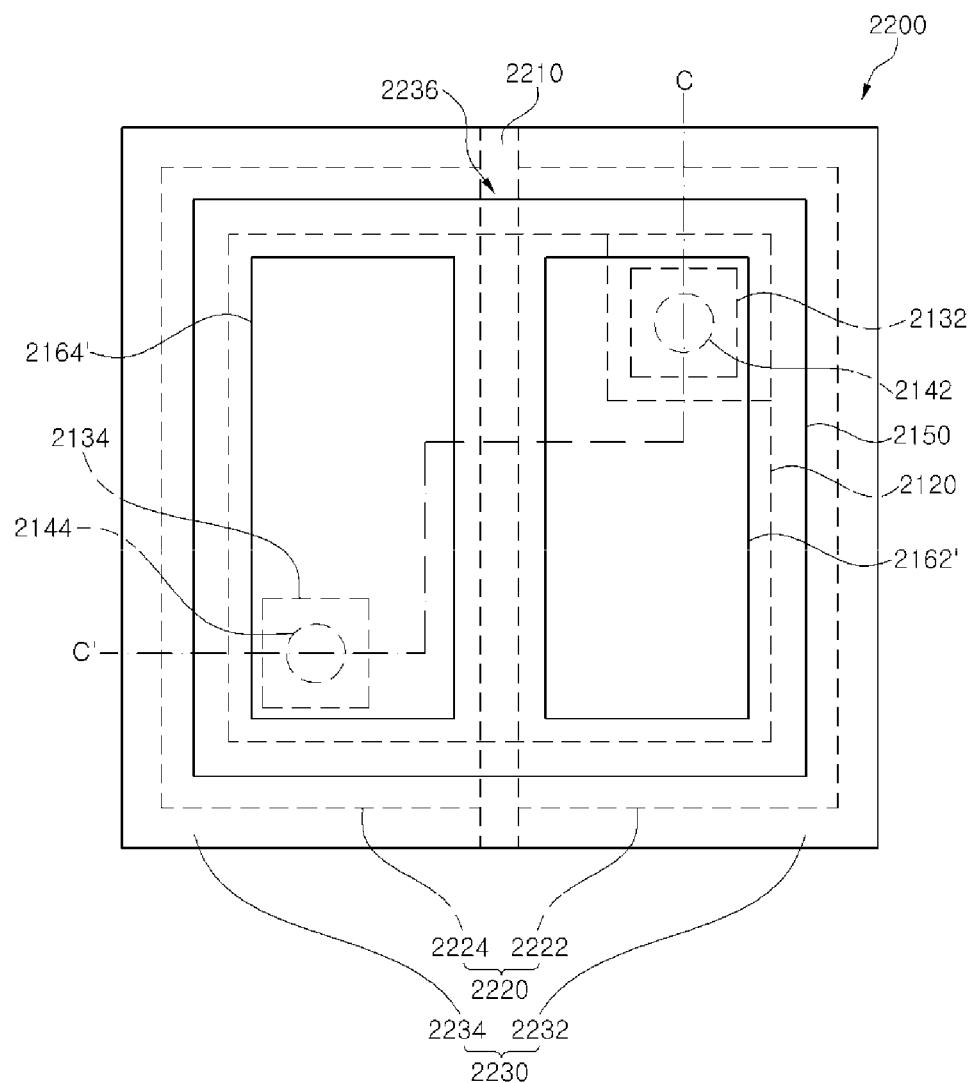
FIG. 7 and FIG. 8 are a plan view and a cross-sectional view showing a light emitting diode package according to another exemplary embodiment of the present invention.
Figure 9:
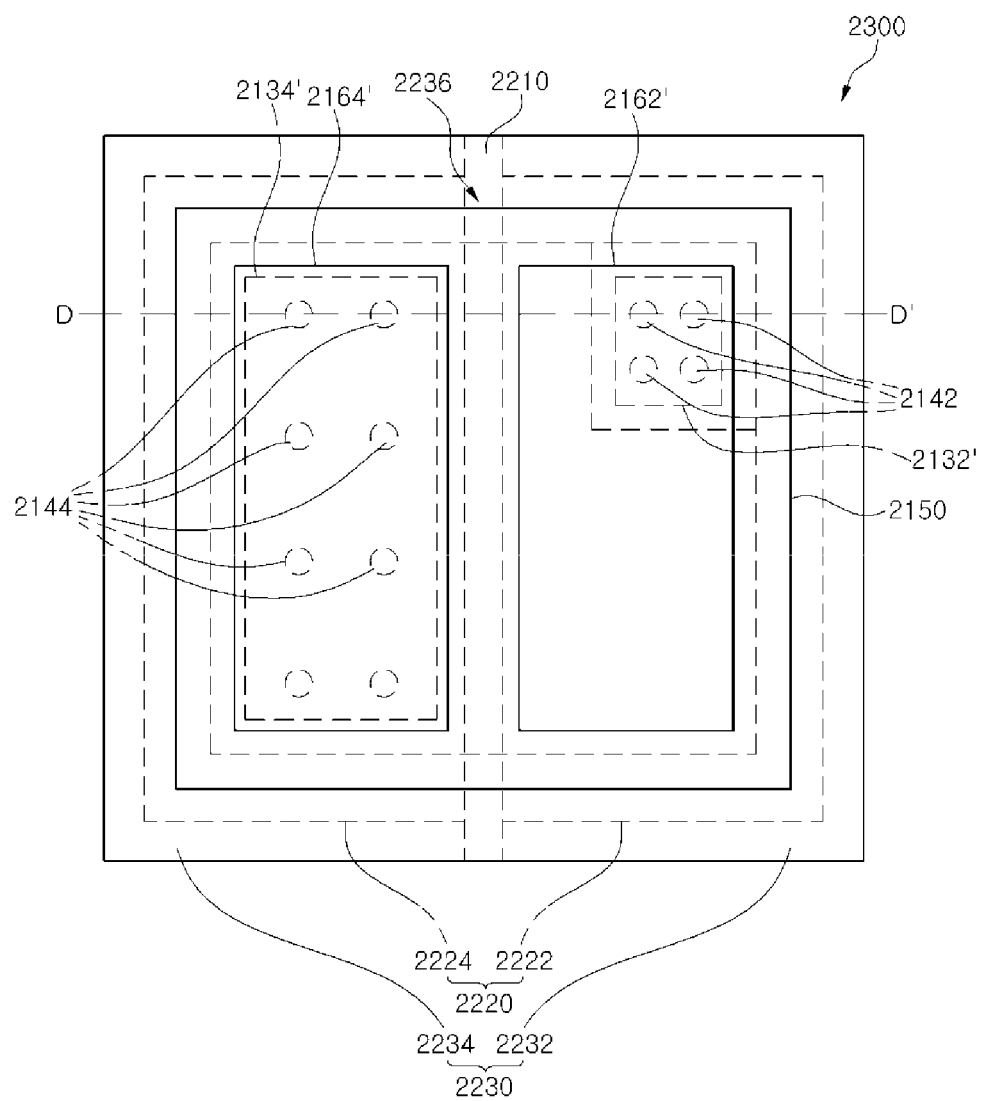
FIG. 9 and FIG. 10 are a plan view and a cross-sectional view showing a light emitting diode package according to another exemplary embodiment of the present invention.

In this case, since the conductive adhesive material 2230 includes the first conductive adhesive material 2232 and the second conductive adhesive material 2234 and the first conductive adhesive material 2232 and the second conductive adhesive material 2234 need to be separated from each other so as to be electrically insulated from each other, as shown in FIG. 7 and FIG. 9 to be described below, a form in which regions of the side of the semiconductor structure layer 2120 and the side of the growth substrate 2110 is not partially covered may be provided.

Therefore, the semiconductor structure layer 2120, the contact pads 2130, and the bumps 2140 on the growth substrate 2110, and at least the semiconductor structure layer 2120 are disposed on the light emitting diode package 2100. The light emitting diode package 2100 may also include the protective layer 2150 that protects the semiconductor structure layer 2120, the contact pads 2130, the bumps 2140, and the bump pads 2160 on the protective layer 2150 that are electrically connected to the bumps 2140, such that the growth substrate forming the semiconductor structure layer 2120 is packaged, that is, packaged at the wafer level to make the separate package process unnecessary, thereby providing the light emitting diode package having a small size.

In addition, the light emitting diode package 2100 includes the conductive adhesive material 2230 covering the top portion or the bottom portion of the growth substrate 2110 and the semiconductor structure layer 2120. As a result, the light emitting diode package may reduce the light being emitted to the side among the light emitted from the active layer 2124 without being absorbed into the phosphor layer 2170.

Figure 8:
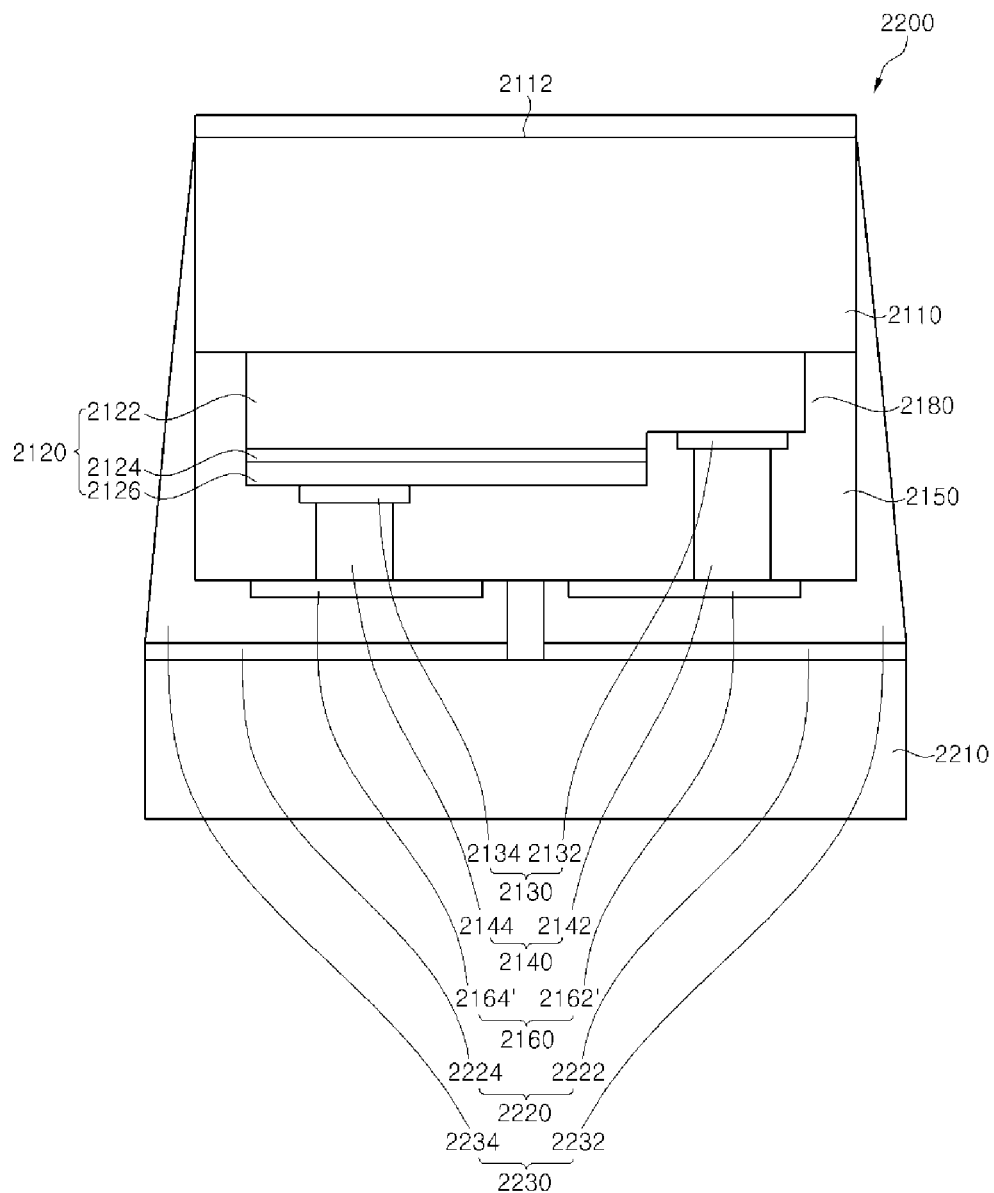

FIG. 7 and FIG. 8 are a plan view and a cross-sectional view showing a light emitting diode package according to another exemplary embodiment of the present invention. In this case, FIG. 8 shows a cross-sectional view taken along line C-C' of FIG. 7, and FIG. 7 shows a plan view of a surface of the growth substrate 2110.

Referring to FIG. 7 and FIG. 8, only the bump pads 2160 of the light emitting diode package 2200 are different from the bump pads 2160 of the light emitting diode package 2100 described with reference to FIG. 6, and other components thereof are the same as FIG. 1. Therefore, the description of the same components will be omitted and only the bump pads 2160 will be described in detail. Meanwhile, the corners of the growth substrate 2110 according to another exemplary embodiment of the present invention need not be inclined.

That is, the light emitting diode package 2200 may include the growth substrate 2110, the semiconductor structure layer 2120, the contact pads 2130, the bumps 2140, the protective layer 2150, the bump pads 2160, the substrate 2210, the electrodes 2220, and the conductive adhesive material 2230. In this case, the conductive adhesive material 2230 may be provided so that the region (shown by reference numeral 2236) of the side of the semiconductor structure layer 2120 and the side of the growth substrate 2110 is not partially covered as shown in FIG. 7.

In addition, although not shown in the drawings, the light emitting diode package 2200 may further include the passivation layer 2180 and the pad protective layers 2190 of the light emitting diode package 2100 described with reference to FIG. 6 as described above. In this case, the passivation layer 2180 and the pad protective layers 2190 may also be omitted. In addition, the light emitting diode package 2200 may include the patterns or the ruggedness such as the moth eye pattern (not shown) or the blast marks (not shown) on the other surface 2112 of the growth substrate 2110 so as to increase the light emission efficiency, the buffer layer (not shown) between the growth substrate 2110 and the first type semiconductor layer 2122, the blocking layer (not shown) between the active layer 2124 and the second type semiconductor layer 2126, and the high-concentration doped second type semiconductor layer (not shown) and the contact layer (not shown) between the second type semiconductor layer 2126 and the second contact pad 2134.

The bump pads 2160 may be disposed on a surface of the light emitting diode package 2200 and on the surface of the protective layer 2150 on a surface of the growth substrate 2110, as shown in FIG. 7 and FIG. 8.

In this configuration, the bump pads 2160 may include a first bump pad 2162' and a second bump pad 2164'. The first bump pad 2162' and the second bump pad 2164' may be disposed on the protective layer 2150, and have the same size. In particular, as shown in FIG. 7, the first bump pad 2162' and the second bump pad 2164' may be provided within the region corresponding to the semiconductor structure layer 2120. Also, unlike what is shown in FIG. 7, the first bump pad 2162' and the second bump pad 2164' may be provided so as to cover the entire surface of the protective layer 2150. That is, the first bump pad 2162' and the second bump pad 2164' of the light emitting diode package 2200 shown in FIG. 7 and FIG. 8 have an area larger than the first bump pad 2162 and the second bump pad 2164 of the light emitting diode package 2100 shown in FIG. 6, such that they may be easily mounted in other devices such as the light emitting diode package 2200.

Figure 10:
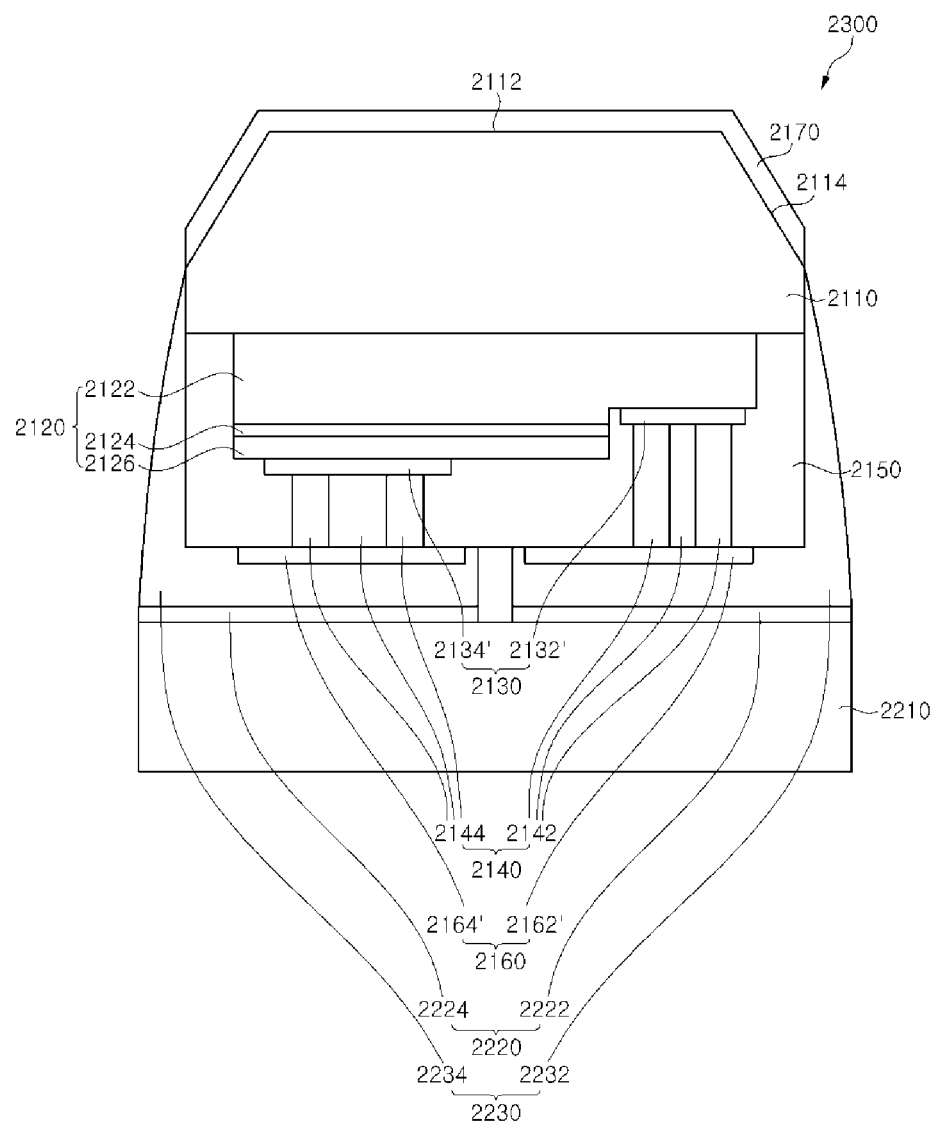

FIG. 9 and FIG. 10 are a plan view and a cross-sectional view showing a light emitting diode package according to another exemplary embodiment of the present invention. In this case, FIG. 10 shows a cross-sectional view taken along line D-D' of FIG. 9, and FIG. 9 shows a plan view of a surface of the growth substrate 2110.

Referring to FIG. 9 and FIG. 10, only the contact pads 2130 of the light emitting diode package 2300 are different from the contact pads 2130 of the light emitting diode package 2200 described with reference to FIG. 7 and FIG. 8, and other components thereof are the same. Therefore, the description of the same components will be omitted and only the contact pads 2130 will be described.

That is, the light emitting diode package 2300 may include the growth substrate 2110, the semiconductor structure layer 2120, the contact pads 2130, the bumps 2140, the protective layer 2150, the bump pads 2160, the substrate 2210, the electrodes 2220, and the conductive adhesive material 2230. In this case, the conductive adhesive material 2230 may be provided so that the region (shown by reference numeral 2236) of the side of the semiconductor structure layer 2120 and the side of the growth substrate 2110 is not partially covered as shown in FIG. 7.

In addition, although not shown in the drawings, the light emitting diode package 2300 may further include the passivation layer 2180 and the pad protective layers 2190 of the light emitting diode package 2100 described with reference to FIG. 6 as described above. In this case, the passivation layer 2180 and the pad protective layers 2190 may also be omitted. In addition, the light emitting diode package 2300 may include the patterns or the ruggedness such as the moth eye pattern (not shown) or the blast marks (not shown) on the other surface 2112 of the growth substrate 2110 so as to increase the light emission efficiency, the buffer layer (not shown) between the substrate 2110 and the first type semiconductor layer 2122, the blocking layer (not shown) between the active layer 2124 and the second type semiconductor layer 2126, and the high-concentration doped second type semiconductor layer (not shown) and the contact layer (not shown) between the second type semiconductor layer 2126 and the second contact pad 2134.

The contact pads 2130, in particular, the second contact pad 2134' may cover a wide area of the surface of the second type semiconductor layer 2126, as shown in FIG. 9 and FIG. 10. Therefore, the light emitting diode package 2300 according to another exemplary embodiment of the present invention includes the wide second contact pad 2134', such that the plurality of second bumps 2144 may be disposed on the second contact pad 2144'. In addition, the first contact pad 2132' is also formed to have a wide area and thus, may also include the plurality of first bumps 2142.

Figure 11:
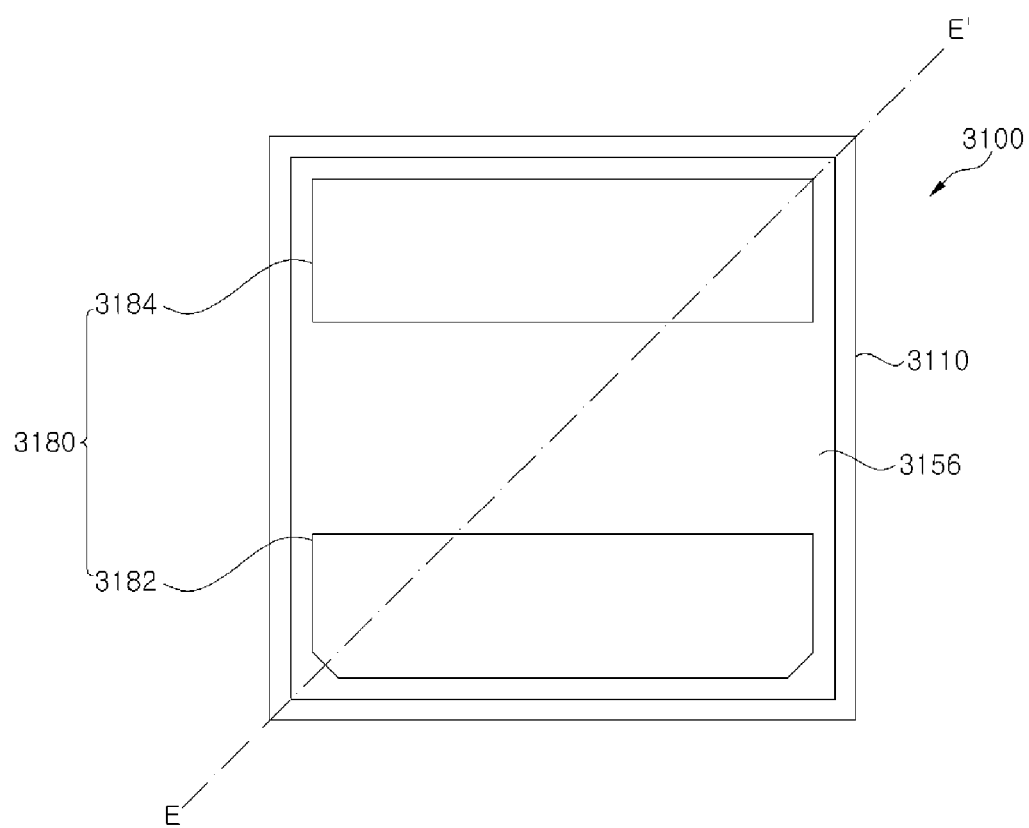
FIG. 11 is a plan view showing a light emitting diode package according to another exemplary embodiment of the present invention.
Figure 12:
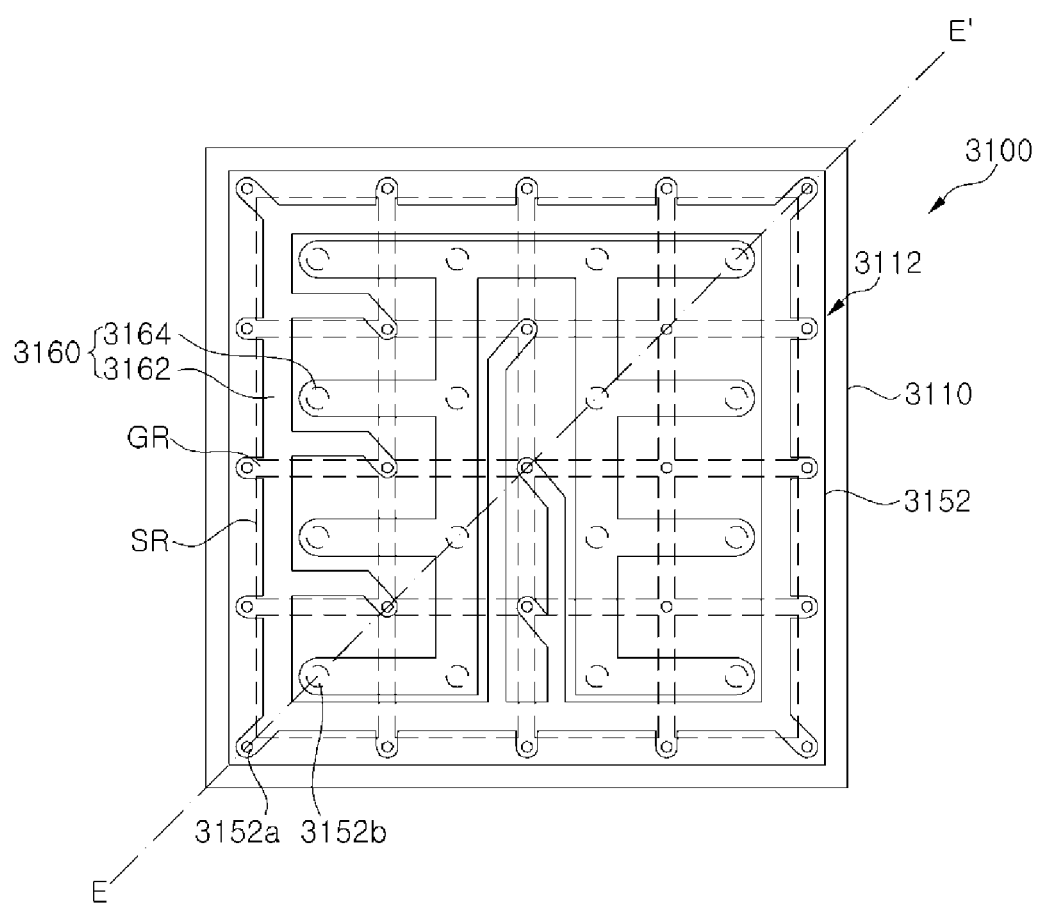
FIG. 12 is a plan view showing connection wirings of a light emitting diode package according to another exemplary embodiment of the present invention.
Figure 13:
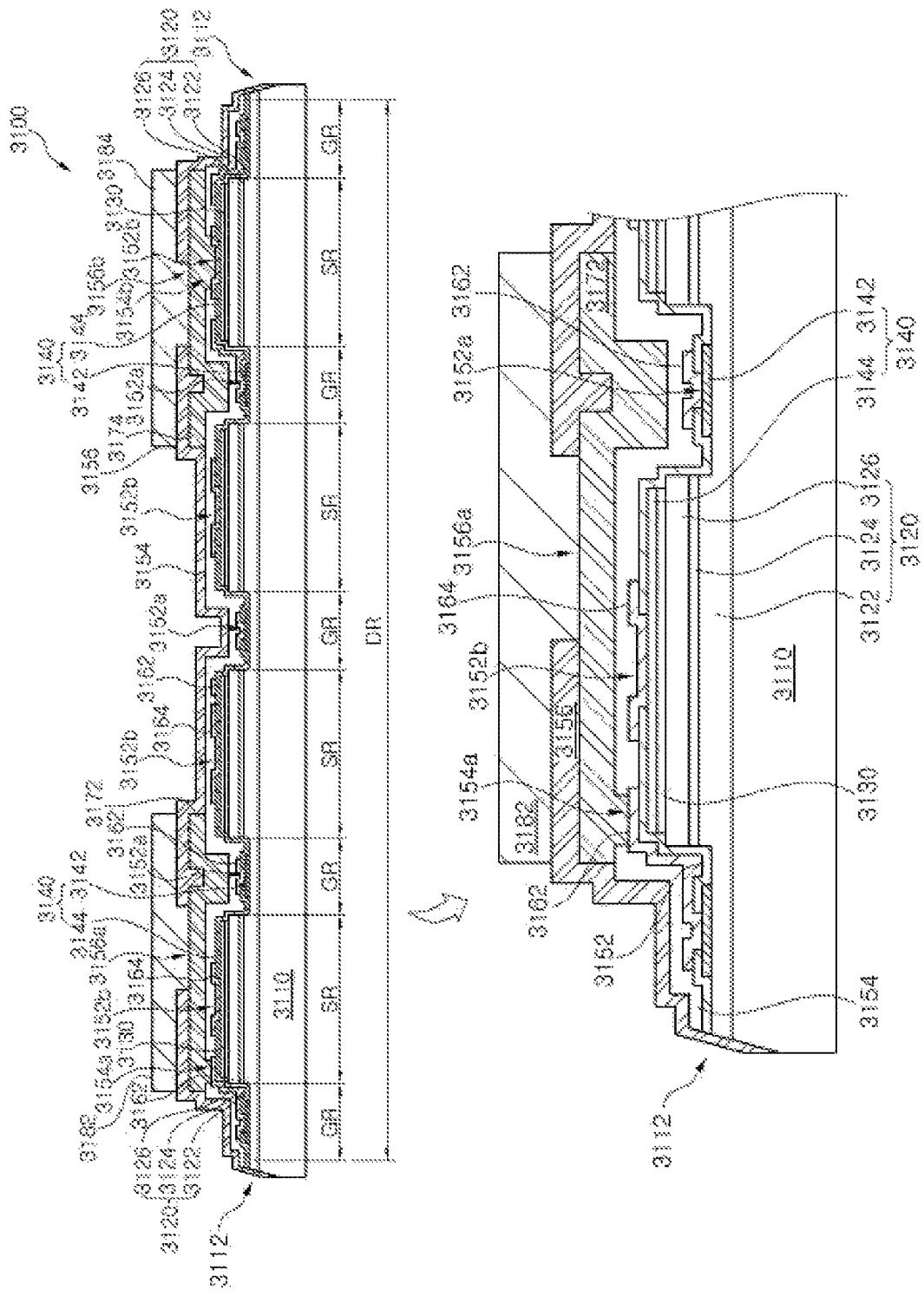
FIG. 13 is a cross-sectional view showing a light emitting diode package according to another exemplary embodiment of the present invention.

FIG. 11 and FIG. 13 are a plan view and a cross-sectional view showing a light emitting diode package according to another exemplary embodiment of the present invention. In this case, FIG. 12 is a plan view showing connection wirings of a light emitting diode according to another exemplary embodiment of the present invention, and FIG. 13 is a cross-sectional view taken along line E-E' of FIG. 11. In this case, FIG. 12 shows a structure in which the connection wirings 3160, which will be described below, are exposed, wherein components on the connection wirings 3160 are omitted.

Referring to FIG. 11 and FIG. 13, a light emitting diode package 3100 according to another exemplary embodiment of the present invention may include a growth substrate 3110, a semiconductor structure layer 3120, an ohmic contact layer 3130, pads 3140, insulating layers 3150, connection wirings 3160, bumps 3170, and contact parts 3180.

In this case, the semiconductor structure layer 3120 may include a first type semiconductor layer 3122, an active layer 3124, and a second type semiconductor layer 3126. The pads 3140 may include a first pad 3142 and a second pad 3144. The insulating layers 3150 may include a first insulating layer 3152, a second insulating layer 3154, and a third insulating layer 3156. The connection wirings 3160 may include a first connection wiring 3162 and a second connection wiring 3164. The bumps 3170 may include a first bump 3172 and a second bump 3174. The contact parts 3180 may include a first contact part 3182 and a second contact part 3184.

The growth substrate 3110 may be a sapphire substrate, a glass substrate, a silicon substrate, or the like, but is not limited thereto. The growth substrate 3110 may be any substrate capable of forming the semiconductor structure layer 3120. The sapphire substrate may be exemplarily used as the growth substrate 3110.

The semiconductor structure layer 3120 may be disposed on the growth substrate 3110. In this case, a plurality of semiconductor structure layers 3120 may be disposed on the growth substrate 3110. As shown in FIG. 11 and FIG. 12, the semiconductor structure layer 3120 may be provided in an n×n array form (in this case, n is an integer number of 1 or more). Another exemplary embodiment of the present invention discloses that the semiconductor structure layers 3120 are provided in a 4×4 array form.

Each of the semiconductor structure layers 3120 may be disposed on a structure region (SR) of the growth substrate 3110. In this case, the first type semiconductor layers 3122 of the semiconductor structure layers 3120 may be connected with one another, and the first type semiconductor layers 3122 are disposed only in the structure region (SR) and may be provided in gap regions GRs while they are separated from each other.

Meanwhile, the semiconductor structure layers 3120 may be enclosed by the gap regions GRs in which the semiconductor structure layers 3120 are separated from each other by performing the mesa etching on the active layer 3124 and the second type semiconductor layer 3126. The gap regions GRs may include a region exposed by etching the active layer 3124 and the second type semiconductor layer 3126 of the semiconductor structure layer 3120 by the mesa etching as shown in FIG. 3, that is, a partial regions of the exposed first semiconductor layer 3122.

The semiconductor structure layer 3120 may further include a super lattice layer (not shown) or an electronic blocking layer (not shown). In this case, in the semiconductor structure layer 3120, other layers other than the active layer 3124 may be omitted.

In this case, the first type semiconductor layer 3122 may be made of a first type impurity, for example, a III-N series compound semiconductor material doped with N-type impurities, for example, an (Al, In, Ga) N-series III group nitride semiconductor material and may be a GaN layer, that is, an N—GaN layer doped with the N-type impurity. The first type semiconductor layer 3122 may be made of a single layer or a multi-layer. If the first type semiconductor layer 3122 is formed of a multi-layer, the first type semiconductor layer 3122 may be formed of the super lattice structure.

The active layer 3124 may be made of a III-N series compound semiconductor material, for example, (Al, In, Ga) N semiconductor layer, and the active layer 3124 may be formed of the single layer or the multi-layer. In addition, the active layer 3124 may be a single quantum well structure including a single well layer (not shown), or may have a multi-quantum well structure in which a well layer (not shown) and a barrier layer (not shown) are alternately stacked, wherein one or both of the well layer (not shown) and the barrier layer (not shown) may be formed of the super lattice structure.

The second type semiconductor layer 3126 may be made of the second type impurity, for example, a III-N series compound semiconductor material doped with P-type impurities, for example, an (Al, In, Ga) N-series III group nitride semiconductor material and may be a GaN layer, that is, an P—GaN layer doped with the P-type impurity. The second type semiconductor layer 3126 may be made of a single layer or a multi-layer. If the second type semiconductor layer 3126 is formed of a multi-layer, the second type semiconductor layer 3126 may be formed of the super lattice structure.

The super lattice layer (not shown) may be provided between the first type semiconductor layer 3122 and the active layer 3124. The super lattice layer may have a structure in which the III-N series compound semiconductor material, for example, (Al, Ga, In) N semiconductor layer is stacked in a multi-layer, for example, an InN layer and an InGaN layer are alternately stacked and the super lattice layer is disposed at a position formed before the active layer to reduce the transfer of dislocation, defect, or the like, to the active layer 3124, which may serve to relieve the formation of the dislocation, defects, or the like, of the active layer 3124 and to implement the excellent crystallinity of the active layer 3124.

The electronic blocking layer (not shown) may be provided between the active layer 3124 and the second type semiconductor layer 3126. The electronic blocking layer may be provided so as to increase the recombination efficiency of holes and electrons, and may be formed of a relatively wide band gap. The electronic blocking layer may be made of a (Al, In, Ga) N-series III group nitride semiconductor material, for example, may be made of P—AlGaN doped with Mg.

The ohmic contact layer 3130 may be disposed on the semiconductor structure layers 3120. The ohmic contact layer 3130 may be disposed on the second type semiconductor layer 3126 of the semiconductor structure layers 3120. The ohmic contact layer 3130 may be provided so as to form ohmic-contact to the second type semiconductor layer 3126.

The ohmic contact layer 3130 may be made of ITO. In addition, the ohmic contact layer 3130 may include a metal layer made of metal materials such as Ni, Ag, Cu, or the like, or an alloy thereof, wherein the metal layer may be provided in a single layer or a multi-layer. If the ohmic contact layer 3130 is made of metal materials, the ohmic contact layer 3130 may serve to reflect the light emitted from the semiconductor structure layer 3120 to the growth substrate 3110.

If the ohmic contact layer 3130 is made of ITO, the ohmic contact layer may have a thickness of 500 to 2000 nm, for example, 1200 nm.

The pads 3140 may include one or more first pads 3142 and one or more second pad 3144.

The first pad 3142 may be disposed on a certain region of the first type semiconductor layer 3122 exposed by performing the mesa etching on the gap region GR, in order words, the second type semiconductor layer 3126 and the active layer 3124. In this case, the first pad 3142 serves to supply power to the first type semiconductor layer 3122 and thus, may be provided at a certain position to supply uniform current to the semiconductor structure layer 3120. If the semiconductor structure layers 3120 are a polygonal shape such as a rectangular shape, or the like, they may be disposed on the certain region of the exposed first type semiconductor layer 3122 corresponding to the corners of the semiconductor structure layers 3120.

The first pad 3142 may be made of a metal material and may be provided in at least one layer which includes at least one of Ni, Au, and Ti, for example, three layers such as Ni/Au/Ti layers, wherein a thickness of each layer may have 300 nm, 3000 nm, and 100 nm, respectively. In this case, a material and a thickness of the first pad 3142 are only an example. Therefore, the material and the thickness thereof may be modified in various manners. For example, the first pad 3142 may be formed of a Ti/Al layer.

The second pad 3144 may be provided in the structure region SR, that is, on the ohmic contact layer 3130 of the second type semiconductor layer 3126. The second pad 3144 serves to supply power to the second type semiconductor layer 3122 through the ohmic contact layer 3130 and corresponds to the first pad. Therefore, the second pad 3144 may be provided at a position in consideration of a positional relation with the first pad 3142 and may be positioned at a center of the second type semiconductor layer 3126.

The second pad 3144 may be made of a metal material and may be formed of at least one layer which includes Cr or Al, for example, three layers such as Cr/Al/Cr layers, or, three layers such as Cr/Al/Cr layers, wherein a thickness of each layer may have 10 nm, 2500 nm, and 300 nm, respectively. In this case, a material and a thickness of the second pad 3144 are only an example. Therefore, the material and the thickness thereof may be modified in various manners. For example, the second pad 3144 may be formed of a Ni/Ag or Ag—Cu layer.

The first insulating layer 3152 of the insulating layers 3150 may be disposed on the growth substrate 3110 including the first pad 3142 and the second pad 3144.

The first insulating layer 3152 includes openings 3152a and 3152b that open the first pad 3142 and the second pad 3144, respectively. In this case, the openings 3152a and 3152b expose the certain region of the gap region GR adjacent to corners of the semiconductor structure layer 3120 and the certain regions of the first pad 3142 and the second pad 3144 positioned at the center of the semiconductor structure layer 3120, that is, the center of the structure region SR as shown in FIG. 11 and FIG. 12.

The first insulating layer 3152 may be formed of an oxide layer, a nitride layer, or an organic insulating layer, for example, a silicon oxide layer. The first insulating layer 3152 may have a thickness of 2000 to 10000 nm, for example, a thickness of 4800 nm.

Meanwhile, the first insulating layer 3152 may be formed of a distributed Bragg reflection (DBR) layer formed on insulating layers having different refractive indexes. That is, the first insulating layer 3152 may be provided so that two insulating layers having different refractive indexes are repeatedly stacked several times. When the first insulating layer 3152 is formed of the DBR layer, the light emission efficiency can be increased in the direction of the growth substrate 3110 by using the reflection characteristics of the DBR layer.

The connection wirings 3160 may include a first connection wiring 3162 and a second connection wiring 3164.

The first connection wiring 3162 and the second connection wiring 3164 are disposed on the first insulating layer 3152 but may be provided so that they are spaced apart from each other, and thus, are electrically separated from each other. In addition, the first connection wiring 3162 and the second connection wiring 3164 serve to electrically connect all of the semiconductor structure layers 3120 to one another and connect the semiconductor structure layers 3120 with one another in parallel. That is, the first connection wiring 3162 is connected with all of the first pads 3142 exposed by the opening 3152a of the first insulating layer 3152 and the second connection wiring 3164 is connected with all of the second pads 3144 exposed by the opening 3152b of the first insulating layer 3152, which connect all of the semiconductor structure layers 3120 with one another in parallel.

In this case, the wiring form of the first connection wiring 3162 and the second connection wiring 3164 shown in FIG. 12 is shown in one form according to another exemplary embodiment of the present invention and may vary in another form if necessary. That is, the first connection wiring 3162 and the second connection wiring 3164 may be provided in any pattern form in which the semiconductor structure layers 3120 are connected with one another in parallel. In addition, the first connection wiring 3162 and the second connection wiring 3164 may vary in a pattern form in which the semiconductor structure layers 3120 are connected with one another in series.

The connection wirings 3160 may be made of conductive metals of at least one layer or multi-layers including Cr, Au, and Ti, for example, the Cr/Au/Ti layers. The Cr/Au/Ti layers may each have a thickness of 10 nm, 3000 nm, and 100 nm.

The second insulating layer 3154 of the insulating layers 3150 may be disposed on the growth substrate 3110 on which the connection wirings 3160 are provided.

The second insulating layer 3154 includes openings 3154a and 3154b that open the first connection wiring 3162 and the second connection wiring 3164, respectively. In this case, the openings 3154a and 3154b may be provided in plural in consideration of the position at which the bumps 3170, which will be described below, are provided as described in FIG. 2.

The second insulating layer 3154 may be formed of an oxide layer, a nitride layer, or an organic insulating layer, for example, a silicon nitride layer. The second insulating layer 3154 may have a thickness of 2000 to 10000 nm, for example, a thickness of 4800 nm.

The bumps 3170 may include a first bump 3172 and a second bump 3174.

The first bump 3172 is connected with the first connection wiring 3162 exposed by the opening 3154a of the second insulating layer 3154 and thus, may be disposed on the certain region of the second insulating layer 3154.

The second bump 3174 is connected with the second connection wiring 3164 exposed by the opening 3154b of the second insulating layer 3154 and thus, may be disposed on the certain region of the second insulating layer 3154. The second bump 3174 may be electrically insulated from the first bump 3172. In this case, the first bump 3172 and the second bump 3174 may be spaced apart from each other. If the light emitting diode package 3100 including the first bump 3172 and the second bump 3174 is mounted on the another substrate, the first bump 3172 and the second bump 3174 need to be sufficiently spaced apart from each other so as not to be short-circuited to each other due to the spreading of the conductive adhesive material. In this case, the conductive adhesive material may include at least one of Cr, Ni, Ti, Au, and Sn.

As shown in FIG. 12 and FIG. 13, the first bump 3172 and the second bump 3174 are disposed on the second insulating layer 3154. Therefore, the first bump 3172 and the second bump 3174 may have the same height.

The bumps 3170 may be made of the conductive materials, for example, the Cr/Au/Ti layers. Wherein the Cr/Au/Ti layers may be each provided to have a thickness of 300 nm, 10000 nm, and 100 nm.

The third insulating layer 3156 of the insulating layers 3150 may be disposed on the growth substrate 3110 on which the bumps 3170 are provided.

The third insulating layer 3156 includes the openings 3156a and 3156b that open the first bump 3172 and the second bump 3174, respectively. In this case, as shown in FIG. 11 to FIG. 13, the openings 3156a and 3156b may expose a certain position of each of the first bump 3172 and the second bump 3174.

The third insulating layer 3156 may be made of the oxide layer, the nitride layer, or the organic insulating layer. The third insulating layer 3156 may have a thickness of 1000 to 5000 nm, for example, a thickness of 3000 nm.

Meanwhile, the light emitting diode package 3100 according to another exemplary embodiment of the present invention may include a lateral inclination 3112 at which the side of the growth substrate 3110 is inclined. The lateral inclination 3112 may have a certain thickness from a surface of the growth substrate 3110 on which the semiconductor structure layer 3120 is provided.

In this case, the third insulating layer 3156 may cover the top of the surface of the growth substrate 3110 and the top of the surface of the lateral inclination 3112 of the growth substrate 3110.

The third insulating layer 3156 covers the top of the surface of the lateral inclination 3112 of the growth substrate 3110 and thus, may serve to reduce the conductive adhesive material contacting the side of the semiconductor structure layer 3120, in particular, the side of the first type semiconductor layer 3122 due to the creeping of the conductive adhesive material in a lateral direction of the growth substrate when the light emitting diode package 3100 including the contact parts 3180, which will be described below, is mounted on another substrate.

The contact parts 3180 may include a first contact part 3182 and a second contact part 3184.

The first contact part 3182 is connected with the first bump 3172 exposed by the opening 3156a of the third insulating layer 3156 and thus, may be disposed on the certain region of the third insulating layer 3156.

The second contact part 3184 is connected with the second bump 3174 exposed by the opening 3156b of the third insulating layer 3156 and thus, may be disposed on the certain region of the third insulating layer 3156 and may be provided so that the second contact part 3184 is electrically insulated from the first bump 3172. In this case, the first contact part 3182 and the second contact part 3184 may be spaced apart from each other, and may each be provided in the same form as the first bump 3172 and the second bump 3174.

As shown in FIG. 2 and FIG. 3, the first contact part 3182 and the second contact part 3184 are disposed on the third insulating layer 3156. Therefore, the first contact part 3182 and the second contact part 3184 may have the same height.

The contact parts 3180 may be made of the conductive material, for example, the Ni/Au layers, wherein the Ni/Au layers may each have a thickness of 5 μm and 0.25 μm.

Figure 14:
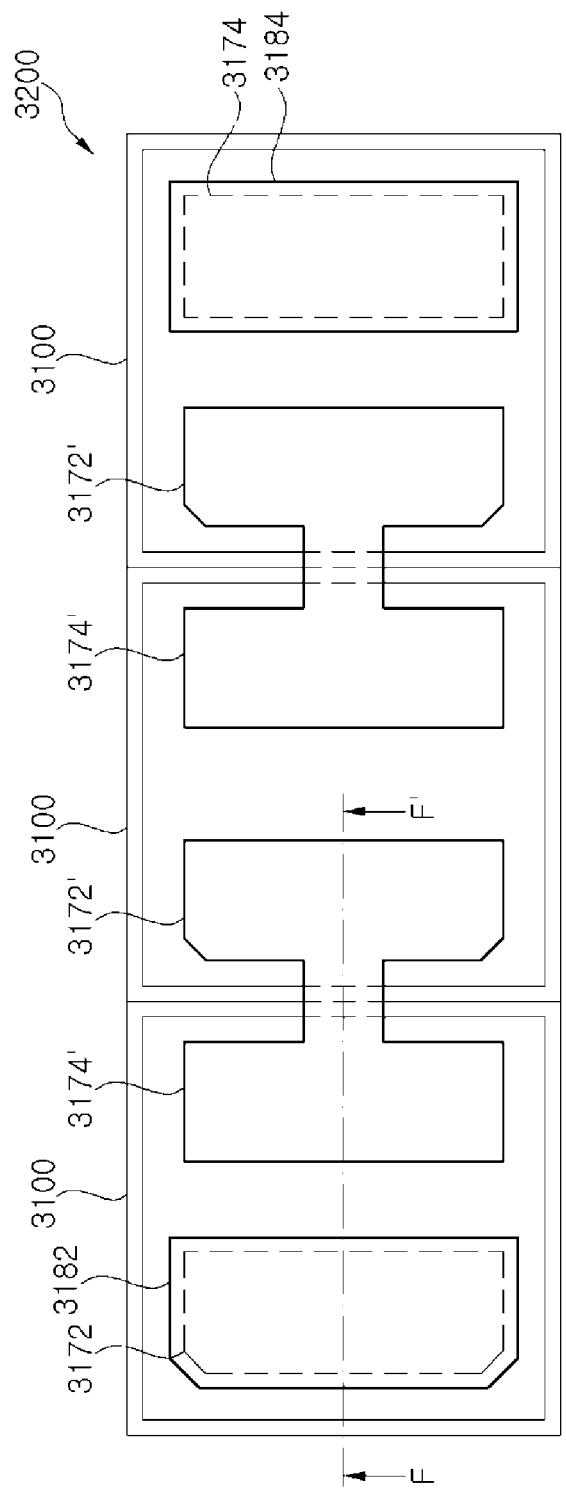
FIG. 14 is a plan view showing a light emitting diode package according to another exemplary embodiment of the present invention.

FIG. 14 is a plan view showing a light emitting diode package according to another exemplary embodiment of the present invention.

Referring to FIG. 14, a light emitting diode package 3200 according to another exemplary embodiment of the present invention includes a plurality of light emitting packages 3100, which were described with reference to FIG. 11 to FIG. 13, are connected with one another in series.

That is, the light emitting diode package 3200 may be provided so that three light emitting diode packages 3100 are connected with one another in series as shown in FIG. 14. The three light emitting diode packages 3100 are connected with one another in series by including first bumps 3172' and second bumps 3174' that are modified to connect the first bump 3172 and the second bump 3174 with each other.

In this case, the substrates 3110 may be connected with one another.

Figure 15:
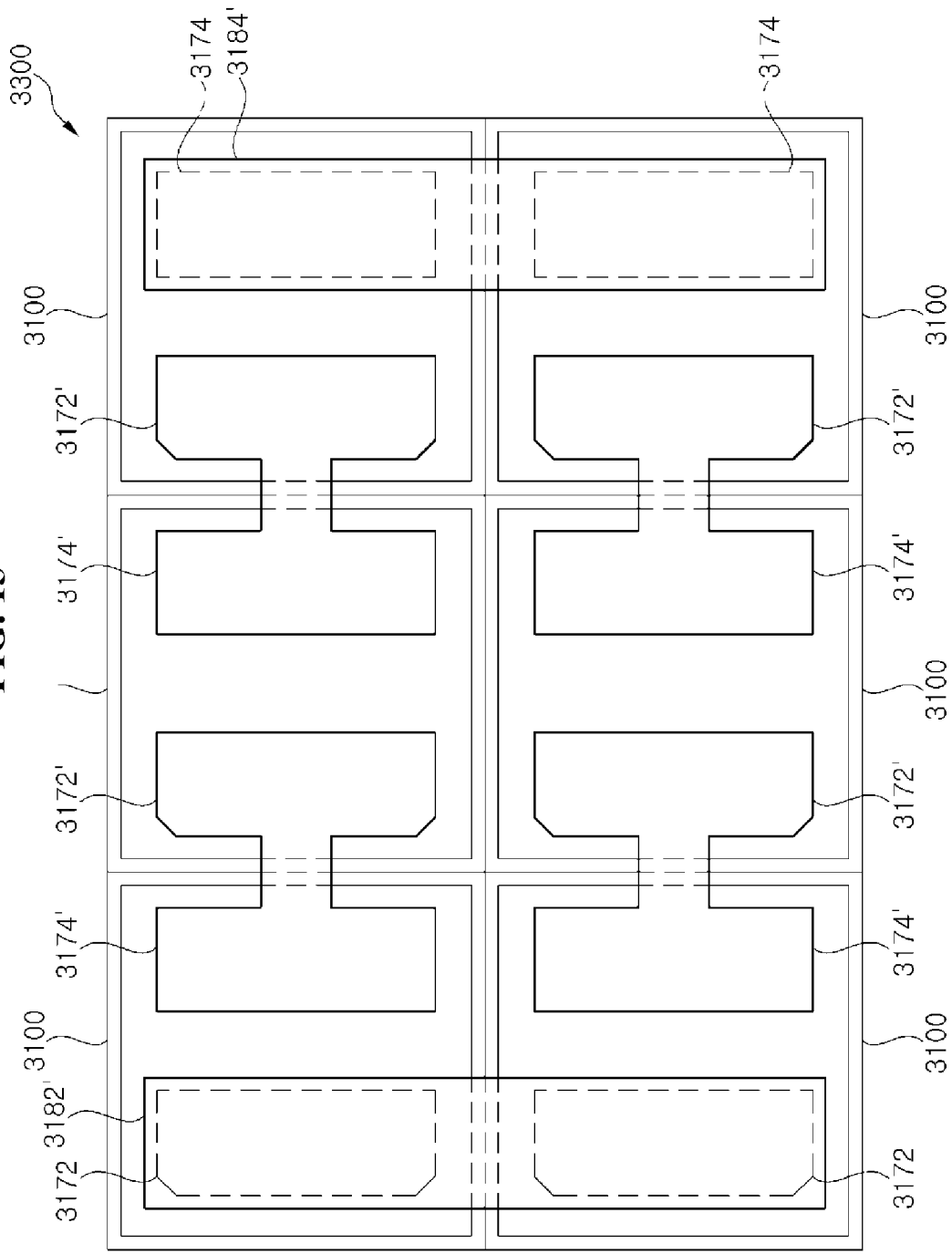
FIG. 15 is a plan view showing a light emitting diode package according to another exemplary embodiment of the present invention.

FIG. 15 is a plan view showing a light emitting diode package according to another exemplary embodiment of the present invention.

Referring to FIG. 15, a light emitting diode package 3300 according to another exemplary embodiment of the present invention may be provided so that the plurality of light emitting diodes 3200 according to another exemplary embodiment of the present invention, which was described with reference to FIG. 14, are connected with one another in parallel, in other words, the plurality of serial connection arrays including the plurality of light emitting diode packages 3100 according to another exemplary embodiment of the present invention are connected with one another in parallel.

That is, the light emitting diode package 3300 may include two serial connection arrays in which the three light emitting diode packages 3100 are connected with one another in series as shown in FIG. 15 and may be provided so that the serial connection arrays are connected with each other in parallel, wherein the three light emitting diode packages 3100 including first bumps 3172' and second bumps 3174' that are modified to connect the first bump 3172 and the second bump 3174 with each other are connected with one another in series. Further, the light emitting diode package 3300 may be provide in a form in which the two serial connection arrays including the first contact part 3182' disposed on the first bumps 3172 or the first bumps 3172' of the two serial connection arrays and modified to connect with the first bumps 3172 or the first bumps 3172' of the two serial connection array with each other and a second contact part 3184' disposed on the second bumps 3174 or the second bumps 3174' of the two serial connection arrays and modified to connect the second bumps 3174 or the second bumps 3174' of the two serial connection arrays with each other are connected with each other in parallel.

That is, the light emitting diode packages 3200 and 3300 described with reference to FIG. 14 and FIG. 15 include the plurality of light emitting diode packages 3100, but various forms of the light emitting diode packages may be formed by connecting the bumps 3170 or the contact parts 3180 with one another in series or in parallel.

Figure 16:
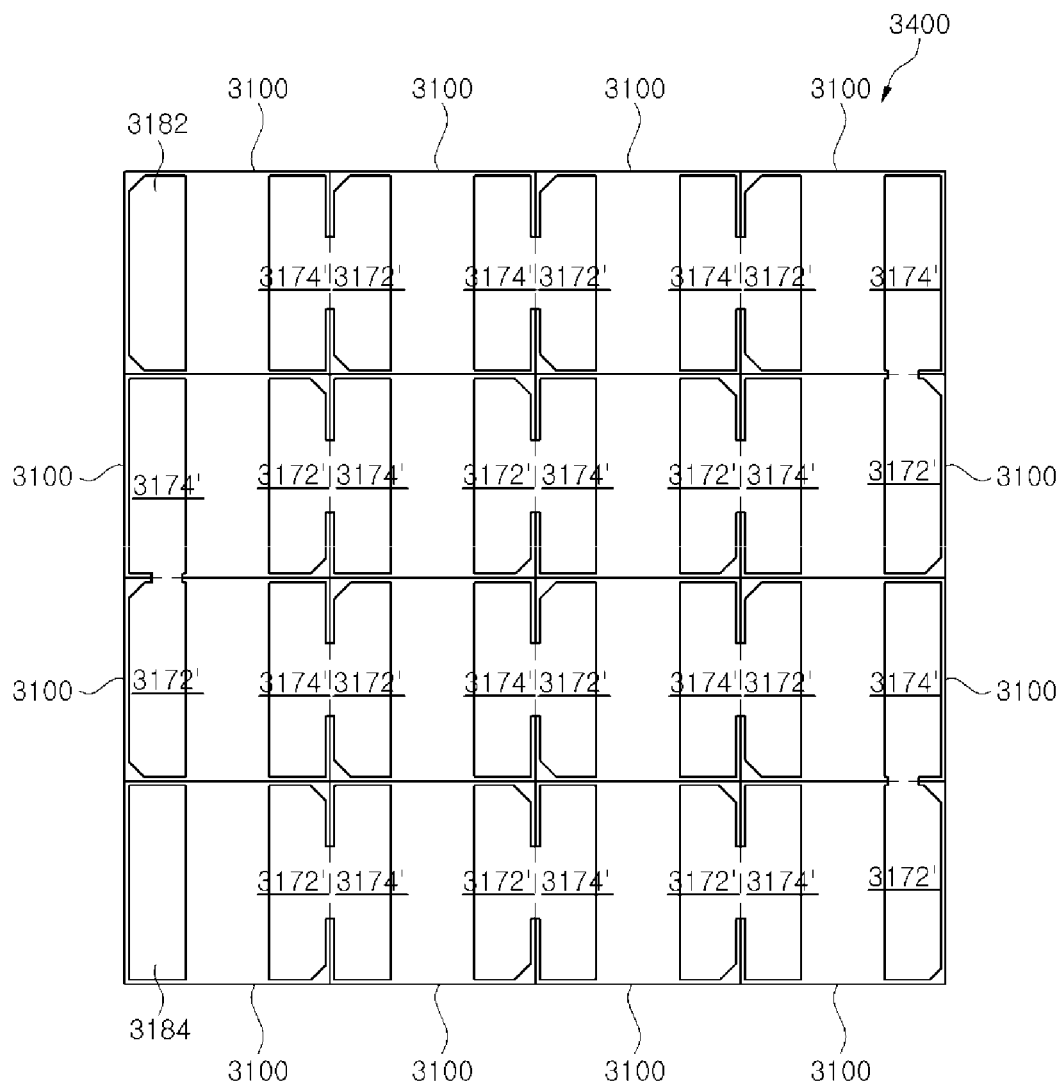
FIG. 16 and FIG. 17 are a plan view showing a light emitting diode package according to another exemplary embodiment of the present invention and a circuit diagram thereof.
Figure 17:
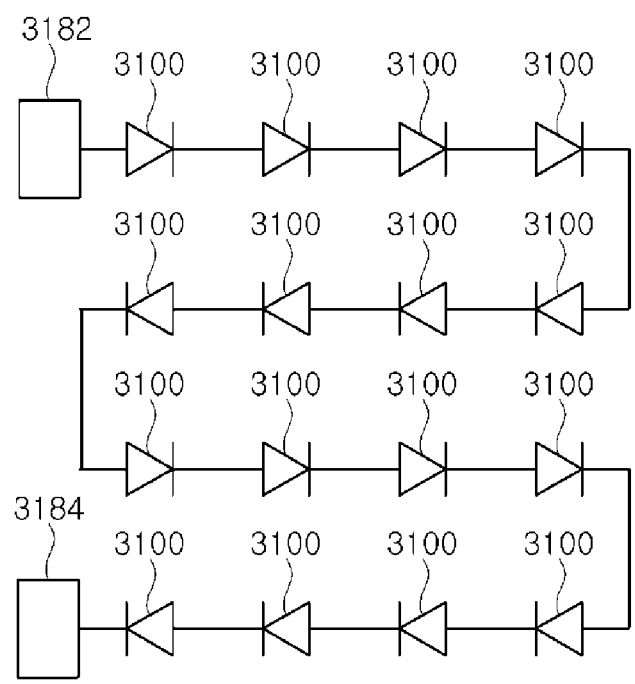

FIG. 16 is a plan view showing a light emitting diode package according to another exemplary embodiment of the present invention, and FIG. 17 is a circuit diagram of the light emitting diode package shown in FIG. 16.

Referring to FIG. 16 and FIG. 17, a light emitting diode package 3400 according to another exemplary embodiment of the present invention includes the plurality of light emitting diode packages 3100 according to another exemplary embodiment of the present invention, which were described with reference to FIG. 11 to FIG. 13, are connected with one another in series, but are arranged in an n×n type and then, are connected with one another in series.

As shown in FIG. 16, the light emitting diode package 3400 may be provided so that the sixteen light emitting diode packages 3100 are connected with one another in series, that is, in a form in which four columns each including the four light emitting diode packages 3100 are arranged.

That is, the light emitting diode package 3400 may include the first contact part 3182 that is disposed on the first bump 3172 of a first light emitting diode package 3100 of a first column and the second contact part 3184 that is disposed on the second bump 3174 of a final light emitting diode package 3100 of a final column, wherein the light emitting diode packages 3100 within each column may include the first bumps 3172' and the second bumps 3174' modified so that the first bumps 3172' and the second bumps 3174' of the adjacent light emitting diode packages 3100 are connected with one another in series and the final light emitting diode package 3100 of any one column or the first light emitting diode package 3100 of any one column may include the first bumps 3172' and the second bumps 3174' modified so that the first bump 3172 and the second bump 3174 of the light emitting diode packages 3100 of the lower column or the upper column are connected with each other so as to connect the light emitting diode packages 3100 of the bottom column or the top column in series.

Figure 18:
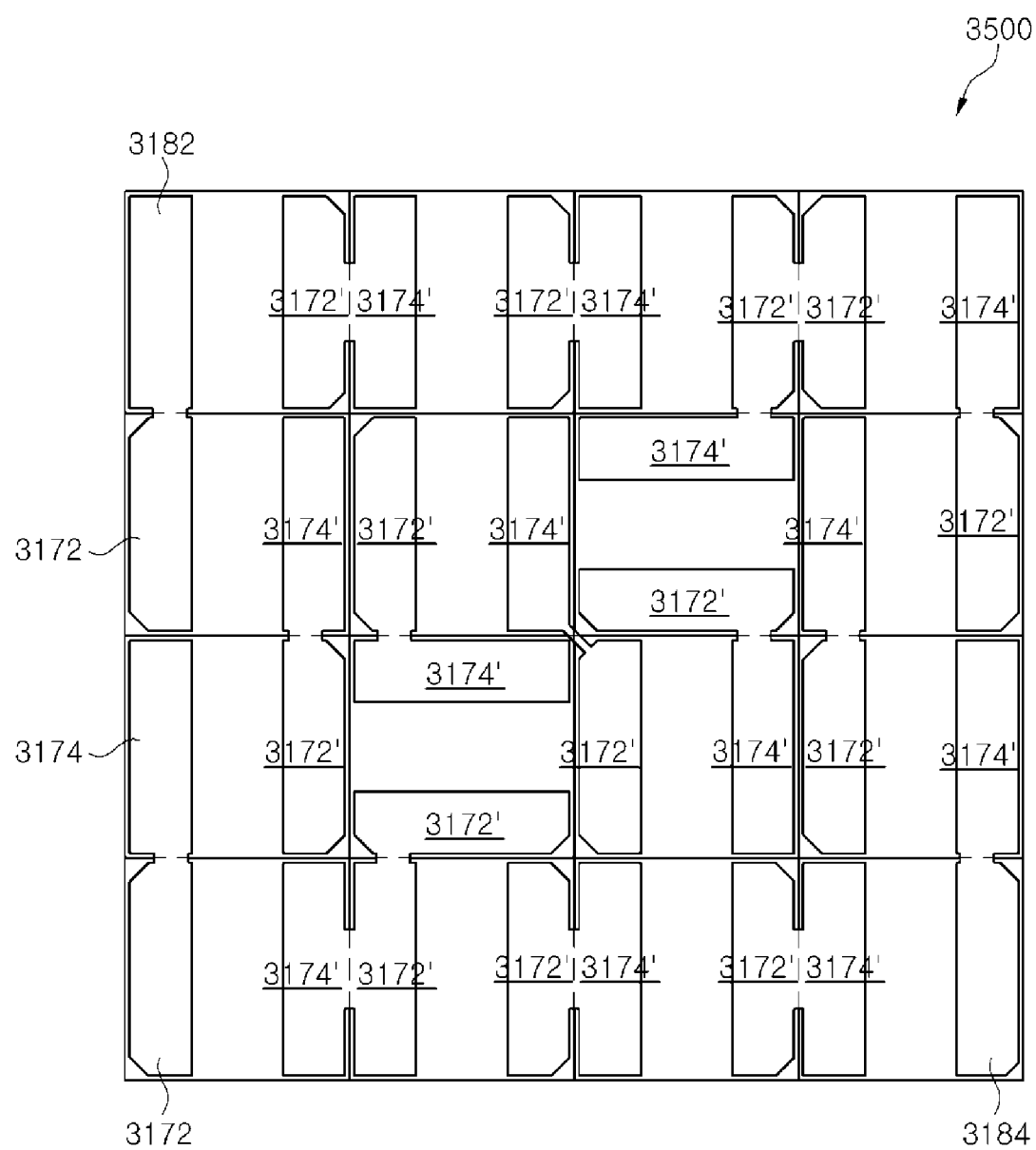
FIG. 18 and FIG. 19 are a plan view showing a light emitting diode package according to another exemplary embodiment of the present invention and a circuit diagram thereof.
Figure 19:
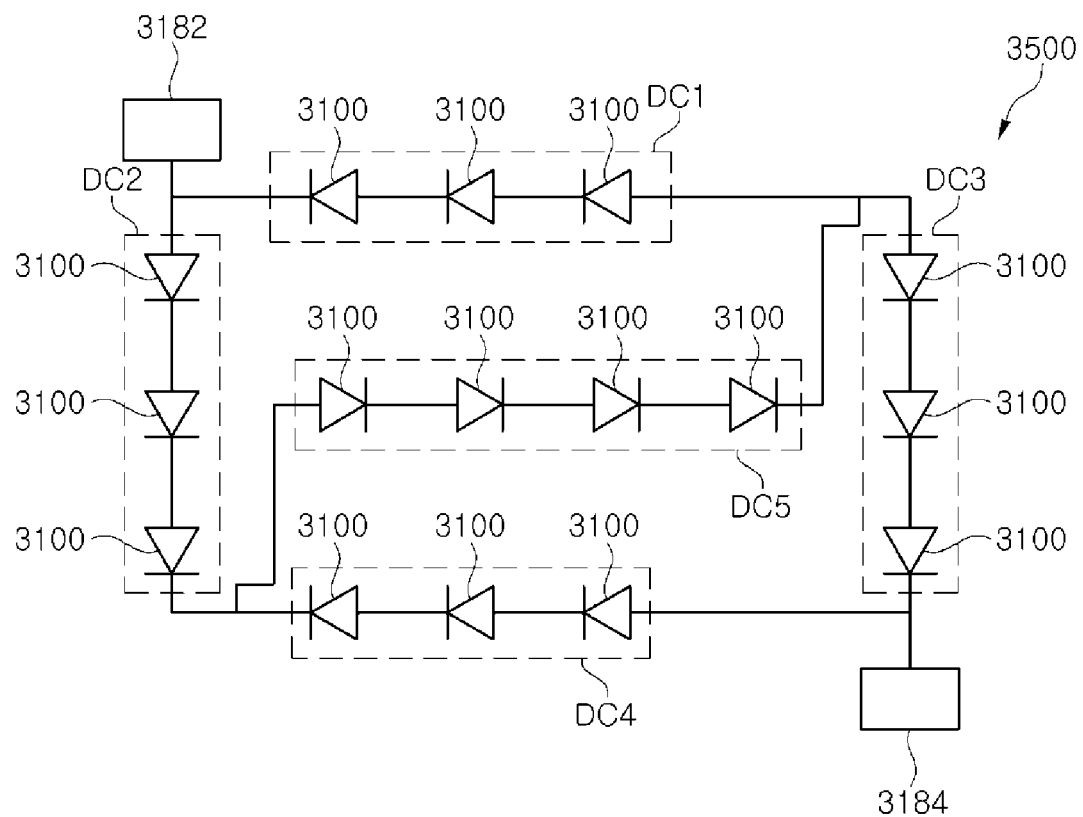

FIG. 18 is a plan view showing a light emitting diode package according to another exemplary embodiment of the present invention, and FIG. 19 is a circuit diagram of the light emitting diode package shown in FIG. 18.

Referring to FIG. 18 and FIG. 19, a light emitting diode package 3500 according to another exemplary embodiment of the present invention includes the plurality of light emitting packages 3100 according to another exemplary embodiment of the present invention, which were described with reference to FIG. 11 to FIG. 13, connected with one another and may thus be arranged in an n×n type but are connected with one another in parallel, for example, a partially parallel connection so as to use an AC power supply.

The light emitting diode package 3500 according to another exemplary embodiment of the present invention may be provided so that ⅔, that the nine light emitting diode packages 3100 among all of the light emitting diode packages emit light at all time when the AC power is applied through the first contact part 3182 and the second contact part 3184 if the light emitting diode package 3100 according to another exemplary embodiment of the present invention described with reference to FIG. 11 to FIG. 13 is provided in a 4×4 type.

That is, the light emitting diode package 3500 includes the first contact part 3182 connecting the second bump 3174 of the first light emitting diode package 3100 of the first column with the first bump 3172 of the first light emitting diode package 3100 of the second column and the second contact part 3184 connecting the second bump 3174 of the final light emitting diode package 3100 of the third column with the first bump 3172 of the final light emitting diode package 3100 of the fourth column.

Further, the light emitting diode package 3500 is connected with the first contact part 3182 and may include a first serial connection part DC1 connecting the first to third light emitting diode packages 3100 of the first column with one another in series.

The light emitting diode package 3500 is connected with the first contact part 3182 and may include a second serial connection part DC2 connecting the first light emitting diode packages 3100 of the second to fourth columns with one another in series.

The light emitting diode package 3500 is connected with the second contact part 3184 and may include a third serial connection part DC3 connecting the final light emitting diode packages 3100 of the first to third columns with one another in series.

The light emitting diode package 3500 is connected with the second contact part 3184 and may include a fourth serial connection part DC4 connecting the second to final light emitting diode packages 3100 of the fourth column with one another in series.

The light emitting diode package 3500 may include a fifth serial connection part DC5 connecting the third light emitting diode package 3100 of the second column, the third light emitting diode package 3100 of the third column, the second light emitting diode package 3100 of the second column, and the second light emitting diode package 3100 of the third column with one another in series.

As a result, in the light emitting diode package 3500, when the first serial connection part DC1 and the third serial connection part DC3 are reversely connected with each other, the second serial connection part DC2 and the fourth serial connection part DC4 are reversely connected with each other, the fifth serial connection part DC5 is connected between the first serial connection part DC1 and the third serial connection part DC3 and between the second serial connection part DC2 and the fourth serial connection part DC4 and thus, the AC power supply is connected between the first contact part 3182 and the second contact part 3184, the second, third, and fifth serial connection parts DC2, DC3, and DC5 may be light-emitted in any one half wave and the first, fourth, and fifth serial connection parts DC1, DC4, and DC5 may be light-emitted in the other one half wave.

FIG. 20 to FIG. 27 are cross-sectional views showing a method of manufacturing a light emitting diode package according to an exemplary embodiment of the present invention.

Figure 20:
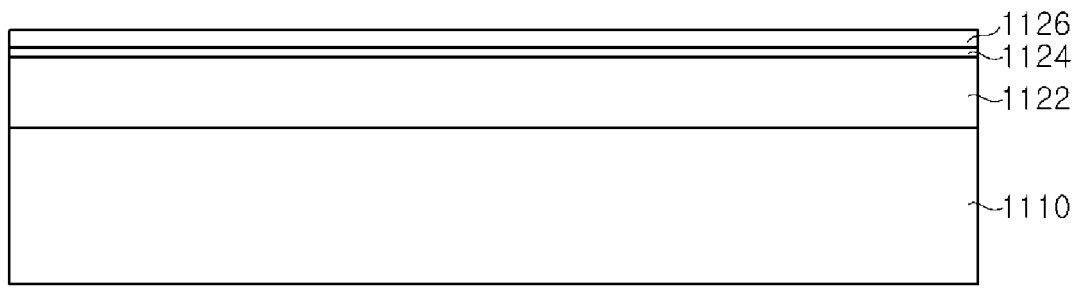
FIG. 20 to FIG. 27 are cross-sectional views showing a method of manufacturing a light emitting diode package according to an exemplary embodiment of the present invention.

Referring to FIG. 20, in a method of manufacturing a light emitting diode package according to an exemplary embodiment of the present invention, a substrate 1110 is first prepared.

In this case, the substrate 1110 may be a growth substrate. The growth substrate may be a sapphire substrate, a silicon carbide substrate, a silicon substrate, or the like. For example, the growth substrate may be a sapphire substrate. In this case, the other surface of the substrate 1110 may be a substrate on which the patterns or ruggedness such as a moth eye pattern (not shown), blast marks (not shown), or the like, are previously formed so as to increase the light emission efficiency.

Then, the plurality of semiconductor layers including the first type semiconductor layer 1122, the active layer 1124, and the second type semiconductor layer 1126 may be formed on the substrate 1110. In this case, a process of forming the buffer layer (not shown) between the substrate 1110 and the first type semiconductor layer 1122, the blocking layer (not shown) between the active layer 1124 and the second type semiconductor layer 1126, and the high-concentration doped second type semiconductor layer (not shown) on the second type semiconductor layer 1126 may further be performed.

The semiconductor layers may also be formed by the epitaxial growth and may be formed on the substrate 1110 by various forming methods, such as chemical vapor deposition, physical vapor deposition, or the like.

Figure 21:
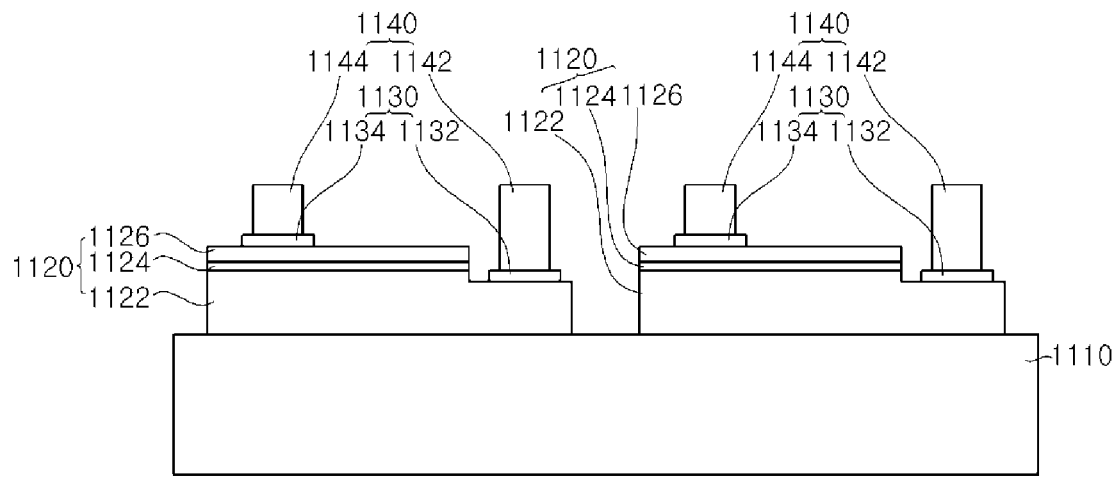

Referring to FIG. 21, the semiconductor structure layer 1120 including the first type semiconductor layer 1122, the active layer 1124, and the second type semiconductor layer 1126 is formed by etching the semiconductor layers formed on the substrate 1110 and at least one light emitting diode including the contact pads 1130 including the first contact pad 1132 and the second contact pad 1134 formed on the first type semiconductor layer 1122 and the second type semiconductor layer 1126, respectively, of the semiconductor structure layer 1120 and the bumps 1140 including the first bump 1142 and the second bump 1144 formed on the first contact pad 1132 and the second contact pad 1134, respectively, is formed.

That is, as described with reference to FIG. 20, after the semiconductor layers are formed on the substrate 1111, a mesa etching process exposing a portion of the first type semiconductor layer 1122 by etching a portion of the semiconductor layers, that is, at least second type semiconductor layer 1126 and the active layer 1124 and a process of segmenting and etching a semiconductor layer including the second type semiconductor layer 1126, the active layer 1124, and the first type semiconductor layer 1122 are performed to form the plurality of semiconductor structure layer 1120 on the substrate 1110. Further, the light emitting diode is manufactured by forming the contact pads 1130 and the bumps 1140 on the semiconductor structure layers 1120, respectively.

In this case, the bumps 1140 may be formed in various forms. That is, the bumps 1140 may be formed in a stud bump and may also be formed by the evaporation and etching processes using a mask, or the like, or may be formed using a plating method.

Meanwhile, the method of manufacturing a light emitting diode according to the exemplary embodiment of the present invention shows that the first bump 1142 and the second bump 1144 are formed on the first contact pad 1132 and the second contact pad 1134, respectively, in forming the bumps 1140 and is mainly described with reference thereto. As described with reference to FIG. 4 and FIG. 5, the plurality of first bumps 1142 and the plurality of second bumps 1144 may be formed on the first contact pad 1132 and the second contact pad 1134, respectively.

In this case, the method of manufacturing a light emitting diode described with reference to FIG. 20 and FIG. 21 is only an example and may also be manufactured by other methods in addition to the above-mentioned method, that is, the known various methods.

Figure 22:
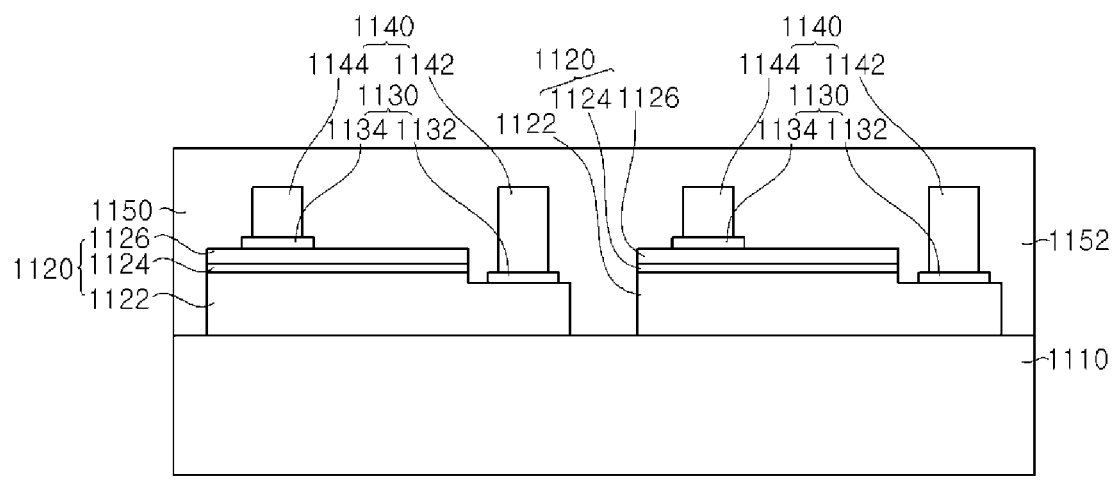

Describing with reference to FIG. 22, an insulating material layer 1152 is formed on the substrate 1110 on which the light emitting diode is formed. In this case, the insulating material layer 1152 may be formed by forming the insulating material on the substrate 1110. The insulating material layer 1152 may be made of an inorganic material such as a silicon-based oxide, silicon-based nitride, or the like, or may be made of material organic material such as resin, or the like. The insulating material layer 1152 may be formed by using a deposition method such as using the chemical vapor deposition, the physical vapor deposition, or the like, and a coating method such as spin coating, or the like.

In this case, the insulating material layer 1152 is formed to completely cover at least the semiconductor structure layer 1120, for example, the surface of the substrate 1110, that is, completely cover the semiconductor structure layer 1120 and the bumps 1140, as shown in FIG. 22.

Figure 23:
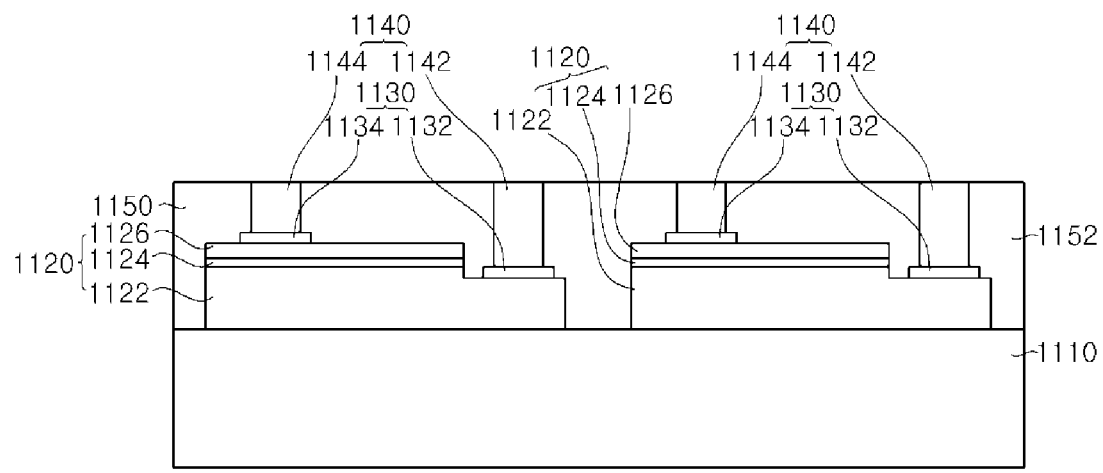

Referring to FIG. 23, the insulating material layer 1152 is planarized by a chemical mechanical polishing (CMP) process so as to expose a portion of the bumps 1140 to form the protective layer 1150. In this case, the insulating material layer 1152 is planarized by various methods, such as the CMP process, a lapping, or the like, to form the protective layer 1150 from which the bumps 1140 are exposed.

In addition, when the insulating material layer 1152 is formed, the thickness of the insulating material layer 1152 is sufficiently controlled and formed to cover the bumps 1140 and then, the protective layer 1150 from which the bumps 1140 are exposed may be formed by performing the etching process exposing the bumps 1140 using the mask without the planarization process.

Figure 24:
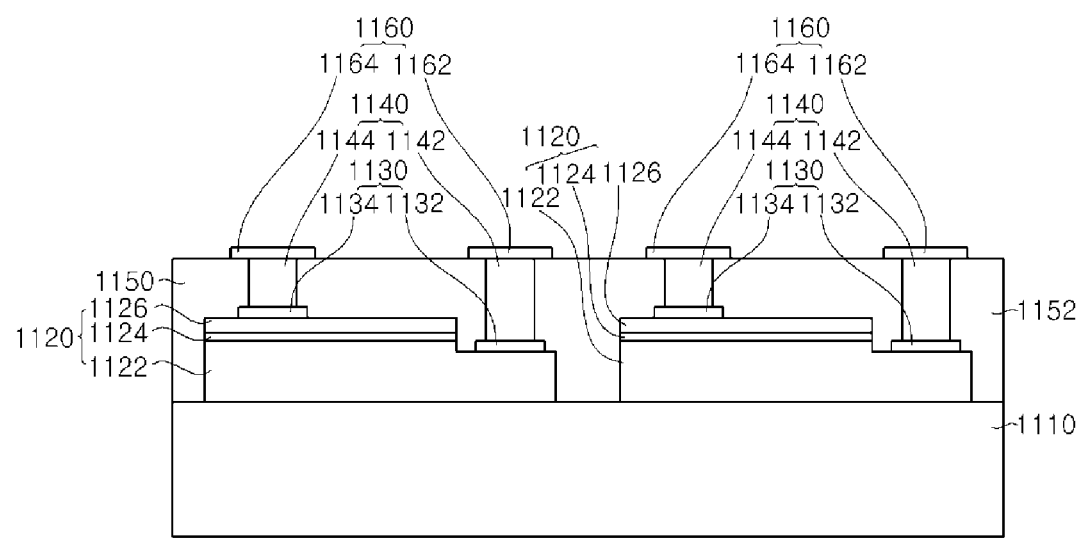

Referring to FIG. 24, the bump pads 1160 may be formed on the protective layer 1150 from which the bumps 1140 are exposed. In this case, although not shown in FIG. 24, a process of forming the current spreading layers 1190 may be performed prior to forming the bump pads 1160.

The bump pads 1160 may be formed by depositing through the chemical vapor deposition, the physical vapor deposition, or the like, and patterning, and may be formed by using the plating method, or the like. In this case, although forming the bump pads 116 according to the method of manufacturing a light emitting diode according to the exemplary embodiment of the present invention is described as forming the bump pads 1160 described with reference to FIG. 1, the bump pads having a relatively large size similar to the bump pads 1160 described with reference to FIG. 2 and FIG. 3 may be formed.

In this case, the method of manufacturing a light emitting diode according to the exemplary embodiment of the present invention is described based on the form in which the single light emitting diode package 1100 as described with reference to FIG. 20 to FIG. 27 includes the single light emitting diode formed on the substrate 1110 but the plurality of light emitting diodes may be formed on the substrate 1110 and the light emitting diodes may be manufactured in a form in which they are arrayed in series or in parallel.

That is, the method of manufacturing a light emitting diode according to the exemplary embodiment of the present invention by forming the first bump pad 1162 and the second bump pad 1164 on the first bump 1142 and the second bump 1144 on the substrate 1110 and then, segmenting the substrate 1110 in the following processes is shown and described as shown in FIG. 24. However, the light emitting diode package is manufactured by forming the plurality of light emitting diodes on the substrate 1110 and connecting the first bump 1142 and the second bump 1144 of the adjacent light emitting diodes with each other by the single bump pad or the current spreading layer to connect the two light emitting diodes in series or in parallel. Thereafter, the light emitting diode package in which the plurality of light emitting diodes are arrayed on the single substrate 1110 may be manufactured by segmenting the substrate 1110 so as to dispose the plurality of light emitting diodes on the single substrate 1110 during the process of segmenting the substrate described with reference to FIG. 27.

Figure 25:
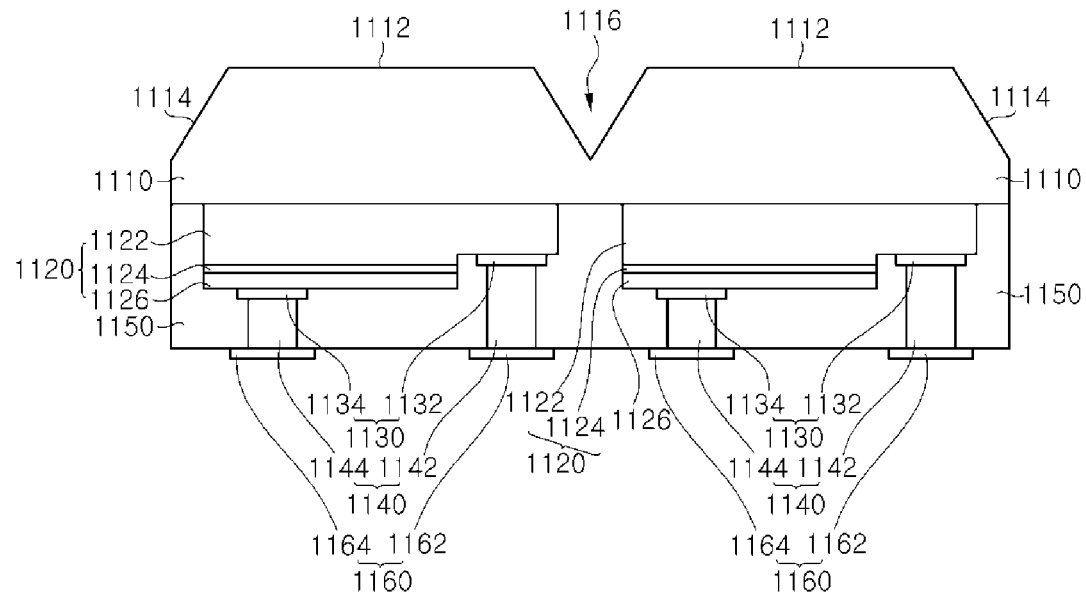

Referring to FIG. 25, after the bump pads 1160 is formed on the surface of the substrate 1110, a V groove 1116 segmenting the substrate 1110 is formed in a certain region of the other surface 1112 of the substrate 1110 by using laser or blast and the corner of the other surface 1112 of the substrate 1110 may be provided with the lateral inclination 1114.

In this case, the blast may be a sand blast. When the other surface 1112 of the substrate 1110 is not previously provided with the patterns or the ruggedness such as the above-mentioned moth eye pattern (not shown), the blast marks (not shown), or the like, in order to increase the light emission efficiency, the patterns or ruggedness such as the moth eye pattern (not shown), the blast marks (not shown), or the like, may be formed by using the laser or the blast during the process of forming the V groove 1116 to increase the light emission efficiency. In this case, when the light emitting diode package manufactured by the method of manufacturing a light emitting diode according to the exemplary embodiment of the present invention does not need to include the lateral inclination 1114, the present process may be omitted.

Figure 26:
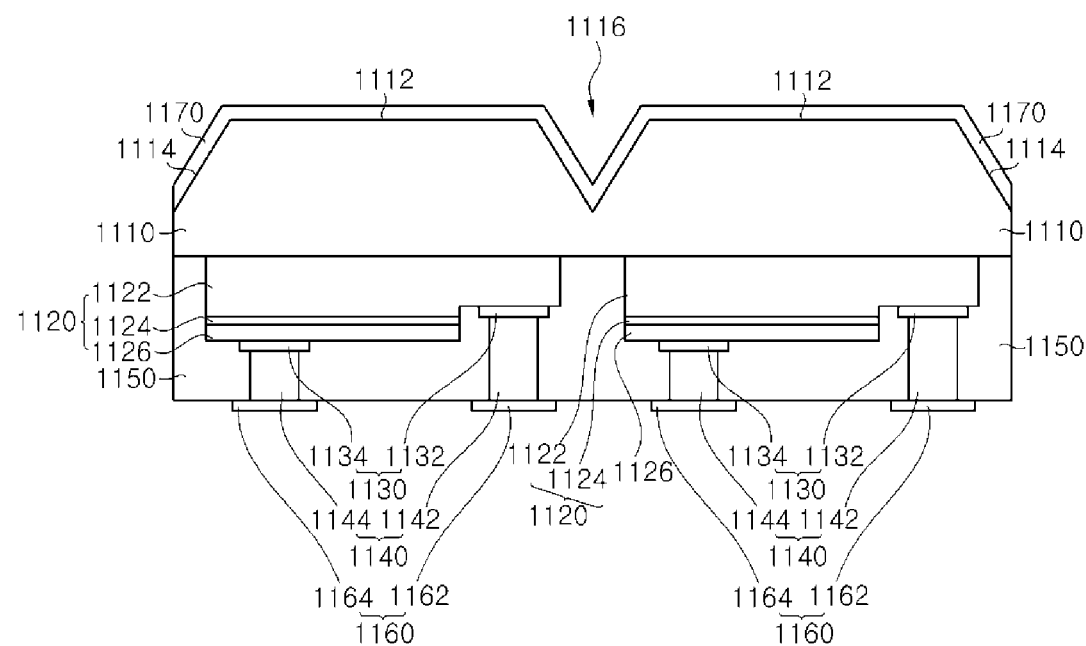

Referring to FIG. 26, the phosphor layer 1170 is formed on the other surface 1112 of the substrate 1110, for example, the other surface 1112 of the substrate 1110 and on the lateral inclination 1114 and the V groove 1116. The phosphor layer 1170 may be formed by conformal coating. In this case, when the light emitting diode package manufactured by the method of manufacturing a light emitting diode according to the exemplary embodiment of the present invention does not need to include the phosphor layer 1170, the present process may be omitted.

Figure 27:
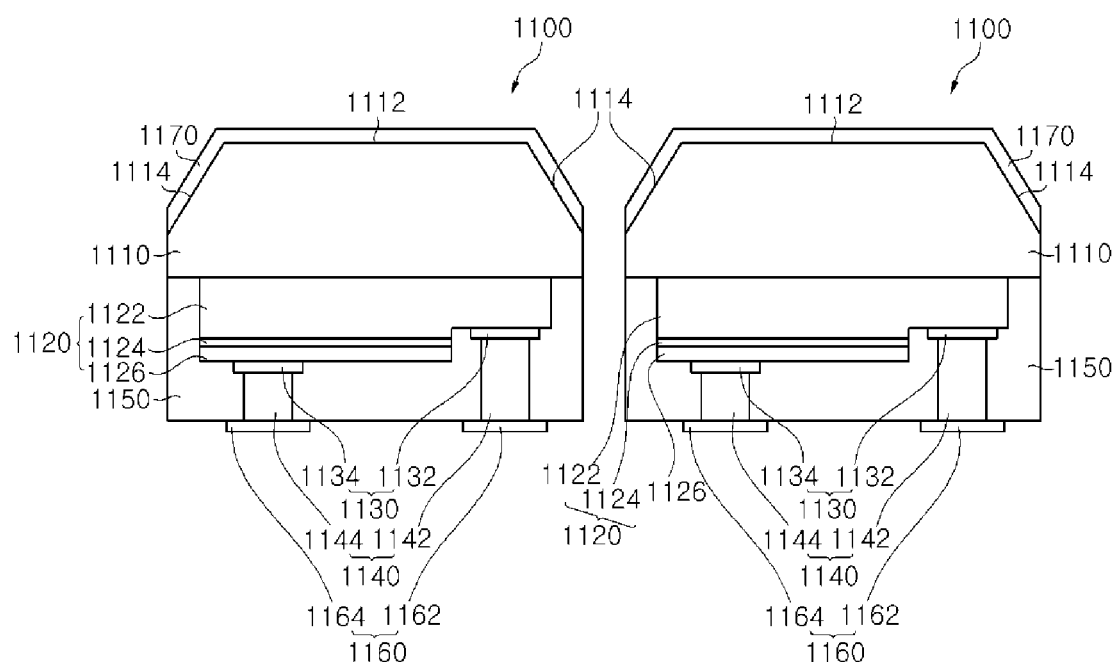

Referring to FIG. 27, the light emitting diode package 1100 is manufactured by performing the process of segmenting the substrate 1110.

In this case, when the other surface of the substrate 1110 is formed with the V groove 1116, the substrate 1110 is segmented based on the V groove 1116 and the V groove 1116 becomes the lateral inclination 1114.

Meanwhile, the internal processing laser beam is irradiated to the inside of the substrate 1110 along a virtual segmentation line for segmenting the substrate 1110 during the process of segmenting the substrate 1110, thereby facilitating the segmentation of the substrate 1110.

Meanwhile, when the other surface of the substrate 1110 is not provided with the V groove 1116, the light emitting diode package 1100 may be manufactured by segmenting the substrate 1110 using a general scribing process.

FIG. 28 to FIG. 38 are cross-sectional views showing a method of manufacturing a light emitting diode package according to an exemplary embodiment of the present invention.

Figure 28:
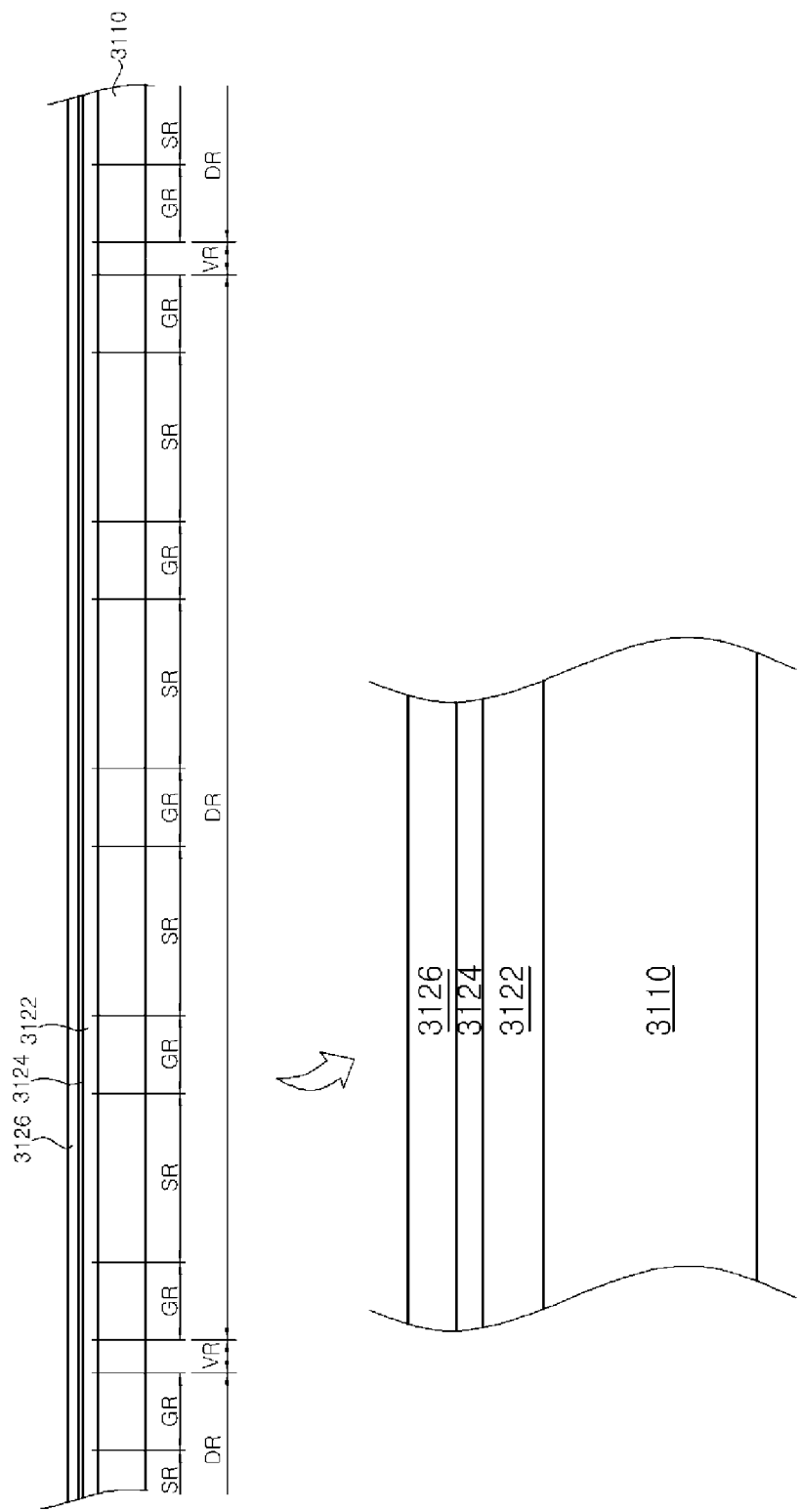
FIG. 28 to FIG. 38 are cross-sectional views showing a method of manufacturing a light emitting diode package according to an exemplary embodiment of the present invention.

Referring to FIG. 28, in a method of manufacturing a light emitting diode package according to another exemplary embodiment of the present invention, a substrate 3110 is first prepared.

In this case, the method of manufacturing a light emitting diode package according to another exemplary embodiment of the present invention is described based on a method of manufacturing the light emitting diode 3100 according to another exemplary embodiment of the present invention described with reference to FIG. 11 to FIG. 13, but the light emitting diode package 3200 according to another exemplary embodiment of the present invention described with reference to FIG. 14, the light emitting diode package 3300 according to another exemplary embodiment of the present invention described with reference to FIG. 15, the method of manufacturing the light emitting diode package 3400 according to another exemplary embodiment of the present invention described with reference to FIG. 16 and FIG. 17, and the method of manufacturing a light emitting diode 3500 according to another exemplary embodiment of the present invention described with reference to FIG. 18 and FIG. 19 may be applied.

Figure 38:
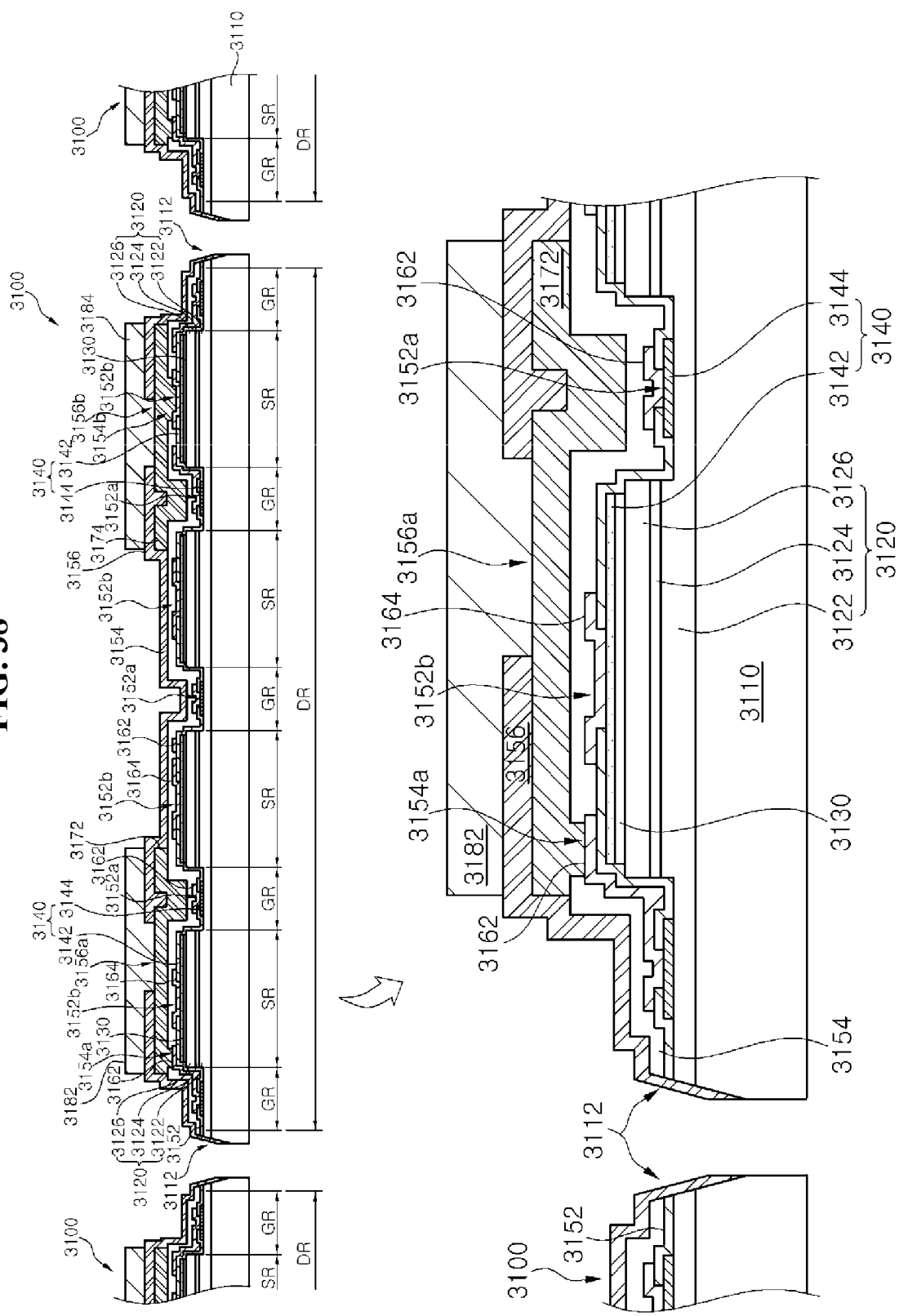

The growth substrate 3110 may be defined by a diode region DR and a vertical region (VR) as shown in FIG. 38. In this case, the diode region DR may be a region in which the light emitting diode package 3100 is formed and the vertical region VR may be a region for segmenting the plurality of light emitting diode package 3100 formed on the growth substrate 3110.

Meanwhile, the diode region DR may include structure regions SRs and gap regions GRs.

The first type semiconductor layer 3122, the active layer 3124, and the second type semiconductor layer 3126 are sequentially formed on the surface of the growth substrate 3110 on which the regions are defined.

In this case, the first type semiconductor layer 3122, the active layer 3124, and the second type semiconductor layer 3126 may be consecutively formed by the epitaxial growth.

Figure 29:
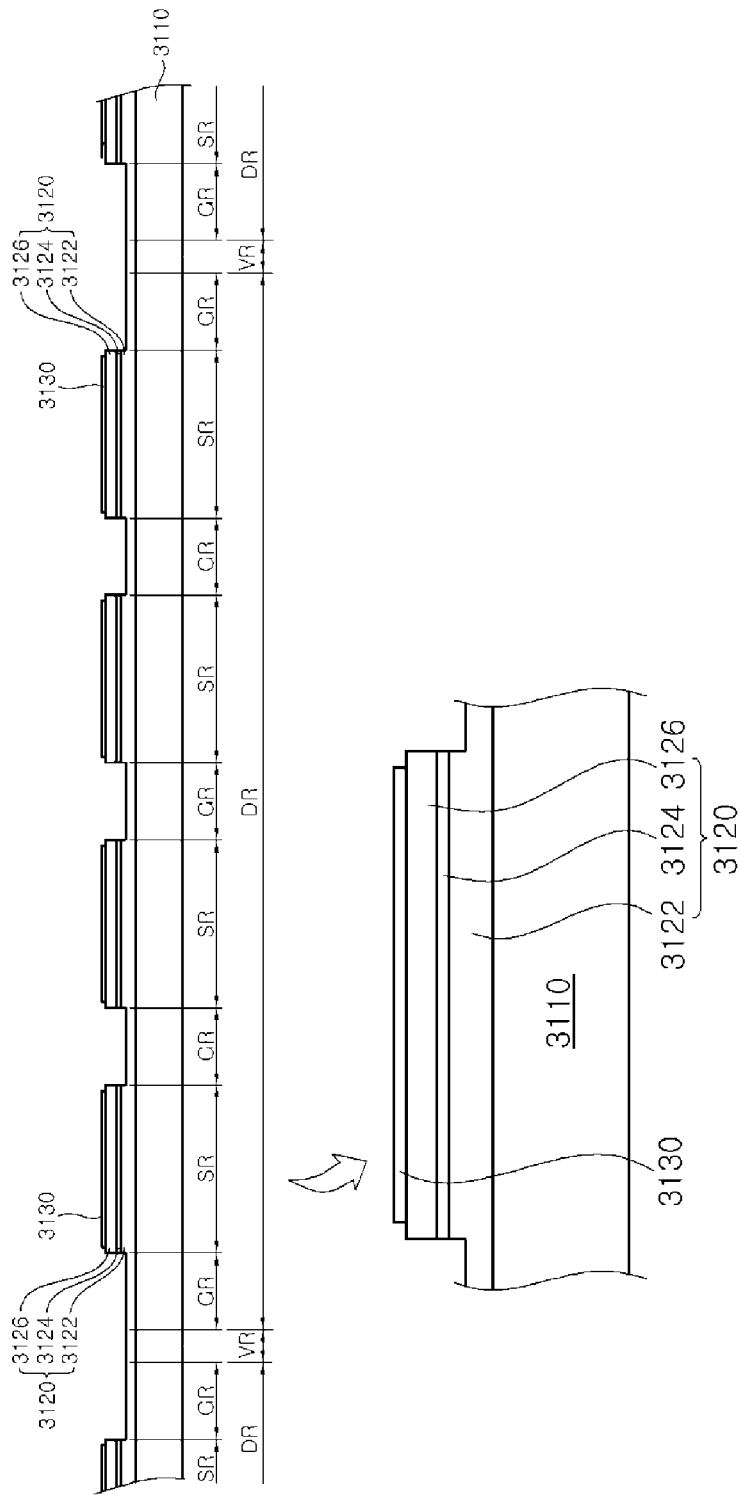

Referring to FIG. 29, the semiconductor structure layer 3120 including the first type semiconductor layer 3122, the active layer 3124, and the second type semiconductor layer 3126 is formed within the structure regions SRs by performing the mesa etching on the active layer 3124 and the second type semiconductor layer 3126 of the growth substrate 3110.

Meanwhile, the ohmic contact layer 3130 may be formed on the semiconductor structure layer 3120. In this case, the ohmic contact layer 3130 may be formed by the separate process after performing the mesa etching forming the semiconductor structure layer 3120.

In addition, the ohmic contact layer 3130 may also be formed by forming an ohmic contact formation layer on the second type semiconductor layer 3126 prior to the process of etching mesa, that is, prior to forming the semiconductor structure layer 3120 through the mesa etching process, first etching the ohmic contact formation layer, and then, forming the process of forming the semiconductor structure layer 3120. In this case, the ohmic contact layer 3130 may be formed by using a mask pattern for performing the mesa etching process.

Figure 30:
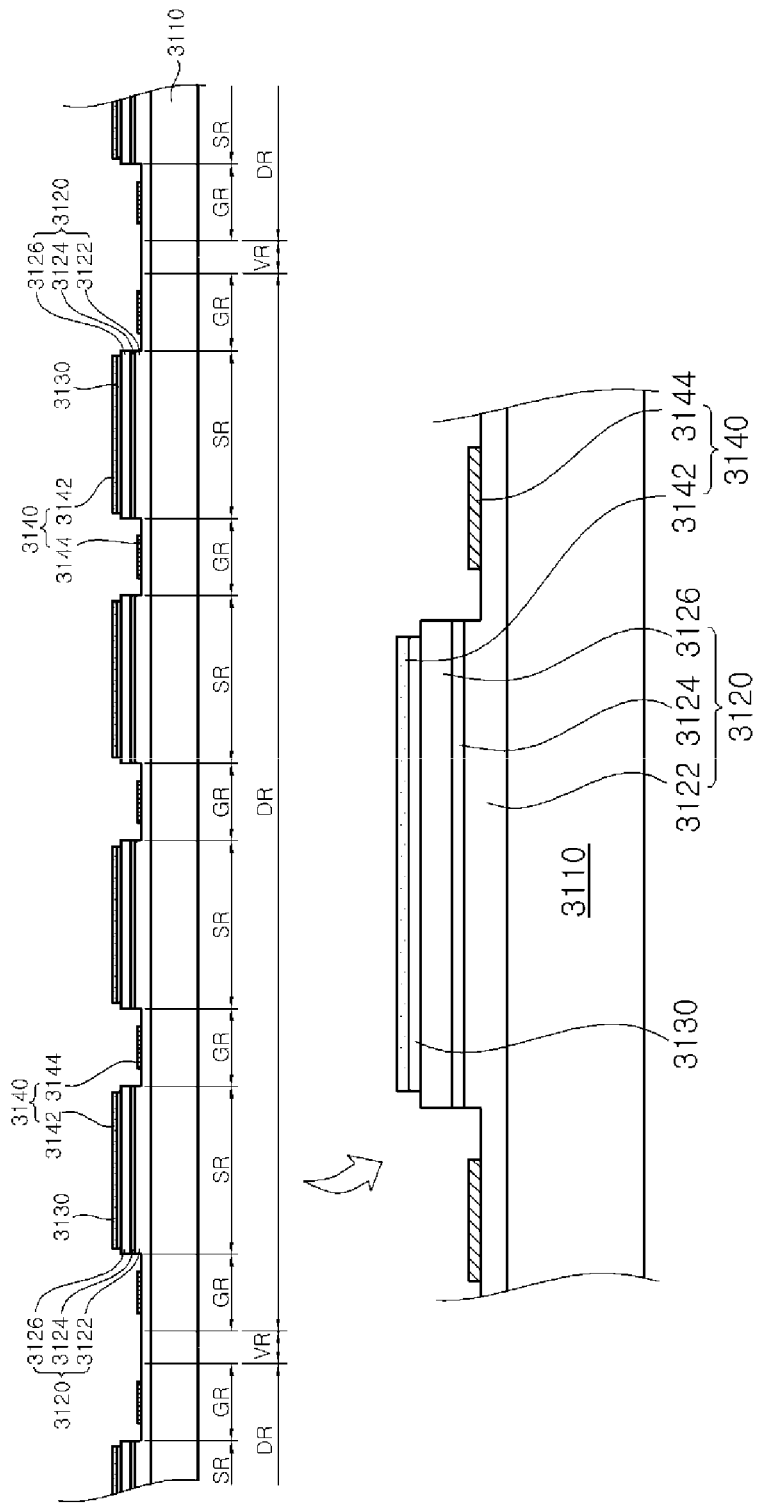

Referring to FIG. 30, the plurality of first pads 3142 and second pads 3144 are each formed on the growth substrate 3110 on which the plurality of semiconductor structure layers 3120 are formed.

In this case, the first pads 3142 are formed on the certain regions on the gap region GR within the diode region DR. The first pads 3142 are disposed on the gap regions GR and are disposed on the certain regions of the first type semiconductor layer 3122 through mesa etching to form the semiconductor structure layer 3120.

The second pads 3144 are disposed on the ohmic contact layers 3130.

In this case, the first pads 3142 and the second pads 3144 may also be formed by performing the patterning process after forming the pad forming material layer on the growth substrate 3110 on which the semiconductor structure layer 3120 is formed and may be formed by first forming the mask pattern including the openings corresponding to the first pads 3142 and the second pads 3144 on the growth substrate 3110 on which the semiconductor structure layer 3120 is formed, forming the pad forming material layer, and then, lifting off the mask pattern.

Figure 31:
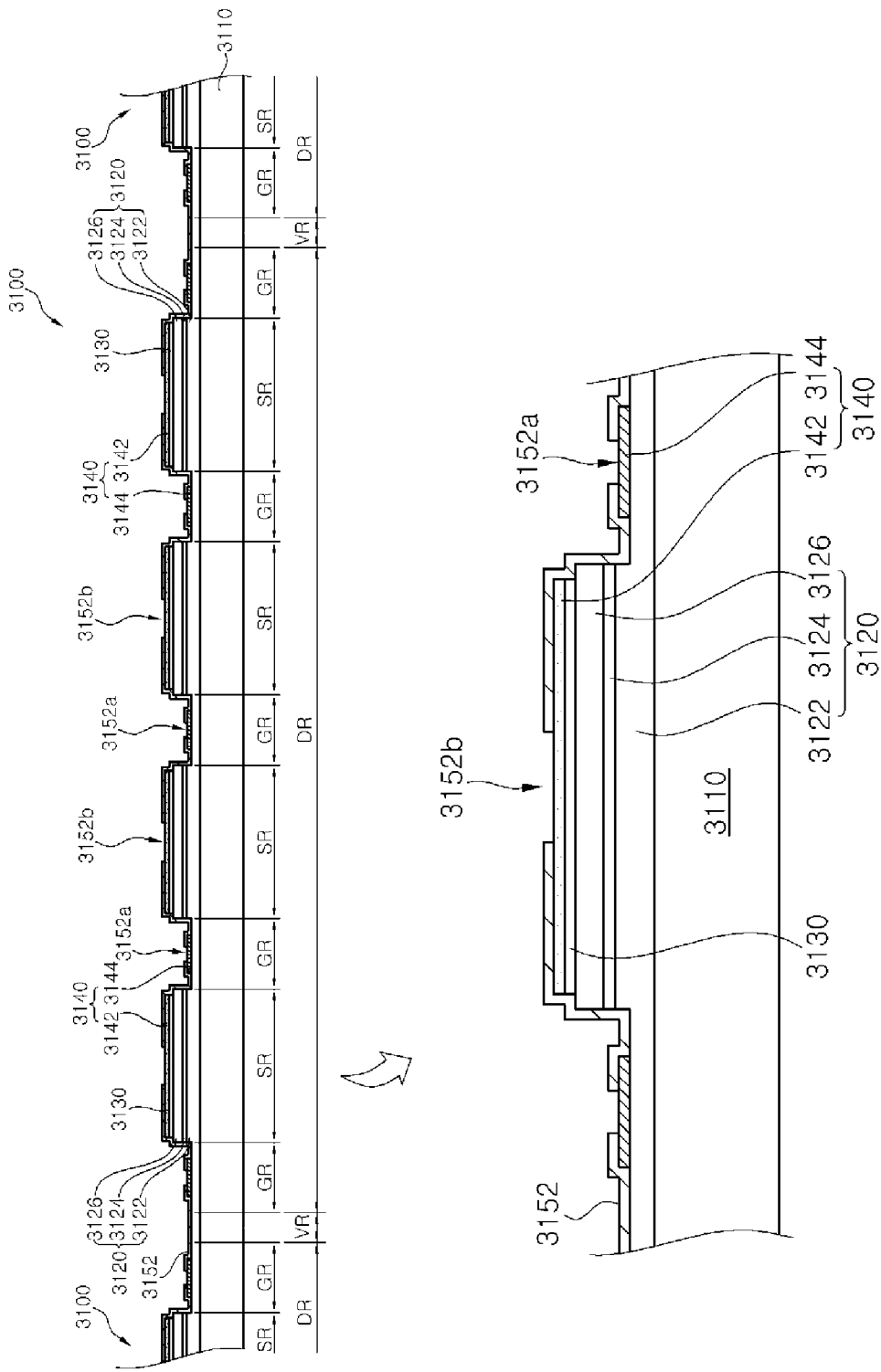

Referring to FIG. 31, a first insulating layer 3152 is formed on the growth substrate 3110 on which the first pads 3142 and the second pads 3144 are formed.

In this case, the first insulating layer 3152 includes the openings 3152a and 3152b that partially open regions of the first pads 3142 and the second pads 3144, respectively.

Figure 32:
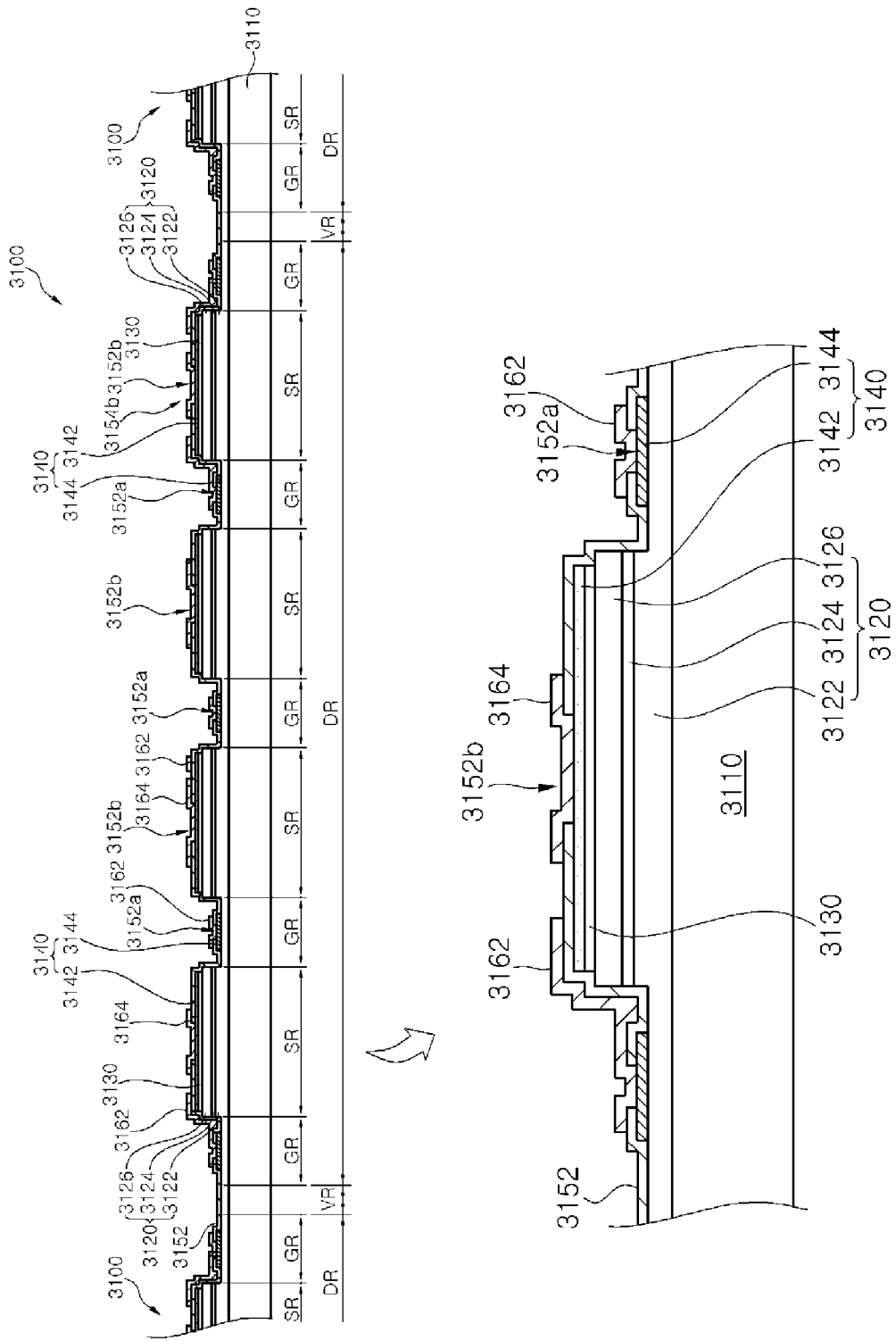

Referring to FIG. 32, the plurality of first connection wirings 3162 and second connection wirings 3164 are each formed on the growth substrate 3110 on which the first insulating layer 3152 is formed.

In this case, the first connection wiring 3162 is formed by electrically connecting the first pads 3142 exposed by the openings 3152a of the first insulating layer 3152 to one another and the second connection wiring 3164 may be formed to electrically connect the second pads 3144 exposed by the openings 3152b of the first insulating layer 3152 to one another.

In this case, the first connection wiring 3162 and the second connection wiring 3164 may each be formed within the diode region DR as described with reference to FIG. 12 or 13.

In this case, the first connection wirings 3162 and the second connection wirings 3164 may be formed by performing the patterning process after forming the connection wiring forming material layer on the growth substrate 3110 on which the first insulating layer 3152 is formed and may be formed by first forming a mask pattern including the openings corresponding to the first connection wirings 3162 and the second connection wirings 3164 on the growth substrate 3110 on which the first insulating layer 3152 is formed, the connection wiring forming material layer, and then, lifting-off the mask pattern.

Figure 33:
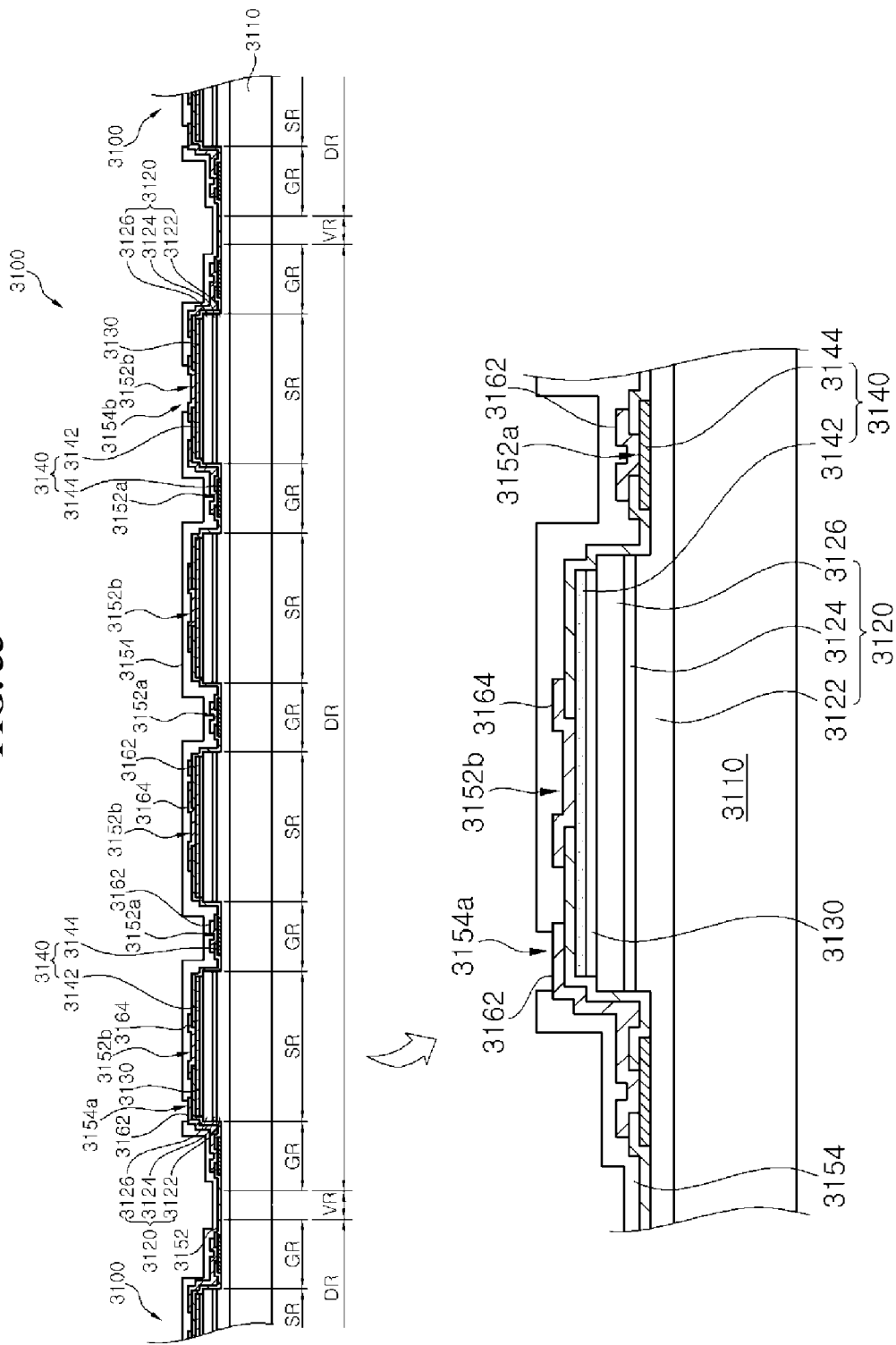

Referring to FIG. 33, the second insulating layer 3154 is formed on the growth substrate 3110 on the first connection wiring 3162 and the second connection wiring 3164 are formed.

In this case, the second insulating layer 3154 includes the openings 3154a and 3154b that partially open regions of the first connection wiring 3162 and the second connection wiring 3164, respectively.

Figure 34:
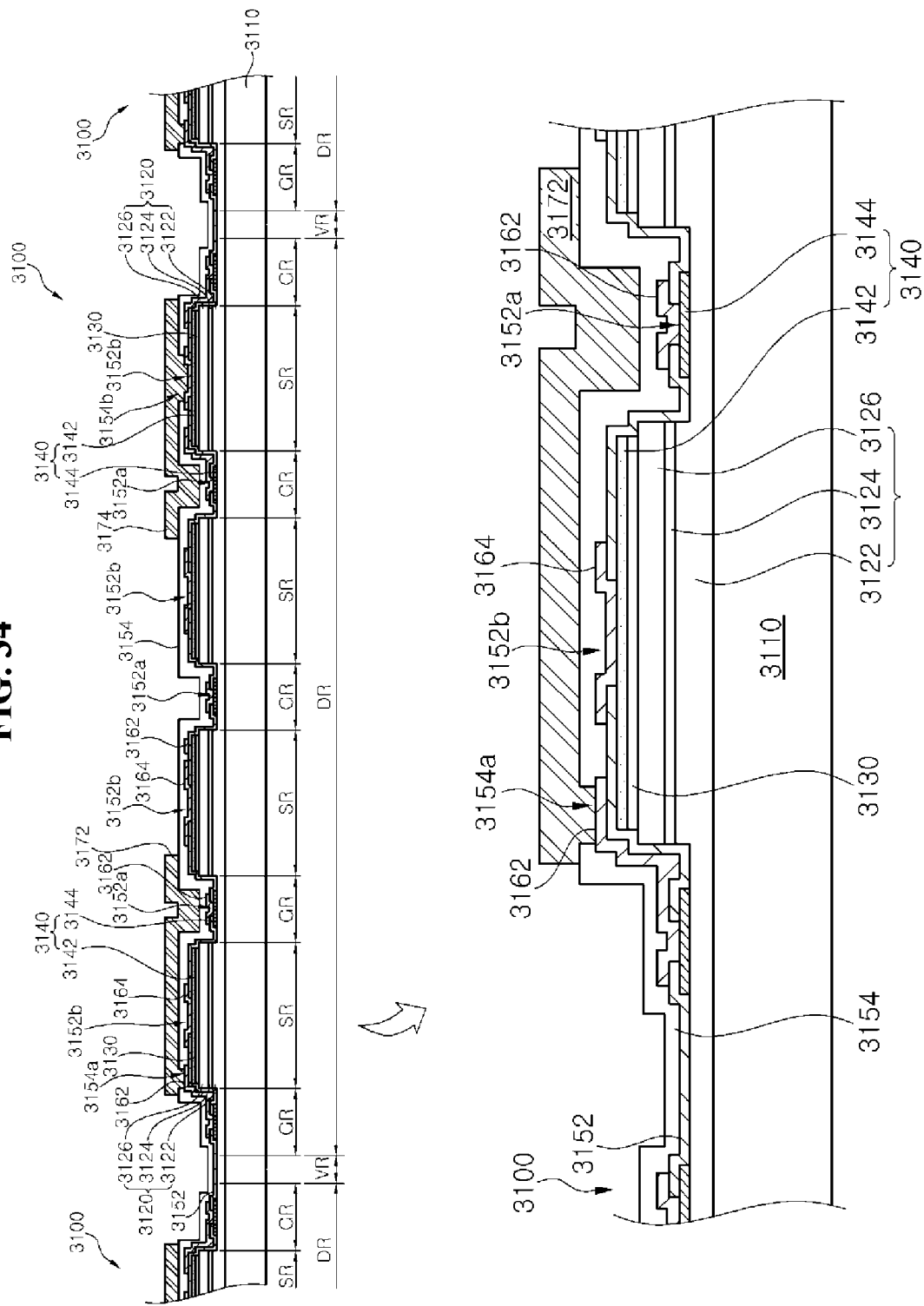

Referring to FIG. 34, the plurality of first bumps 3172 and the plurality of second bumps 3174 are each formed on the growth substrate 3110 on which the second insulating layer 3154 is formed.

In this case, the first bump 3172 may be formed by electrically connect to the first connection wirings 3162 exposed by the openings 3154a of the second insulating layer 3154 and the second bump 3174 may be formed to electrically connect to the second connection wiring 3164 exposed by the openings 3154b of the second insulating layer 3154.

In this case, the first bump 3172 and the second bump 3174 may be formed by performing the patterning process after forming the bump forming material layer on the growth substrate 3110 on which the second insulating layer 3154 is formed and may be formed by first forming the openings corresponding to the first bump 3172 and the second bump 3174 on the growth substrate 3110 on which the second insulating layer 3154 is formed, the bump forming material layer, and then, lifting-off the mask pattern.

In this case, the light emitting diode packages 3200, 3300, 3400, and 3500 described with reference to FIG. 14 to FIG. 19 may also be formed by forming the first bump 3172' and the second bump 3174' described with reference to FIG. 14 to FIG. 19, that is, the first bump 3172' and the second bump 3174' modified to each connect between the first bump 3172 and the second bump 3174 of the adjacent light emitting diode packages 3100 or between the first bump 3172 and the second bump 3174 of the light emitting diode package 3100 on the lower column or the upper column.

Figure 35:
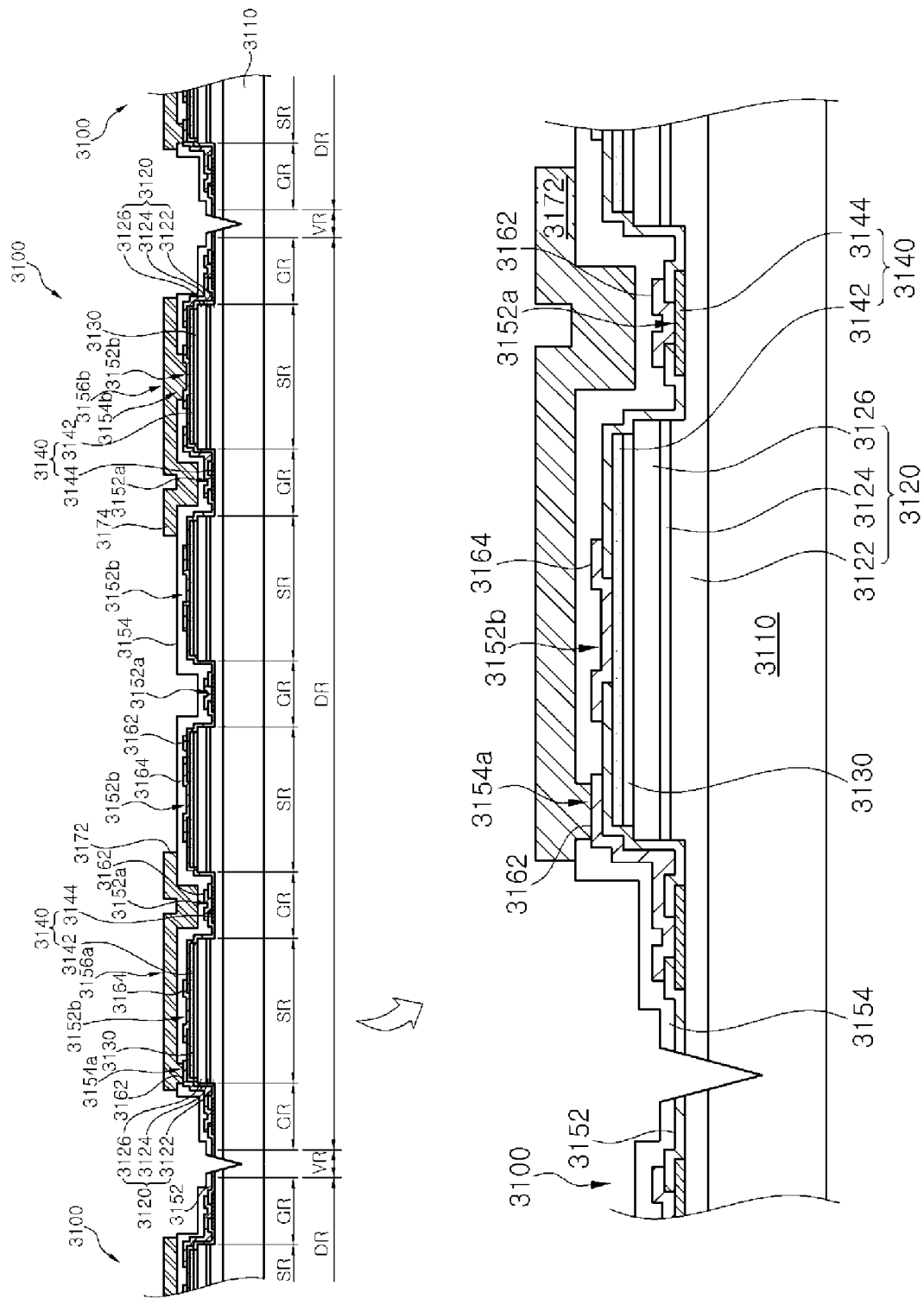

Referring to FIG. 35, the first type semiconductor layer 3122, the first insulating layer 3152, the second insulating layer 3154, and the growth substrate 3110 are simultaneously etched so that each light emitting diode packages 3100, 3200, 3300, 3400, and 3500 are separated in the certain region of the growth substrate 3110, for example, the vertical regions VRs of the growth substrate 3110, thereby performing V cut etching forming V cuts in the vertical regions VRs.

The V cut etching forms the lateral inclinations 3112 at the edges of the growth substrate 3110 of the light emitting diode packages 3100, 3200, 3300, 3400, and 3500. In this case, the V cuts may be formed by forming a V-shaped groove by a certain depth from the surface of the growth substrate 3110, that is, a certain thickness therefrom.

In this case, the method of manufacturing a light emitting diode package 3100 performing only the V cut etching that simultaneously etches the first type semiconductor layer 3122, the first insulating layer 3152, the second insulating layer 3154, and the growth substrate 3110 all the vertical regions VRs will be described with reference to FIG. 35, but the segmentation etching is performed in any vertical regions VRs (that is, shown by a partition region PR in FIG. 39 to FIG. 41) of the vertical regions VRs and the V cut etching is performed in the remaining vertical regions VRs, thereby forming the light emitting diode packages 3200, 3300, 3400, and 3500 including the plurality of light emitting diode packages 3100 (which will be described in detail with reference to FIG. 39 to FIG. 41). In this case, the vertical region VR in which the segmentation etching is performed may be the vertical region VR which is disposed in the light emitting diode packages 3200, 3300, 3400, and 3500, wherein the segmentation etching may be the etching that etches and segments at least the first type semiconductor layer 3122.

Figure 36:
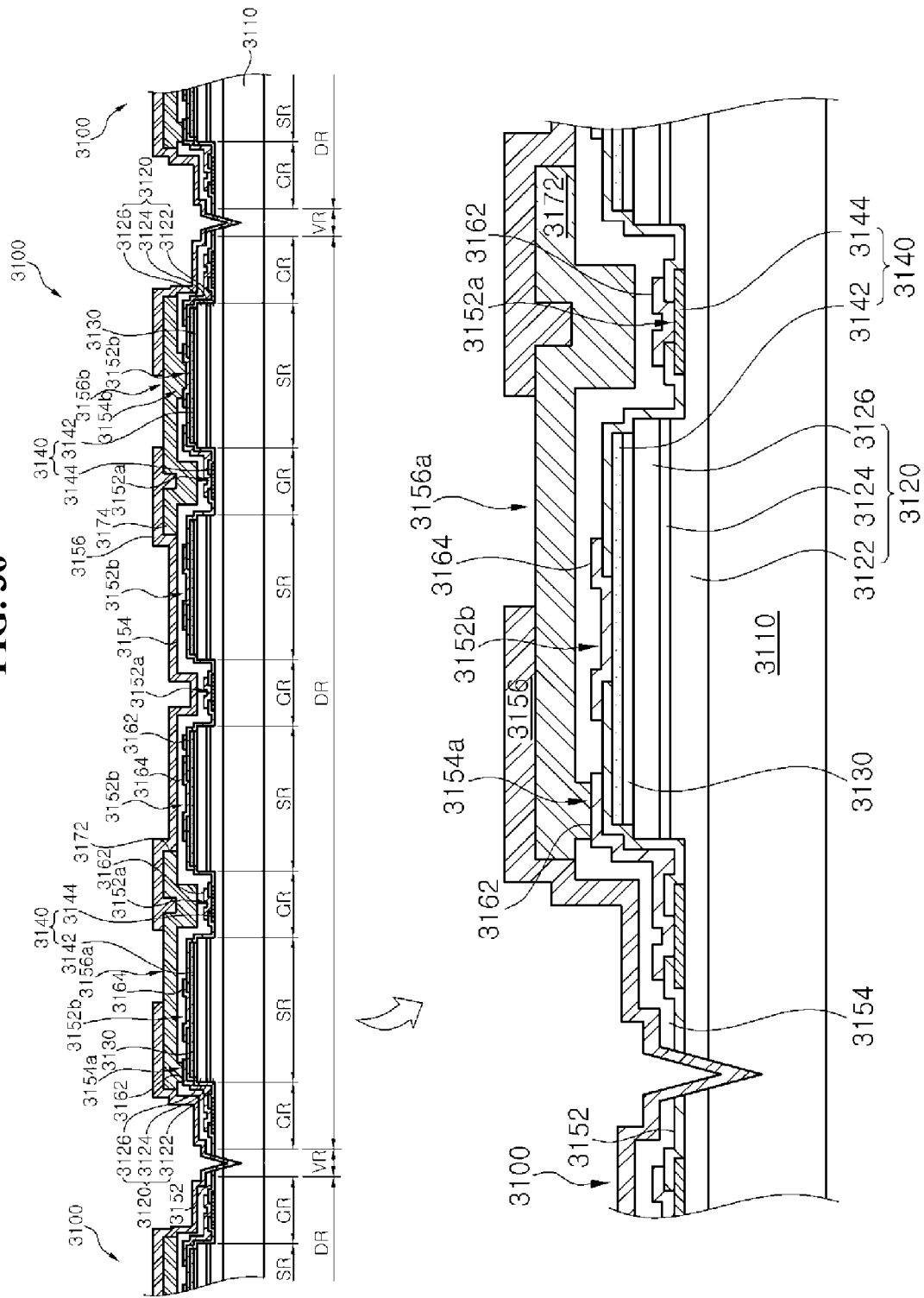

Referring to FIG. 36, the third insulating layer 3156 is formed on the growth substrate 3110 on which the first bumps 3172 and the second bumps 3174 are formed.

The third insulating layer 3156 includes the openings 3156a and 3156b that partially open the regions of the first bump 3172 and the second bump 3174, respectively.

In this case, the third insulating layer 3156 may be formed to cover the surface of the growth substrate 3110 exposed due to the segmentation etching or the V-shaped grooves of the growth substrate exposed by the V cut etching as well as the sides of the first insulating layer 3152 and the second insulating layer 3154, or the like.

Figure 37:
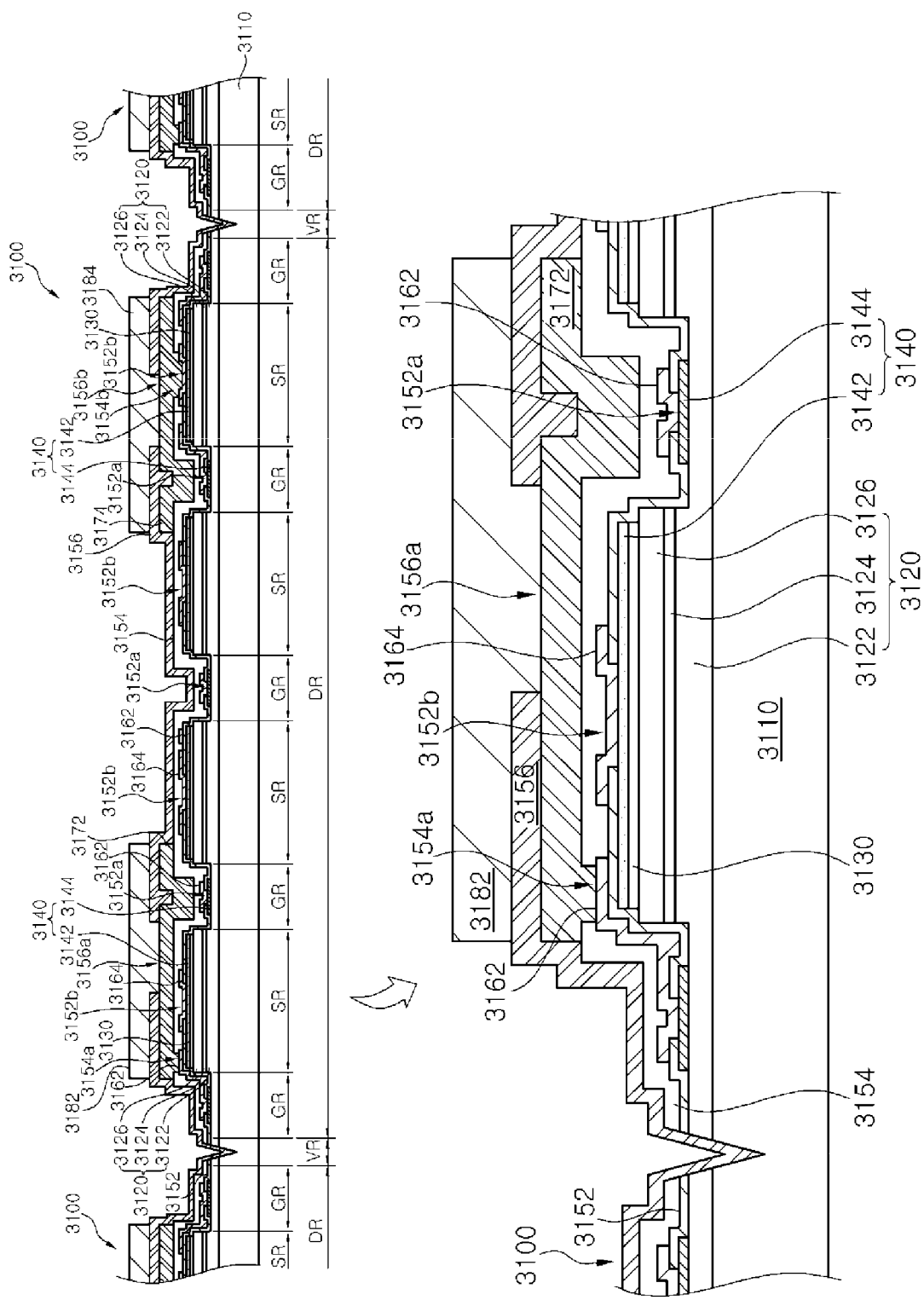

Referring to FIG. 37, the first contact part 3182 and the second contact part 3184 are formed on the growth substrate 3110 on which the third insulating layer 3156 is formed.

In this case, the first contact part 3182 is formed to electrically connect to the first bump 3172 exposed by the opening 3156a of the third insulating layer 3156 and the second contact part 3184 may be formed to electrically connect to the second bump 3174 exposed by the opening 3156b of the third insulating layer 3156.

In this case, the first contact part 3182 and the second contact part 3184 may be formed by performing the patterning process after forming the contact forming material layer on the growth substrate 3110 on which the third insulating layer 3156 is formed and may be formed by first forming the mask pattern including the openings corresponding to the first contact part 3182 and the second contact part 3184 on the growth substrate 3110 on which the third insulating layer 3156 is formed, forming the contact material layer, and then, lifting-off the mask pattern.

Referring to FIG. 38, the light emitting diode package 3100 according to another exemplary embodiment of the present invention may be manufactured by segmenting the growth substrate 3110 by using the vertical region VR of the growth substrate 3110 on which the first contact part 3182 and the second contact part 3184 are formed, in particular, the vertical regions VRs in which the V-shaped groove is formed on the growth substrate 3110 by the V cut etching.

In this case, a portion of the V-shaped groove formed by the V cut etching forms the lateral inclinations 3112 at the edges of the growth substrate 3110.

Meanwhile, the method of forming a light emitting diode package 3100 segmenting the growth substrate 3110 forming the first contact part 3182 and the second contact part 3184 is described with reference to FIG. 38 and the light emitting diode package in which the first bump 3172 and the second bump 3174 are exposed by forming the first bump 3172 and the second bump 3174 on the growth substrate 3110, performing the V cut etching, and directly performing the segmentation as described with reference to FIG. 35 may be formed.

Figure 39:
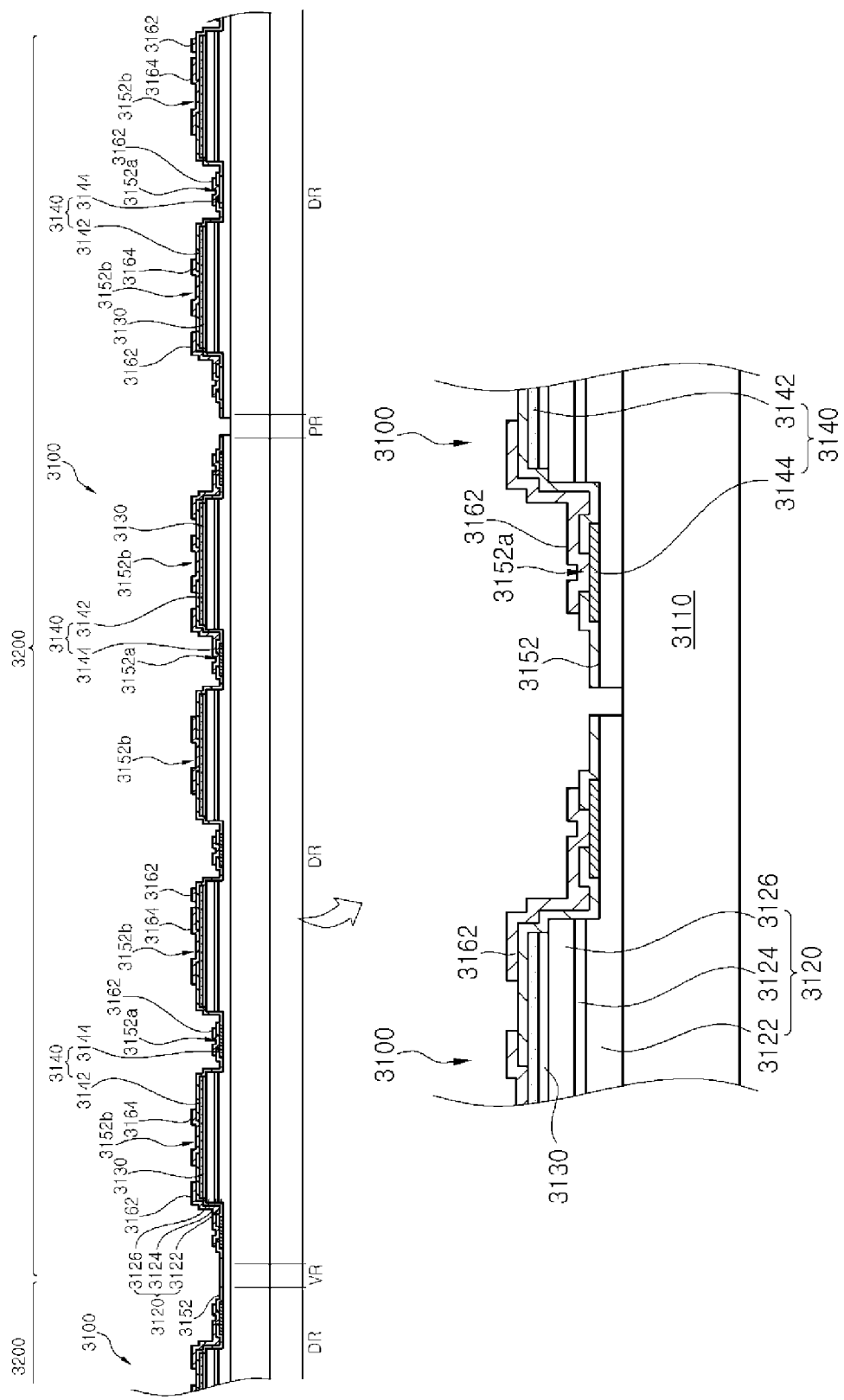

FIG. 39 to FIG. 41 are cross-sectional views showing a method of manufacturing a light emitting diode package according to an exemplary embodiment of the present invention. In this case, FIG. 39 to FIG. 41 show a cross section of a half of the light emitting diode package 3200 according to another exemplary embodiment of the present invention described with reference to FIG. 14, that is, a cross section taken along line F-F' shown in FIG. 14.

Referring to FIG. 39, in a method of manufacturing a light emitting diode package according to another exemplary embodiment of the present invention, the growth substrate 3110 is first prepared.

In this case, the method of manufacturing a light emitting diode package according to another exemplary embodiment of the present invention is described based on a method of manufacturing the light emitting diode 3200 according to another exemplary embodiment of the present invention described with reference to FIG. 14, but the light emitting diode package 3300 according to another exemplary embodiment of the present invention described with reference to FIG. 15, the method of manufacturing the light emitting diode package 3400 according to another exemplary embodiment of the present invention described with reference to FIG. 16 and FIG. 17, and the method of manufacturing a light emitting diode 3500 according to another exemplary embodiment of the present invention described with reference to FIG. 18 and FIG. 19 may be applied. That is, the method of manufacturing a light emitting diode package may be applied to the exemplary embodiments in which the plurality of light emitting diode package 3100 according to the light emitting diode package 3100 according to the light emitting diode are connected to one another.

The growth substrate 3110 may be defined by the diode region DR, the partition region (PR), and the vertical region (VR) as shown in FIG. 39. In this case, the diode region DR may be a region in which the light emitting diode package 3100 is formed, the partition region PR, which is a region for dividing the light emitting diode packages 3100 of the light emitting diode packages 3200, 3300, 3400, and 3500, may be a region in which the segmentation etching is performed, and the vertical region VR, which is a region for segmenting the plurality of light emitting diode packages 3200, 3300, 3400, and 3500 including the light emitting diode packages 3100, may be a region in which the V cut etching is performed.

Meanwhile, the diode region DR may include structure regions SRs and gap regions GRs.

The semiconductor structure layer 3120, the ohmic contact layer 3130, the first pad 3142, the second pad 3144, the first insulating layer 3152, the first connection wiring 3162, and the second connection wiring 3164 may be formed on the surface of the growth substrate 3110 on which the regions are defined, that is, the surface of the growth substrate 3110 as described with reference to FIG. 28 to FIG. 33.

Thereafter, the segmentation etching segmenting the light emitting diode packages 3100 within the light emitting diode packages 3200, 3300, 3400, 3500 is performed. That is, as shown in FIG. 39, the light emitting diode package 3200 including the three light emitting diode package 3100 as shown in FIG. 39 performs the segmentation etching segmenting the first insulating layer 3152 and the first type semiconductor layer 3122 so that the light emitting diode packages 3100 of the light emitting diode package 3200 are separated from each other in the partition regions PRs, in particular, the first type semiconductor layers 3122 are separated from each other.

In this case, the segmentation etching may be etched enough to expose the surface of the growth substrate 3110 and may etch the growth substrate 3110 to the certain depth.

Further, the exemplary embodiment of the present invention describes that the first insulating layer 3152 is formed and then, the segmentation etching is performed, but after the semiconductor structure layer 3120 is formed, the segmentation etching may be performed prior to the first bump 3172 and the second bump 3174, which will be described below.

Referring to FIG. 40, the second insulating layer 3154 is formed on the growth substrate 3110 on which the first insulating layer 3152 is formed as described with reference to FIG. 33.

Then, the first bump 3172 and the second bump 3174 are formed on the second insulating layer 3154 as described with reference to FIG. 34 and at the same time, the first bump 3172' and the second bump 3174' are formed thereon.

Thereafter, as described with reference to FIG. 35, the V cut etching that etches the first type semiconductor layer 3122, the first insulating layer 3152, the second insulating layer 3154, and the growth substrate 3110 of the vertical region VR may be performed so that the light emitting diode packages 3200, 3300, 3400, and 3500 are separated from one another.

The V cut etching may form the V cuts that can separate the light emitting diode packages 3200, 3300, 3400, and 3500 into the individual package and may be performed in the segmentation region VR. In this case, the V cuts may be formed by forming a V-shaped groove up to a certain depth from the surface of the growth substrate 3110, that is, a certain thickness therefrom.

As shown in FIG. 40, when the light emitting diode package 3200 described with reference to FIG. 14 is manufactured, the V cut etching is performed in the segmentation regions VRs between the light emitting diode packages 3200 to form the V cuts in the growth substrate 3110 and the first type semiconductor layer 3122 and the first insulating layer 3152 are etched in the partition regions PRs within the light emitting diode packages 3200, that is, the two partition regions PRs provided among the three light emitting diode packages 3100 of the light emitting diode package 3200 and the segmentation etching exposing the surface of the growth substrate 3110 may be performed.

Referring to FIG. 41, the third insulating layer 3156 is formed on the growth substrate 3110 on which the V cuts are formed as described with reference to FIG. 36.

Therefore, the first contact part 3182 and the second contact part 3184 are formed on the third insulating layer 3156 as described above with reference to FIG. 19.

Further, the light emitting diode packages 3200, 3300, 3400, and 3500 may be manufactured by forming the first contact part 3182 and the second contact part 3184 and then, segmenting the growth substrate 3110 by using the vertical regions VRs in which the V-shaped groove is formed by the V cut etching as described with reference to FIG. 38.

As set forth above, the exemplary embodiments of the present invention can provide the light emitting diode package of the wafer level and the method of manufacturing the same by providing the process of packaging light emitting diode chips while manufacturing the light emitting diode chips.

Further, the exemplary embodiments of the present invention can provide the light emitting diode package and the method of manufacturing the same capable of reducing the emission of light scattered without being converted by the phosphor layer from the side of the light emitting diode package.

In addition, the exemplary embodiments of the present invention can provide the large-area light emitting diode package having the large emission area and the method of manufacturing the same.

Moreover, the exemplary embodiments of the present invention can provide the large-area light emitting diode package having the large emission area and the method of manufacturing the same capable of facilitating the heat generation and the current spreading.

Also, the exemplary embodiments of the present invention can provide the light emitting diode package and the method of manufacturing the same capable of simplifying the process and reducing the defective rate and the manufacturing costs.

Hereinabove, although the present invention has been described with reference to the exemplary embodiments thereof, the present invention is not limited thereto. It may be appreciated by those skilled in the art that modifications and alterations may be made without departing from the spirit and the scope of the present invention, which fall within the scope of the present invention.

What is claimed is:
1. A light emitting diode, comprising:
a semiconductor structure comprising a first type semiconductor layer, an active layer, and a second type semiconductor layer;
an ohmic contact layer disposed on the second type semiconductor layer;
a first insulating layer disposed on the semiconductor structure and comprising a plurality of first openings overlapping the first type semiconductor layer and a plurality of second openings overlapping the ohmic contact layer;
a first connection wiring disposed on the first insulating layer, a first portion of the first connection wiring disposed on the first type semiconductor layer and a second portion of the first connection wiring disposed on the second type semiconductor layer;
a second connection wiring disposed on the second type semiconductor layer;
a second insulating layer disposed on the first connection wiring and the second connection wiring;
wherein the first portion of the first connection wiring electrically connects to the first type semiconductor layer through the plurality of first openings;
wherein the plurality of first openings are positioned on an edge of the first type semiconductor layer along an edge of the first type semiconductor layer; and
wherein the second portion of the first connection wiring surrounds the second connection wiring.

2. The light emitting diode of claim 1, further comprising a first pad disposed between the first semiconductor layer and the first connection wiring.

3. The light emitting diode of claim 2, wherein the light emitting diode comprises an n×m array of the semiconductor structures disposed on a growth substrate, wherein n is an integer greater than or equal to 1 and m is an integer greater than 1, and the semiconductor structures are disposed on structure regions and separated by gap regions exposing the first semiconductor layer.

4. The light emitting diode of claim 3, wherein the semiconductor structures are rectangular and the first pads are disposed in corner regions of exposed first semiconductor layer.

5. A light emitting diode package comprising a plurality of light emitting diodes of claim 3, wherein the plurality of light emitting diodes are connected to each other in series.

6. The light emitting diode of claim 3, wherein the ohmic contact layer comprises at least one reflective metal layer configured to reflect light emitted from the semiconductor structure to the growth substrate.

7. The light emitting diode of claim 3, further comprising a lateral inclination at a side of the growth substrate.

8. The light emitting diode of claim 7, further comprising:
a first bump electrically connected to the first connection wiring through a first opening in the second insulating layer; and
a second bump electrically connected to the second connection wiring through a second opening in the second insulating layer,
wherein the first bump is electrically insulated from the second bump.

9. The light emitting diode of claim 8, further comprising a third insulating layer disposed on the first bump and the second bump,
wherein the third insulating layer comprises a first opening exposing a portion of the first bump and a second opening exposing a portion of the second bump.

10. The light emitting diode of claim 9, wherein the third insulating layer covers a top of a surface of the lateral inclination of the growth substrate.

11. The light emitting diode of claim 9, wherein the third insulating layer has a thickness between 1000 nm and 5000 nm and is comprised of material selected from the group consisting of an oxide layer, a nitride layer, and an organic insulating layer.

12. The light emitting diode of claim 10, further comprising a first contact part electrically connected to the first bump through the first opening in the third insulating layer.

13. The light emitting diode of claim 12, further comprising a second contact part electrically connected to the second bump through the second opening in the third insulating layer.

14. The light emitting diode of claim 13, wherein the first contact part and the second contact part are spaced apart from each other such that the second contact part is electrically insulated from the first bump.

15. The light emitting diode of claim 14, wherein the first contact part and second contact part are configured to have a same height from the growth substrate.

16. The light emitting diode of claim 1, further comprising a second pad disposed between the ohmic contact layer and the second connection wiring.

17. The light emitting diode of claim 1, wherein the first insulating layer and the second insulating layer have a thickness between 2000 nm and 10000 nm and are comprised of material selected from the group consisting of an oxide layer, a nitride layer, and an organic insulating layer.

18. The light emitting diode of claim 1, wherein the first insulating layer is a distributed Bragg reflector (DBR) layer formed of insulating layers having different refractive indexes.

19. A light emitting diode package comprising a plurality of light emitting diodes of claim 1, wherein the plurality of light emitting diodes are connected to each other in series.

* * * * *